United States Patent
Hashimoto et al.

(10) Patent No.: US 7,178,088 B2
(45) Date of Patent: Feb. 13, 2007

(54) METHOD AND CIRCUIT FOR ERROR CORRECTION, ERROR CORRECTION ENCODING, DATA REPRODUCTION, OR DATA RECORDING

(75) Inventors: Yuichi Hashimoto, Osaka (JP); Yuji Takagi, Hirakata (JP); Makoto Usui, Osaka (JP); Naohiro Kimura, Uji (JP); Yoshikazu Yamamoto, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 537 days.

(21) Appl. No.: 10/714,931

(22) Filed: Nov. 18, 2003

(65) Prior Publication Data

US 2004/0225946 A1    Nov. 11, 2004

(30) Foreign Application Priority Data

Nov. 18, 2002  (JP)  ............................. 2002-333391
Jun. 13, 2003  (JP)  ............................. 2003-169065

(51) Int. Cl.
*G11B 20/18* (2006.01)

(52) U.S. Cl. ...................................... 714/764; 714/769
(58) Field of Classification Search ................ 714/764, 714/769
See application file for complete search history.

(56) References Cited

U.S. PATENT DOCUMENTS

2004/0257900  A1*  12/2004  Takagi et al. ............... 365/232

FOREIGN PATENT DOCUMENTS

| EP | 0 992 994 | 12/1998 |
| JP | 09139026 A * | 5/1997 |
| JP | 11110920 A * | 4/1999 |
| JP | 2002-521789 | 7/2002 |
| WO | 99/31661 | 6/1999 |
| WO | 00/07300 | 2/2000 |

* cited by examiner

*Primary Examiner*—R. Stephen Dildine
(74) *Attorney, Agent, or Firm*—Wenderoth, Lind & Ponack, L.L.P.

(57) ABSTRACT

Data is read from a recording medium and the reproduced data is deinterleaved and stored to a first memory while input/output to/from the first memory is arbitrated. It is determined whether a predetermined number of data units is stored to the first memory. Based on the result data, it is determined whether transfer of the data stored in first memory to a second memory is permitted. If data transfer is permitted, the reproduced data is transferred from the first memory to the second memory, during which time input/output to/from the second memory is arbitrated. The reproduced data stored to the second memory is then error corrected, and user data contained in the error corrected reproduction data is externally output from the second memory.

102 Claims, 59 Drawing Sheets

Fig.6

ADDRESS DIRECTION →

PAGE 1

| 1 | 11 | 21 | 31 |
|---|----|----|----|
| 2 | 12 | 22 | 32 |
| 3 | 13 | 23 | 33 |
| 4 | 14 | 24 | 34 |
| 5 | 15 | 25 | / |
| 6 | 16 | 26 | / |
| 7 | 17 | 27 | / |
| 8 | 18 | 28 | / |
| 9 | 19 | 29 | / |
| 10 | 20 | 30 | / |

PAGE 2

| 1 | 11 | 21 | 31 |
|---|----|----|----|
| 2 | 12 | 22 | 32 |
| 3 | 13 | 23 | 33 |
| 4 | 14 | 24 | 34 |
| 5 | 15 | 25 | 35 |
| 6 | 16 | 26 | 36 |
| 7 | 17 | 27 | 37 |
| 8 | 18 | 28 | 38 |
| 9 | 19 | 29 | 39 |
| 10 | 20 | 30 | 40 |

PAGE 3

| 1 | 11 | 21 | 31 |
|---|----|----|----|
| 2 | 12 | 22 | 32 |
| 3 | 13 | 23 | 33 |
| 4 | 14 | 24 | 34 |
| 5 | 15 | 25 | 35 |
| 6 | 16 | 26 | 36 |
| 7 | 17 | 27 | 37 |
| 8 | 18 | 28 | 38 |
| 9 | 19 | 29 | 39 |
| 10 | 20 | 30 | 40 |

Fig. 7

ADDRESS DIRECTION →

PAGE 1

| 1 | 11 | | |
|---|----|---|---|
| 2 | 12 | | |
| 3 | 13 | | |
| 4 | 14 | | |
| 5 | 15 | | |
| 6 | | | |
| 7 | | | |
| 8 | | | |
| 9 | | | |
| 10 | | | |

PAGE 2

| | | 21 | 31 |
|---|---|----|----|
| | | 22 | 32 |
| | | 23 | 33 |
| | | 24 | 34 |
| | | 25 | 35 |
| | | 26 | 36 |
| | | 27 | 37 |
| | | 28 | 38 |
| | | 29 | 39 |
| | | 30 | 40 |

PAGE 3

| 1 | 11 | 21 | 31 |
|---|----|----|----|
| 2 | 12 | 22 | 32 |
| 3 | 13 | 23 | 33 |
| 4 | 14 | 24 | 34 |
| 5 | 15 | 25 | 35 |
| 6 | 16 | 26 | 36 |
| 7 | 17 | 27 | 37 |
| 8 | 18 | 28 | 38 |
| 9 | 19 | 29 | 39 |
| 10 | 20 | 30 | 40 |

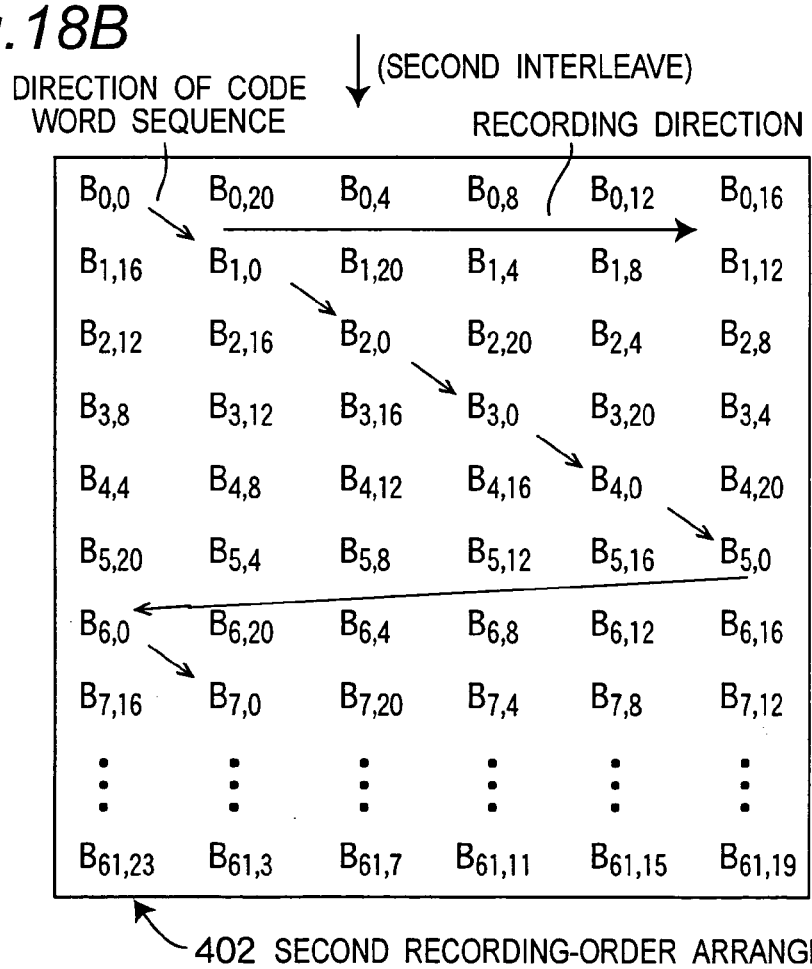

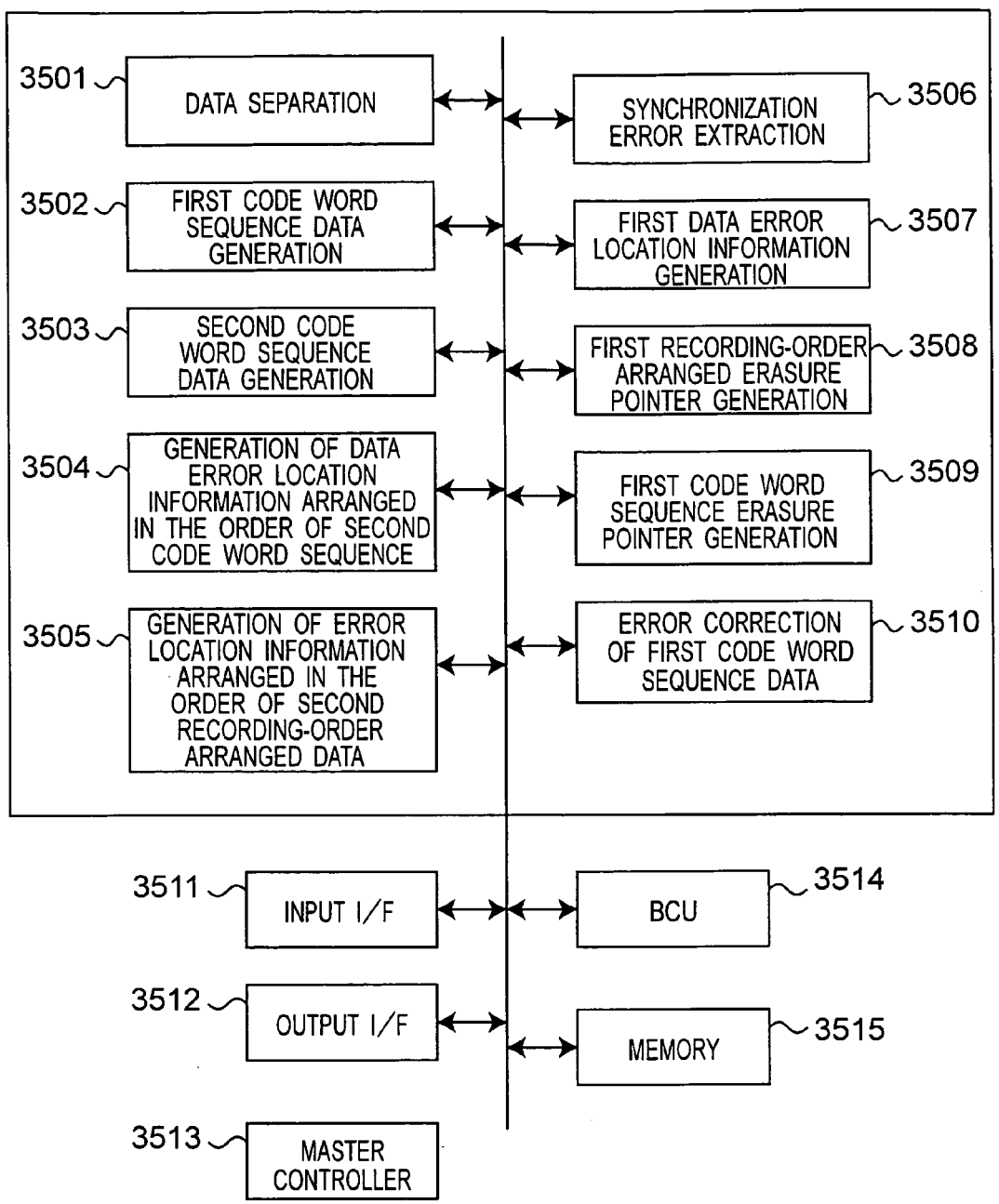

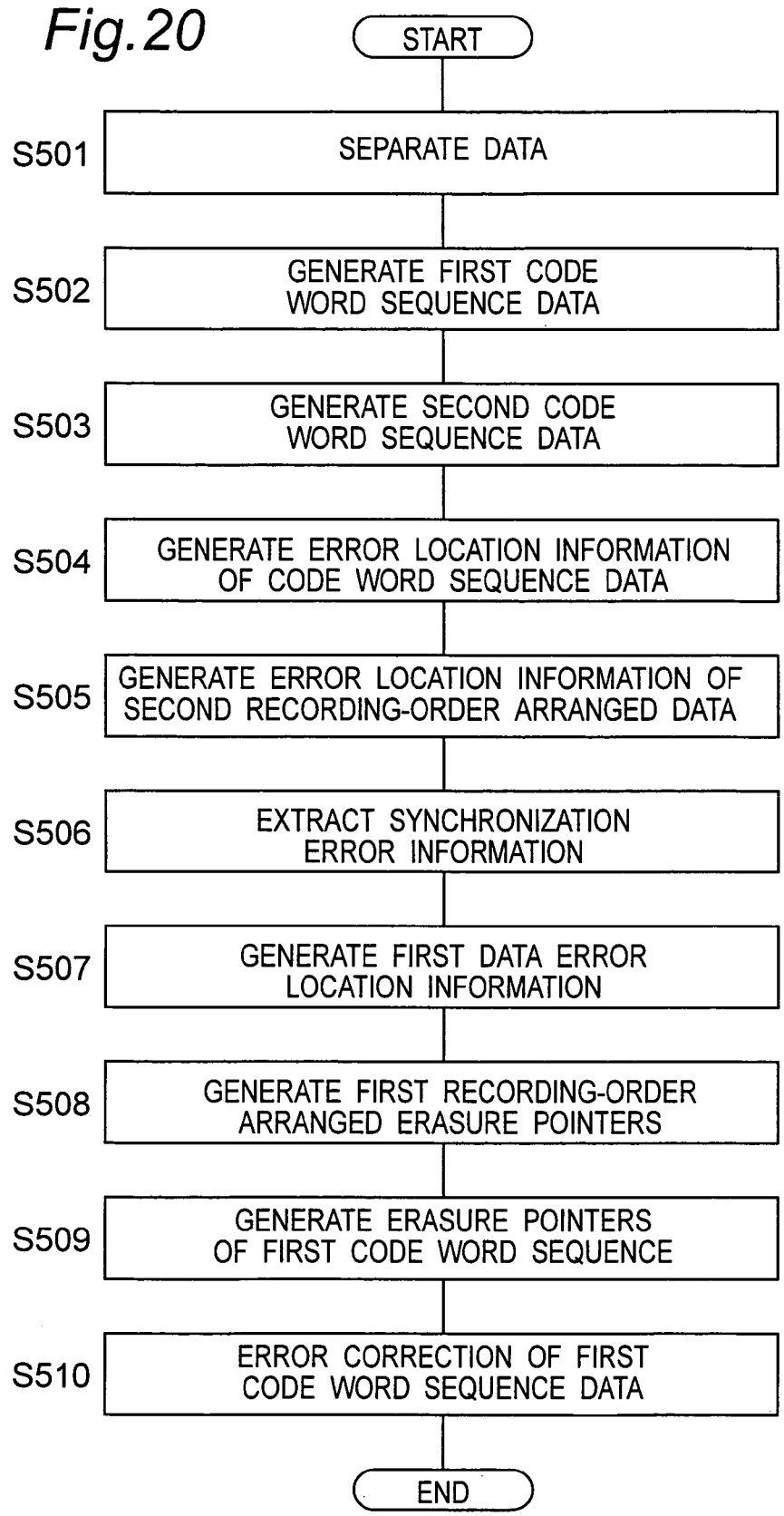

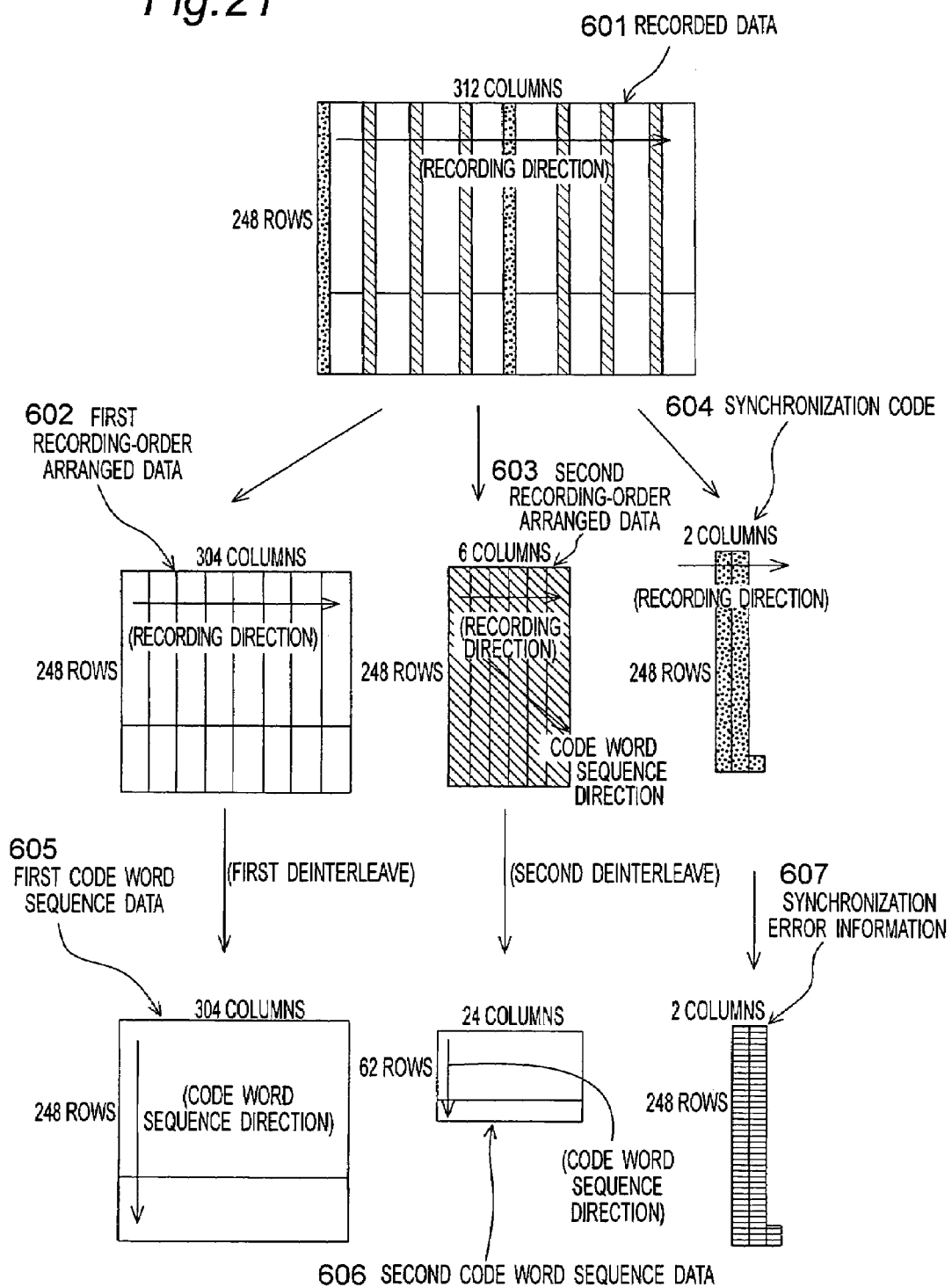

| | SYNCHRONIZATION CODE 1 | | SYNCHRONIZATION CODE 2 | |
|---|---|---|---|---|
| EXPECTED VALUE | 100001010 | EXPECTED VALUE | 100001010 |
| DETECTED VALUE | 100001010 | DETECTED VALUE | 101101010 |
| SYNCHRONIZATION ERROR INFORMATION | 0 | SYNCHRONIZATION ERROR INFORMATION | 1 |

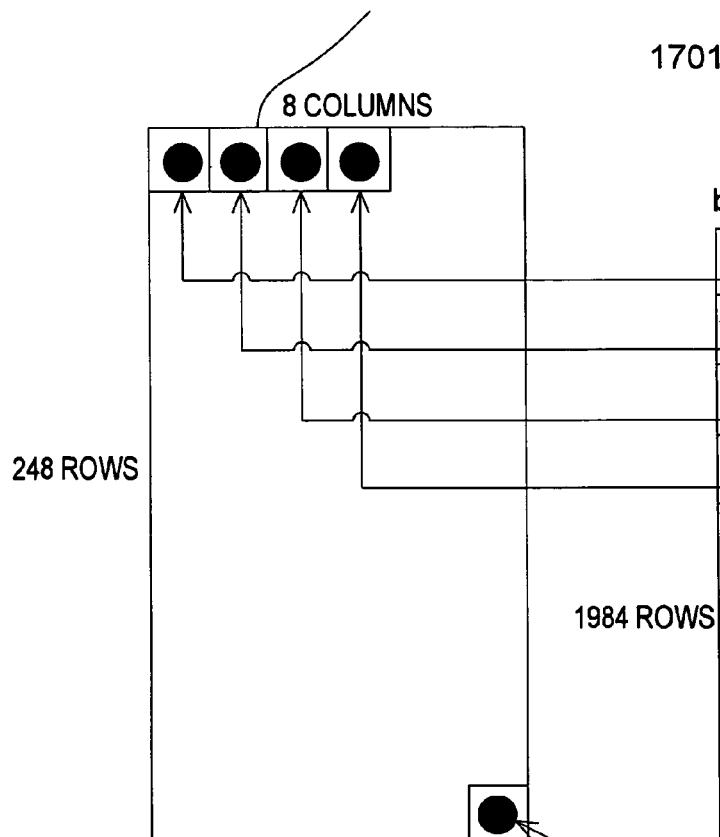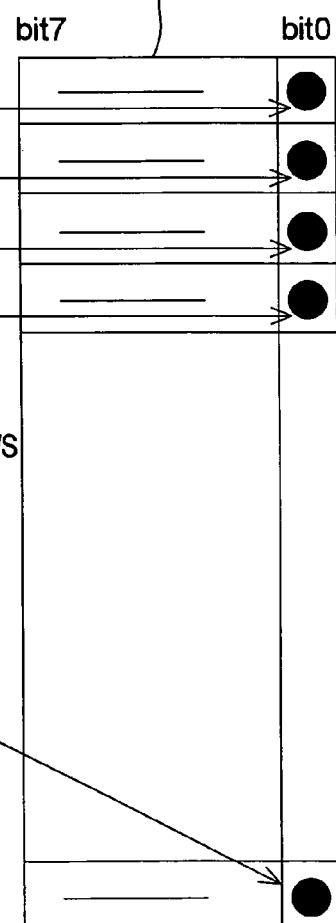
Fig.34

METHOD AND CIRCUIT FOR ERROR CORRECTION, ERROR CORRECTION ENCODING, DATA REPRODUCTION, OR DATA RECORDING

BACKGROUND OF THE INVENTION

1. Technical Field

The present invention relates to a process for reproducing data from a recording medium to which interleaved data is recorded, and to a process for recording data to such a medium. The invention also relates to an error-correcting process applied when reproducing data from the recording medium, and to an error-correcting coding process applied when recording data to the recording medium.

2. Related Art

Recently, some products for reproducing at high speed video data, documents, and other types of digital information recorded in optical disks such as DVD and CD media have become widely available. High density recording of digital information to the optical disk media makes read errors due to dust, disk scratches, and similar problems unavoidable during data reproduction. To compensate for this problem, error-correcting coding is applied to the recording medium such as the optical disk on recording, and error-correcting is applied on reproduction.

FIG. 13 shows a conventional disk drive for recording and reproducing an optical disk storing video information. During reproduction, the optical head 1201 of this optical disk drive scans the optical disk and a recording/reproducing circuit 1202 then binarizes the obtained information. A modulator/demodulator 1203 then demodulates the digital signal, an ECC processor 1204 applies error-correcting, and a video signal processor 1205 decompresses the data to generate the desired video information. During recording, the video signal processor 1205 compresses the video information, the ECC processor 1204 applies error-correcting coding, the modulator/demodulator 1203 modulates the error-correcting coded signal, and the recording/reproducing circuit 1202 converts the digital signal to an analog signal for recording by the optical head 1201 to the optical disk.

Operation of the ECC processor 1204 during reproduction is described next. FIG. 14 shows the internal configuration of the ECC processor 1204 shown in FIG. 13. Reproduction data decoded by the demodulator is written through an arbiter 52 to one ECC block in a DRAM 51. The data is then sent through the arbiter 52 to an ECC processor 53 for error calculation and error-correcting processing, the error-correcting result is then written back through the arbiter 52 to the user data in the DRAM 51, and the user data alone is then sent from the DRAM 51 through the arbiter 52 to the video signal processor.

Operation of the ECC processor 1204 during recording is described next. Data compressed by the video signal processor is written through the arbiter 52 to the DRAM 51 and then sent through the arbiter 52 to the ECC processor 53. After error-correcting coding by the ECC processor 53, parity is written through the arbiter 52 to the DRAM 51, and the recording data is then sent through the arbiter 52 to the modulator (See, for example, Reference 1).

The data is thus passed at least three times over the bus between the DRAM and the arbiter before data output from the demodulator is sent to the video signal processor and before data output from the video signal processor is sent to the modulator. That is, these three times are (1) from demodulator to DRAM, (2) from ECC processor to DRAM, and (3) from video signal processor to DRAM. Frequently accessing the DRAM bus is therefore a bottleneck to high speed reading and writing optical disks.

Furthermore, when data recorded with a disk format in which the recording direction ("data direction") of data on the disk and the error-correcting code direction of the recorded data are different is read from the disk and buffered to the DRAM, the direction of the data on the disk and the DRAM address sequence will necessarily differ when the data is recorded to the memory so that the DRAM address sequence and the error-correcting code direction are the same. This means that when writing data from the modulator/demodulator to DRAM, or transferring data from DRAM to the modulator/demodulator, the data cannot be transferred continuously and must be sent in one-byte units, thereby degrading DRAM bus access performance. Furthermore, because data can only be sent one byte at a time, bus access cannot be improved even if the DRAM bus width is increased.

Conversely, if data is arranged to DRAM so that the DRAM address sequence is the same as the direction of the data on the disk, the direction of the error-correcting code is necessarily different from the DRAM address sequence. This again means that data cannot be transferred continuously and must be sent in one-byte units when transferring data from DRAM to the error-correcting processor, and bus access performance is again degraded.

Regarding the recording format to the optical disk, proposed is a new recording format for, for example, digitally recording HDTV broadcasts to a disk by interleaving a first error-correcting code with low redundancy and a second error-correcting code with greater error-correcting capacity, and alternating the synchronization code and error-correcting code (refer to, for example, Reference 2).

When reproducing data from a disk to which data is recorded with this recording format combining a robust error-correcting code and an error-correcting code with weaker error-correcting capability, an erasure pointer to the first error-correcting code is generated from error location information obtained in the error-correcting process using the more robust second error-correcting code and synchronization error information obtained from synchronization code detection. Then the first error-correcting code with weak error-correcting performance is error-corrected for erasure, thereby improving error-correcting capability and providing high reliability data reproduction.

<** Reference>
1. International Publication No. WO 99/31661, (see FIG. 21)
2. Japanese published patent application 2002-521789

One way to resolve the above-described deterioration in bus access performance is to provide a buffer memory large enough to store a complete ECC block between the modulator/demodulator and DRAM. All data in one ECC block is then first buffered to the memory for interleaving or deinterleaving. Buffer transfers are also executed using the maximum number of bytes allowed by the DRAM bus width. While this method avoids a drop in bus access performance, it requires enough memory to store a full ECC block, thus increasing the circuit area.

Furthermore, in a recording format alternately recording two different error-correcting codes and a synchronization code at known period, these error-correcting codes are recorded with a different interleave. The error location information of the second error-correcting code with higher error-correcting capability is obtained in the error-correcting process after deinterleaving the second error-correcting code. The error location information is thus obtained having codes arranged in the same order as the code sequence of the second error-correcting code. The synchronization error information is also obtained based on the synchronization code detection result, and is therefore also obtained in the recording sequence. The order of the erasure pointers for erasure-correcting the first error-correcting code must also be in the same order as the first error-correcting code. This means that the second error-correcting code error location information and synchronization error information cannot be used as is to generate the erasure pointers based on the locations of errors in the second error-correcting code and synchronization code errors because they are not in the same order.

SUMMARY OF THE INVENTION

A first object of the present invention is therefore to provide an error-correcting method and circuit, and an error-correcting coding method and circuit, that can prevent a drop in bus access performance.

A further object of the invention is to provide a data reproduction method and circuit and a data recording method and circuit enabling high reliability data reproduction when data is recorded and reproduced using a data recording format interleaving two different types of error-correcting coded data.

A yet further object of the invention is to provide a data reproducing device and a data recording device using the circuits of this invention.

A first aspect of the invention is a method and a circuit for error-correcting data reproduced from a recording medium to which data is recorded according to a data format in which data that is applied with error-correcting coding in a direction different from a recording direction on the recording medium is interleaved and recorded with synchronization signals.

In this aspect of the invention, data is reproduced from the recording medium, the reproduced data is deinterleaved, and stored to a first memory while arbitrating data input/output to/from the first memory. It is determined whether a predetermined amount of data has been stored to the first memory. Transfer of data stored in the first memory to a second memory is permitted, based on the result of the determination. The reproduced data is transferred from the first memory to the second memory when the data transfer is permitted while arbitrating input/output to the second memory. The reproduced data stored in the second memory is error-corrected. User data contained in the error-corrected reproduced data is externally output from the second memory.

A second aspect of the invention is an error-correcting coding method and circuit for recording data according to a data format in which data that is applied with error-correcting coding in a direction different from a recording direction on the recording medium is interleaved and recorded with synchronization signals.

In this aspect of the invention, user data is stored to a first memory while arbitrating input/output to/from the first memory. User data stored in the first memory is applied with error-correcting coding. The data applied with error-correcting coding is transferred from the first memory to a second memory while arbitrating input/output to the second memory. It is determined whether a predetermined amount of data has been stored to the second memory. An output of the data stored in the second memory is permitted, based on the result of the determination. The data from the second memory is externally output, while interleaving.

A third aspect of the invention is a method and a circuit for reproducing data from a recording medium to which data is recorded in a format having a synchronization code, first recording-order arranged data, and second recording-order arranged data alternating in a predetermined cycle, in which the first recording-order arranged data is acquired by applying a first interleave to first encoded data, the first encoded data is provided by applying with error-correcting coding to first data, the second recording-order arranged data is acquired by applying a second interleave to second encoded data, and the second encoded data is provided by applying with error-correcting coding to second data.

In this aspect of the invention, the recorded data read from the recording medium is separated to generate the synchronization code, the first recording-order arranged data, and the second recording-order arranged data. First code word sequence data is generated by applying a first deinterleave to the first recording-order arranged data. Second code word sequence data is generated by applying a second deinterleave to the second recording-order arranged data. The second code word sequence data is error-corrected to generate data error location information corresponding to the order of the second code word sequence data. A second interleave is applied to the data error location information to generate data error location information corresponding to the order of the second recording-order arranged data. Synchronization error information is extracted from the synchronization code. The data error location information in the order of the second recording-order arranged data and the synchronization error information are combined together in the recording sequence of the recorded data to generate first data error location information.

Erasure pointers are generated from the first data error location information. The erasure pointers indicates positions at which the first data erase and corresponds to the order of the first recording-order arranged data. A first deinterleave is applied to the erasure pointers to generate erasure pointers corresponding to the order of the first code word sequence data. Error-correcting for erasure is applied to the first code word sequence data, using the erasure pointers corresponding to the order of the first code word sequence data.

A fourth aspect of the invention is a method and a circuit for reproducing data from a recording medium to which data is recorded in a format having a synchronization code, first recording-order arranged data, and second recording-order arranged data alternating in a predetermined cycle, in which the first recording-order arranged data is acquired by applying a first interleave to first encoded data, the first encoded data is provided by applying with error-correcting coding to first data, the second recording-order arranged data is acquired by applying a second interleave to second encoded data, and the second encoded data is provided by applying with error-correcting coding to second data.

In this aspect of the invention, recorded data read from the recording medium is separated to generate the synchronization code, first recording-order arranged data, and second recording-order arranged data. Synchronization error information is extracted from the synchronization code. A first deinterleave is applied to the first recording-order arranged data to generate first code word sequence data corresponding to the first recording-order arranged data. A second deinterleave is applied to the second recording-order arranged data to generate second code word sequence data. The second code word sequence data is error-corrected to generate data error location information corresponding to the order of the second code word sequence data. Erasure pointers corresponding to the order of the first recording-order arranged data is generated from the data error location information and synchronization error information, in which the erasure pointers denoting data erasure locations in the first data. Error-correcting for erasure is applied to the first code word sequence data, using the erasure pointers while applying a first deinterleave to the erasure pointers.

A fifth aspect of the invention is also a method and circuit for reproducing data from a recording medium to which data is recorded in a format having a synchronization code, first recording-order arranged data, and second recording-order arranged data alternating in a predetermined cycle, in which the first recording-order arranged data is acquired by applying a first interleave to first encoded data, the first encoded data is provided by applying with error-correcting coding to first data, the second recording-order arranged data is acquired by applying a second interleave to second encoded data, and the second encoded data is provided by applying with error-correcting coding to second data.

In this aspect of the invention, the data read from the recording medium is separated to generate the synchronization code, the first recording-order arranged data, and the second recording sequence. Synchronization error information is extracted from the synchronization code and writing to a first memory. A first deinterleave is applied to the first recording-order arranged data to generate first code word sequence data and write to a second memory. A second deinterleave is applied to the second recording-order arranged data to generate second code word sequence data and write to a third memory. The second code word sequence data is error-corrected to write data error location information corresponding to the order of the second code word sequence data to a fourth memory. Erasure pointers denoting erasure locations in the first data and corresponding to the order of the first recording-order arranged data is generated from the data error location information and synchronization error information. It is written to a fifth memory.

Error-correcting for erasure is applied to the first code word sequence data, using the erasure pointers, while applying, a first deinterleave to the erasure pointers.

A sixth aspect of the invention is also a method and circuit for reproducing data from a recording medium to which data is recorded in a format having a synchronization code, first recording-order arranged data, and second recording-order arranged data alternating in a regular cycle, in which the first recording-order arranged data is acquired by applying a first interleave to first encoded data, the first encoded data is provided by applying with error-correcting coding to first data, the second recording-order arranged data is acquired by applying a second interleave to second encoded data, and the second encoded data is provided by applying with error-correcting coding to second data.

In this aspect of the invention, data from the recorded data read from the recording medium is separated to generate the synchronization code, the first recording-order arranged data, and the second recording-order arranged data.

The first recording-order arranged data is divided into plural data segments. A first deinterleave is applied to each data segment to generate plural first code word sequence data segments. The plural first code word sequence data segments are assembled to generate the first code word sequence data. A second deinterleave is applied to the second recording-order arranged data to generate the second code word sequence data. The second code word sequence data is error-corrected to generate data error location information corresponding to the order of the second code word sequence data. The second deinterleave is applied to the data error location information to generate data error location information corresponding to the order of the second recording-order arranged data. Synchronization error information is extracted from the synchronization code. First data error location information denoting locations in which errors occur in the first data is generated, by combining, in the recording sequence, the synchronization error information and the data error location information in the order of the second recording-order arranged data. First recording-order arranged erasure pointers which indicate erasure locations in the first data are generated from the first data error location information. It corresponds to the order of the first recording-order arranged data. A first deinterleave is applied to the erasure pointers to generate erasure pointers corresponding to the order of the first code word sequence data. Error-correcting for erasure is applied to the first code word sequence data, using the erasure pointers in the order of the first code word sequence data.

A seventh aspect of the invention is also a method and circuit for reproducing data from a recording medium to which data is recorded in a format having a synchronization code, first recording-order arranged data, and second recording-order arranged data alternating in a regular cycle, in which the first recording-order arranged data is acquired by applying a first interleave to first encoded data, the first encoded data is provided by applying error-correcting coding to first data, the second recording-order arranged data is acquired by applying a second interleave to second encoded data, and the second encoded data is provided by applying error-correcting to second data.

In this aspect of the invention, data read from the recording medium is separated to generate the synchronization code, the first recording-order arranged data, and the second recording-order arranged data. Synchronization error information is extracted from the synchronization code. The first recording-order arranged data is divided into plural data segments. A first deinterleave is applied to each data segment to generate plural first code word sequence data segments. A second deinterleave is applied to the second recording-order arranged data to generate second code word sequence data. The plural first code word sequence data segments are assembled to generate first code word sequence data. The second code word sequence data is error-corrected to generate data error location information corresponding to the order of the second code word sequence data. Erasure pointers denoting erasure locations in the first data in the order of the first recording-order arranged data is generated from the data error location information and synchronization error information. Error-correcting for erasure is applied to the first code word sequence data using the erasure pointers while deinterleaving the erasure pointers with a first deinterleaving.

An eighth aspect of the invention is also a method and circuit for reproducing data from a recording medium to which data is recorded in a format having a synchronization code, first recording-order arranged data, and second recording-order arranged data alternating in a predetermined cycle, in which the first recording-order arranged data is acquired by applying a first interleave to first encoded data, the first encoded data is provided by applying error-correcting coding to first data, the second recording-order arranged data is acquired by applying a second interleave to second encoded data, the second encoded data is provided by applying error-correcting coding to second data.

In this aspect of the invention, recorded data read from the recording medium is separated to generate the synchronization code, the first recording-order arranged data, and the second recording-order arranged data. Synchronization error information is extracted from the synchronization code to write to a first memory. The first recording-order arranged data is divided into plural data segments. A first deinterleave is applied to each data segment to generate plural first code word sequence data segments to write them to a second memory. A second deinterleave is applied to the second recording-order arranged data to generate second code word sequence data and writing them to a third memory.

The first code word sequence data segments from the second memory are sequentially written to a fourth memory to generate first code word sequence data. The second code word sequence data is error-corrected, and data error location information corresponding to the order of the second code word sequence data is written to a fifth memory. Erasure pointers denoting errors in the first data is generated from the data error location information and synchronization error information. The erasure pointers are written to a sixth memory. The erasure pointers are arranged in the order corresponding to the order of the first recording-order arranged data.

Error-correcting for erasure is applied to the first code word sequence data using the erasure pointers while applying a first deinterleave to the erasure pointers.

A ninth aspect of the invention is a method and a circuit for recording data to a recording medium according to a format having alternating first data and second data.

In this aspect of the invention, the first data is error-corrected to generate first code word sequence data, and the second data is error-corrected to generate second code word sequence data. Synchronization codes are generated. A first interleave is applied to the first code word sequence data to generate first recording-order arranged data. A second interleave is applied to the second code word sequence data to generate second recording-order arranged data. The synchronization codes, the first recording-order arranged data, and the second recording-order arranged data are arranged alternately in a predetermined cycle to record them to the recording medium.

A tenth aspect of the invention is also a method and a circuit for recording data to a recording medium according to a format having alternating first data and second data.

In this aspect of the invention, the first data is error-corrected, and first code word sequence data is written to a first memory. The second data is error-corrected and second code word sequence data is written to a second memory. Synchronization codes are generated. The first code word sequence data written in the first memory is read while applying a first interleave to the first code word sequence data. The second code word sequence data written in the second memory is read while applying a second interleave to the second code word sequence data. The synchronization code, the code word sequence data applied with the first interleave, and the second code word sequence data applied with the second interleave are recorded alternately at a predetermined cycle.

An eleventh aspect of the invention is also a method and a circuit for recording data to a recording medium according to a format having alternating first data and second data.

In this aspect of the invention, the first data is error-corrected to generate first code word sequence data, and the second data is error-corrected to generate second code word sequence data. Synchronization codes are generated. The first code word sequence data is divided into a predetermined number of segments. A first interleave is applied to the first code word sequence data segments to generate first recording-order arranged data segments. A second interleave is applied to the second code word sequence data to generate second recording-order arranged data. The synchronization codes, the first recording-order arranged data, and the second recording-order arranged data are recorded alternately in a predetermined cycle.

A twelfth aspect is also a method and a circuit for recording data to a recording medium according to a format having alternating first data and second data.

Error-correcting coding is applied to the first data, and first code word sequence data is written to a first memory. Error-correcting coding is applied to the second data, and second code word sequence data is written to a second memory.

The first code word sequence data is divided into a predetermined number of code word sequence segments. One segment of the first code word sequence data is written to a third memory. Synchronization codes are generated. The first code word sequence data segments are read from the third memory while applying a first interleave to the first code word sequence data segments to generate first recording-order arranged data segments. The second code word sequence data is read from the second memory while applying a second interleave to the second code word sequence data segments to generate second recording-order arranged data. The synchronization codes, the first recording-order arranged data segment, and the second recording-order arranged data are recording alternately in a predetermined cycle.

The error-correcting circuit and reproducing circuit of the invention described above can be applied to a data reproducing apparatus, and the error-correcting coding circuit and recording circuit can be applied to a data recording apparatus.

BRIEF DESCRIPTION OF THE DRAWINGS

FIG. 6 describes a second example of a data transfer operation when all data is not written to one page due to bit slip, for example.

FIG. 7 describes a third example of a data transfer operation when all data is not written to one page due to bit slip, for example.

FIG. 18A and FIG. 18B show an example of a second interleave.

FIG. 19 shows a data reproducing circuit according to a fourth embodiment of the invention.

FIG. 20 is a flow chart of the reproduction operation of the reproducing circuit according to a fourth embodiment of the invention.

FIG. 21 describes the data formats generated in the reproduction operation of the data reproducing circuit according to a fourth embodiment of the invention.

FIG. 34 describes a format of the first recording-order arranged erasure pointer in which the pointer value is stored only in the least-significant bit of the erasure pointer byte.

DESCRIPTION OF THE PREFERRED EMBODIMENTS

Preferred embodiments of the present invention are described below with reference to the accompanying figures.

Embodiment 1

Figure 1:
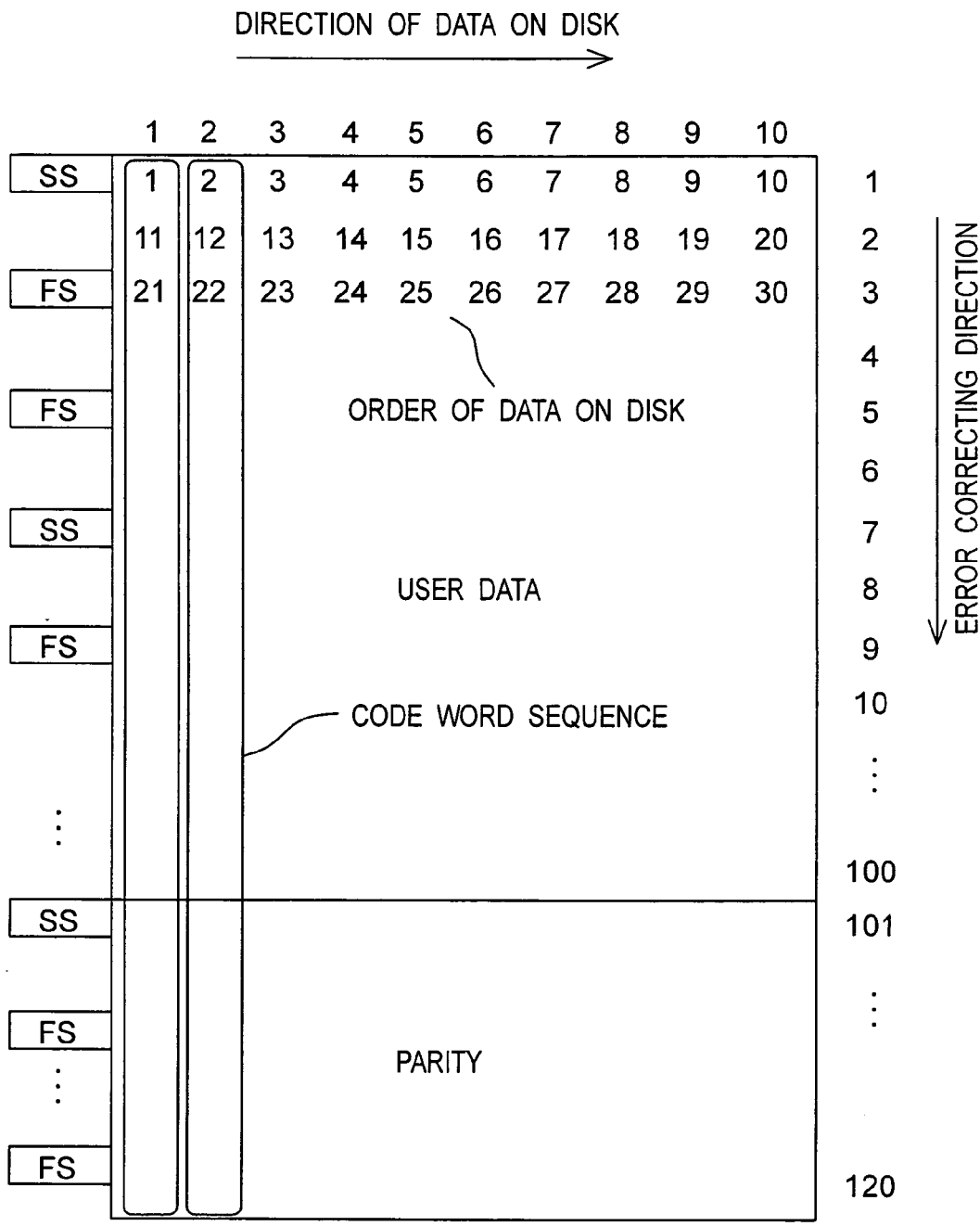
FIG. 1 schematically shows the data format of an optical disk in which the data recording direction and the error-correcting code direction differ.

A first embodiment of the present invention is an error-correcting circuit for error-correcting reproduced data during data reproducing operation from an optical disk to which data is recorded based on a disk format shown in FIG. 1.

The recording format of data on an optical disk storing a reproduction signal that is error-corrected by an error-correcting circuit according to the present embodiment of the invention is described first below.

FIG. 1 schematically shows an ECC block frame configuration in the recording format of data recorded to the optical disk. An ECC block is an error-correcting data unit including a set of error-correcting code word sequences. One row contains 10 bytes of user data or parity, and a frame synchronization signal FS is inserted every two rows. The data strings bracketed by frame synchronization signal FS are called a frame. One frame therefore is equivalent to two rows in this embodiment of the invention. The error-correcting codes are written in the column direction, each error-correcting code containing 100 bytes of user data and 20 bytes of parity. One ECC block contains 10 error-correcting codes.

When the data blocks on the disk are sequentially labeled 1, 2, 3 . . . N as shown in FIG. 1, blocks 1, 11, 21 belong to the same error-correcting code column. The direction in line with blocks 1, 11, 21 and so forth is the error-correcting code direction (coding direction). The interleave length of this format is 10 in the error-correcting coding direction on the disk. Interleaving improves the ability to correct burst errors.

"FS" denotes a frame synchronization signal. When a bit slip occurs, the correct timing can be derived and accurate data reproduction enabled by resynchronizing using the frame synchronization signal FS after bit slip is detected.

"SS" denotes the sector synchronization signal, which can also be used as a frame synchronization signal. One sector contains three frames. Like the frame synchronization signal, the sector synchronization signal enables resynchronization using the sector synchronization signal SS detected after bit slip is detected.

Figure 2:
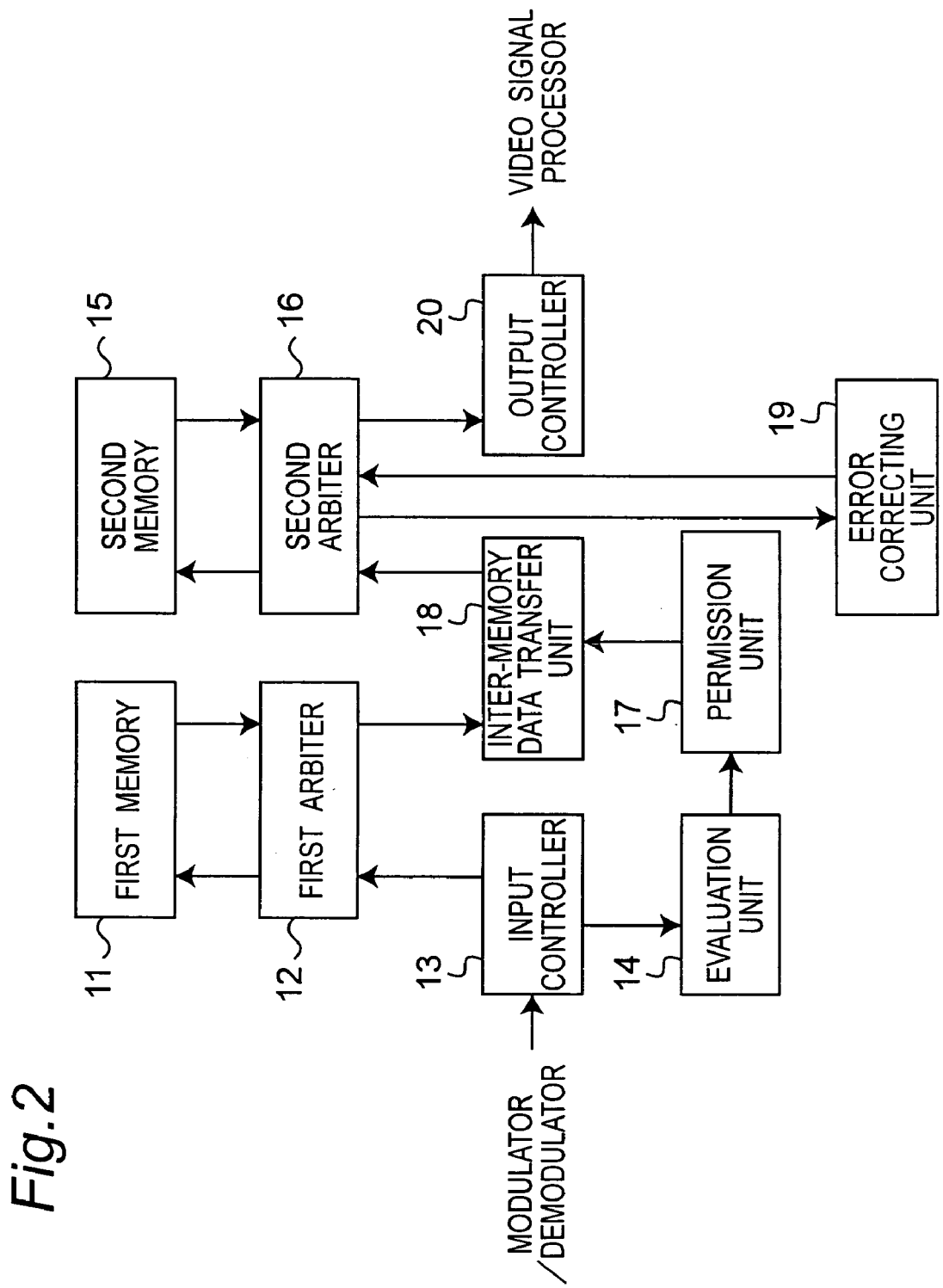
FIG. 2 is a block diagram of an error-correcting circuit according to a first embodiment of the invention.

FIG. 2 shows a configuration of an error-correcting circuit according to this embodiment of the invention for error-correcting data recorded with the disk format shown in FIG. 1. This error-correcting circuit has processing units 11 to 20 as shown in FIG. 2. The error-correcting circuit receives data from the modulator/demodulator, executes an error-correcting process, and outputs the error-corrected data to the video signal processor.

The first memory 11 is SRAM or other memory for temporarily storing the reproduction data. The capacity of the first memory 11 is less than needed to store one complete ECC block. First arbiter 12 is a bus arbiter as generally known for arbitrating input/output (I/O) to the first memory 11.

The input controller 13 deinterleaves the reproduction data and stores it to the first memory 11, and includes a multiplier for calculating the deinterleaved address. Evaluation unit 14 determines whether a predetermined amount of data have been stored to the first memory 11, and has a counter for counting the stored data amount, and a comparator for comparing the predetermined amount value and the stored data amount.

The second memory 15 has a 4-byte wide bus and is for example a DRAM. The second arbiter 16 is a bus arbiter as generally known for arbitrating I/O to the second memory 15. Based on the result received from the evaluation unit 14, the permission unit 17 permits data stored in the first memory 11 to be transferred to the second memory 15. When data transfer is permitted by the permission unit 17, the inter memory data transfer unit 18 passes the reproduction data from the first memory 11 to the second memory 15. It is provided with a memory bus, multiplier for calculating the address in the first memory 11, and a multiplier for calculating the address in the second memory 15. The error-correcting unit 19 applies error-correcting to the reproduction data stored in the second memory 15. After the error-correcting unit 19 removes errors from the reproduction data, the output controller 20 transfers the user data contained in the reproduction data from the second memory 15. It includes a multiplier for calculating the address in the second memory 15.

Figure 3:
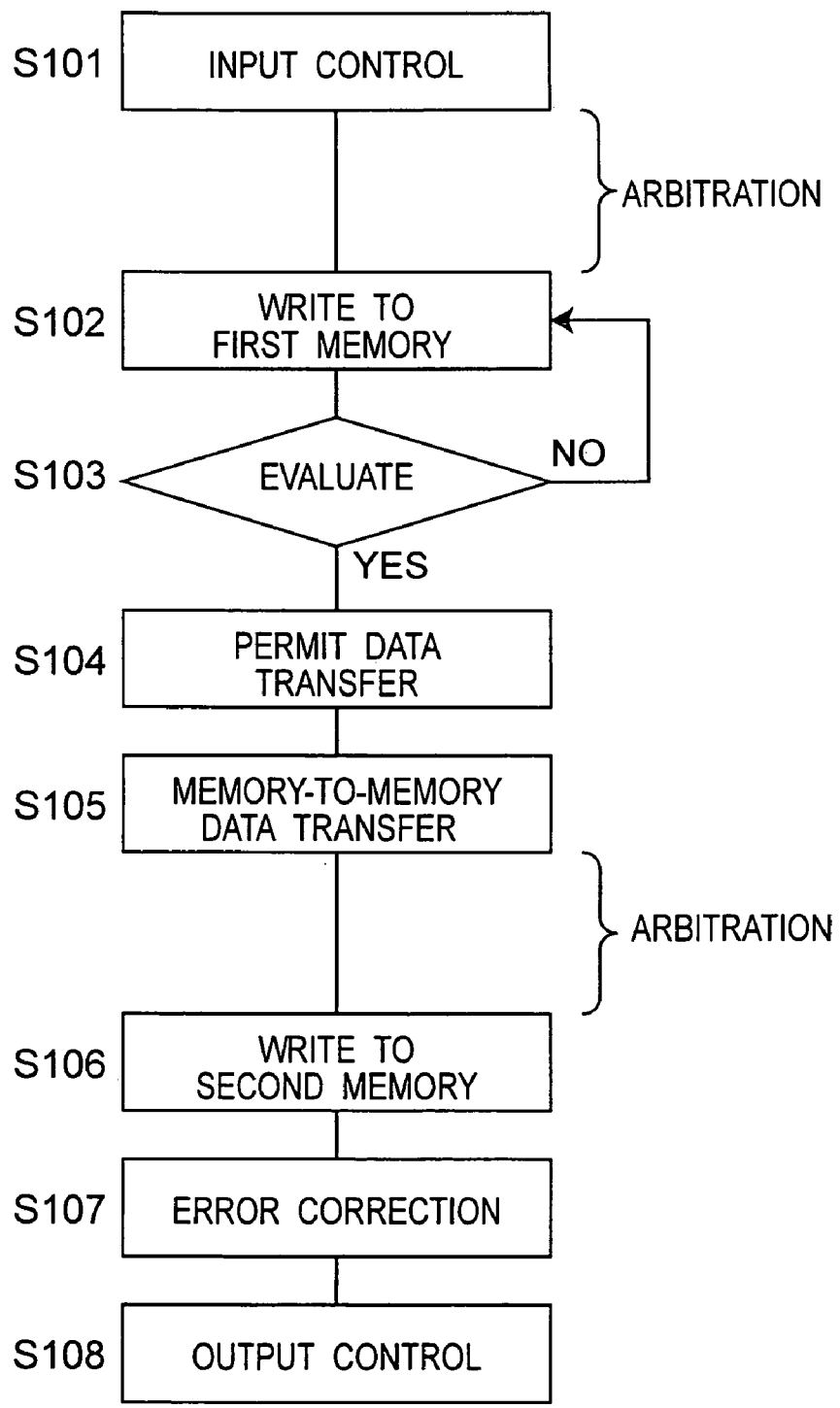
FIG. 3 is a flow chart of the process run by an error-correcting circuit according to a first embodiment of the invention.

FIG. 3 is a flow chart of the process run by the error-correcting circuit. The data transfer operations of the error-correcting circuit are described next with reference to FIG. 3.

When reproducing the disk, data containing synchronization signals formatted as shown in FIG. 1 (that is, sector synchronization signal SS, frame synchronization signal FS, user data, and parity data) is sent from the modulator/demodulator to the error-correcting circuit.

When the error-correcting circuit receives the data from the modulator/demodulator, the input controller 13 extracts the sector synchronization signal SS and frame synchronization signal FS from the received data (S101), and writes the user data and parity data to the first memory 11 one byte at a time (S102). The evaluation unit 14 then determines if a predetermined amount of data has been written to the first memory 11 (S103). When it is determined that the predetermined amount of data has been stored, the permission unit 17 permits data transfer from the first memory 11 to the second memory 15 (S104), and the data transfer unit 18 starts the data transfer from the first memory 11 to the second memory 15 (S105). Data is thus recorded to the second memory 15 (S106). Note that the input controller 13 continues writing to the first memory 11 during this operation.

When transferring all data recorded to one ECC block as shown in FIG. 1 to the second memory 15 is completed by repeating the above described process, the error-correcting unit 19 performs error-correcting (S107). The output controller 20 then transfers only the user data in the recorded data to the video signal processor (S108).

During this operation the second arbiter 16 arbitrates access to the second memory 15 by the data transfer unit 18, error-correcting unit 19 and output controller 20. The first arbiter 12 arbitrates access to the first memory 11 by input controller 13 and data transfer unit 18. The second arbiter 16 arbitrates access contention to the second memory 15 among the data transfer unit 18, error-correcting unit 19, and output controller 20.

Thus, it is possible to improve access performance to the bus of the second memory 15, by using the first memory 11 having capacity less than the size of one ECC block.

Writing operation to first memory 11 in step S102 in FIG. 3 is described in further detail below.

Figure 4:
FIG. 4 shows the arrangement of data in a first memory of the error-correcting circuit in a first embodiment of the invention.

FIG. 4 schematically shows the reproduction data written to the first memory 11. The addresses advance from left to right and top to bottom. The first memory 11 is divided into three pages. A predetermined data amount is equivalent to the capacity of one page, and the capacity of one page is 40 bytes, that is, the byte count of the interleave length (10) times the byte width (4) of the bus of the second memory 15. The first memory 11 thus has a storage capacity of 120 bytes. One ECC block which contains 1200 bytes, and thus the first memory 11 has a small capacity, that is, just only 10% of the ECC block. The input controller 13 removes the sector synchronization signal SS and frame synchronization signal FS and writes the user data and parity, one byte at a time to page one of first memory 11 in the sequence denoted by the numbers in the boxes shown in FIG. 4.

Data transfer operation from the first memory 11 to the second memory 15 in step S105 in FIG. 3 is described in detail next.

After the input controller 13 completes writing 40 bytes of data from numbers 1 to 40 in page 1 of the first memory 11, the evaluation unit 14 confirms that the predetermined amount of data (40 bytes) has been stored to the first memory 11. Based on the result, the permission unit 17 permits data transfer from the first memory 11 to the second memory 15, and the data transfer unit 18 then starts the data transfer from the first memory 11 to the second memory 15.

This data transfer from the first memory 11 to the second memory 15 executed by the data transfer unit 18 is described in further detail below.

First, the data written in order of 1st, 11th, 21st, 31st in the first memory 11 as shown in FIG. 4 is read and then written in a lump to rows 1 to 4 in column 1 of the second memory 15 in the sequence shown in FIG. 1. The next four bytes written in order of 2nd, 12th, 22nd, 32nd as shown in FIG. 4 are then read from the first memory 11, and written to rows 1 to 4 of column 2 in the second memory 15 as shown in FIG. 1. This process repeats to write all data stored to page one of the first memory 11 to the second memory 15.

When the input controller 13 and the data transfer unit 18 contend for access to the first memory 11 during this operation, the first arbiter 12 gives priority to the access by the input controller 13.

As described above, a capacity of the first memory 11 made equal to the interleave length times the bus width of the first memory 11, and data is transferred from the first memory 11 to the second memory 15 in data blocks sized to the bus width of the first memory. The bus transfer efficiency of the second memory 15 can thus be improved by using the first memory 11 which is smaller than the size of one ECC block.

Next, description is made with four examples to operations in case that there is lack of a part of data due to bit slip and data for a full page is not prepared.

Figure 5:
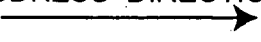
FIG. 5 describes a first example of a data transfer operation when all data is not written to one page due to bit slip, for example.

The first example handles a case in which bit slip causes a jump to the next frame with data being written to a different address in the same page. This is described with reference to FIG. 5. In this example the input controller 13 receives the frame synchronization signal FS after receiving the data written in 15h position of page 1. Because one frame contains 20 bytes, the beginning of the next frame starts from 21st position of page 1 in FIG. 5. The input controller 13 therefore continues writing data from 21st position of page 1.

The second example handles a case in which bit slip causes a jump to the next frame with data being written to the next page. This is described with reference to FIG. 6. In this example the input controller 13 receives the frame synchronization signal FS after receiving the data written in 34th position of page 1 as shown in FIG. 6. The start of the next frame thus jumps to page 2, at 1st position. The input controller 13 starts writing from page 2, at 1st position. In this case the evaluation unit 14 determines that writing page 1 has finished. The permission unit 17 therefore permits data transfer, and the data transfer unit 18 transfers the data written in page 1 to the second memory 15.

The third example handles a case in which bit slip causes a jump of plural frames with data being written to the next page. This is described with reference to FIG. 7. In this example the input controller 13 receives the sector synchronization signal SS after receiving the data written to page 1, 15th position as shown in FIG. 7. Because one sector contains three frames, the start of the next sector skips to page 2, 21st position. The input controller 13 therefore starts writing the following data from page 2, 21st position. In this case the evaluation unit 14 determines that writing page 1 has finished. The permission unit 17 therefore permits data transfer, and the data transfer unit 18 transfers the data written to page 1 to the second memory 15.

Figure 8:
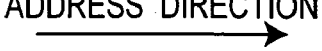
FIG. 8 describes a fourth example of a data transfer operation when all data is not written to one page due to bit slip, for example.

The fourth example handles a case in which bit slip causes the data to skip multiple frames, the data write address jumps to the next page, and bit slip occurs again causing the data write address to jump to the next page. This is described with reference to FIG. 8.

For example, the next case is considered. Bit slip while writing page 1 causes the write position to jump to 21st position in page 2 as described in the third example above, writing then proceeds to 36th position, at which time the input controller 13 receives a frame synchronization signal FS. In such a case, the next frame starts from page 3, 1st position, and the input controller 13 therefore starts writing subsequently received data from page 3, 1st position. The evaluation unit 14 therefore determines that writing page 2 is finished and the permission unit 17 permits data transfer. The data transfer unit 18 therefore starts sending the data written to page 2 to the second memory 15. If transferring the data written to page 1 to the second memory 15 has not been completed, the permission unit 17 holds permission of data transfer from page 2 to the second memory 15 until the data transfer from page 1 to the second memory 15 has been completed.

Situations in which data is lost due to bit slip, for example, can thus be easily handled by providing the first memory 11 with three memory pages each storing data equal to the interleave length times the data bus width of the first memory 11.

This embodiment of the invention can thus transfer data between the first memory 11 and the second memory 15 in byte units equal to the data bus width of the second memory 15, and thereby improve access performance to the bus of the second memory 15, by deinterleaving data from the demodulator while writing the data to the first memory 11 (memory used for deinterleaving) during disk reproduction, and then writing the data to a second memory 15 (such as DRAM) after storing only a specified number of bytes (equal to the interleave length multiplied by the bus width of the second memory 15) to the first memory 11.

Furthermore, by setting the capacity of the first memory 11 to three times the interleave length times the bus width of the first memory 11, a size of the memory can be less than that of one ECC block. By further providing the first memory 11 with three memory pages each large enough to store a number of data bytes equal to the interleave length times the data bus width of the second memory 15, problems caused by data loss resulting from bit slip can be easily handled.

Embodiment 2

A second embodiment of the invention is an error-correcting coding circuit for achieving error-correcting coding of data when recording the data to an optical disk recorded with the disk format as shown in FIG. 1.

Figure 9:
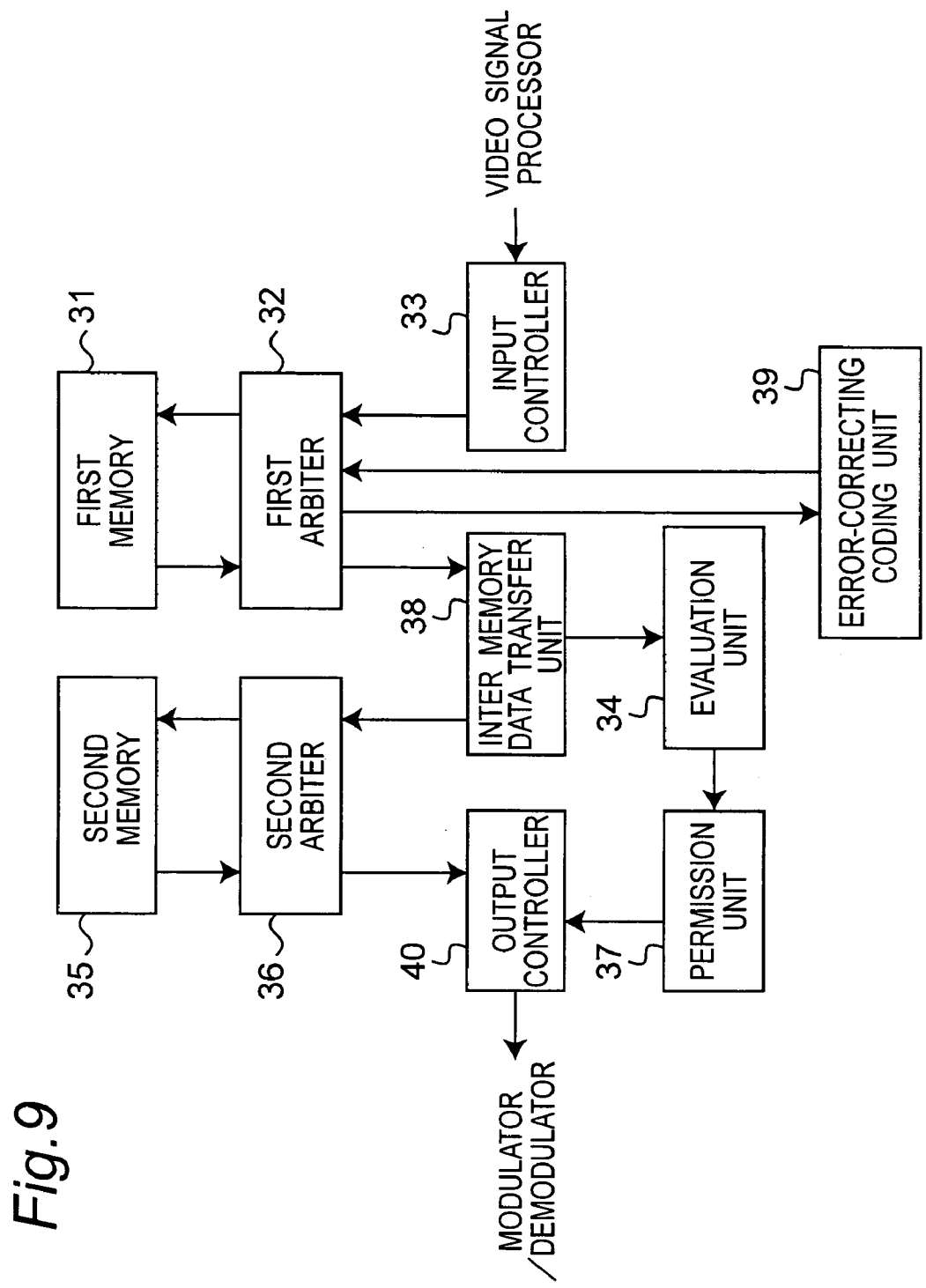
FIG. 9 is a block diagram of an error-correcting coding circuit in a second embodiment of the invention.

FIG. 9 is a block diagram of an error-correcting coding circuit according to this embodiment of the invention.

The error-correcting coding circuit includes elements 31 to 40. The error-correcting coding circuit applies error-correcting coding process to data received from the video signal processor to output the result to the modulator/demodulator.

The first memory 31 is a memory with a 4 byte wide bus, such as DRAM. The first arbiter 32 is a bus arbiter as known from the literature for arbitrating I/O to the first memory 31. The input controller 33 stores the user data to the first memory 31 and has a multiplier for calculating the address in the first memory 31. The error-correcting coding unit 39 applies error-correcting coding process to the user data stored in the first memory 31 and generates parity data. The second memory 35 temporarily stores data which is error-corrected by the error-correcting coding unit 39, and includes SRAM or other memory having capacity less than size of one ECC block.

The inter memory data transfer unit 38 transfers error-corrected and coded data from the first memory 31 to the second memory 35, and includes a memory bus, a multiplier for determining the address of the first memory 31, and a multiplier for determining the address of the second memory 35. The second arbiter 36 arbitrates I/O to the second memory 35, and is a bus arbiter as generally known.

The evaluation unit 34 determines if the specific bytes of data have been stored to the second memory 35 using a counter for counting the stored bytes and a comparator for comparing the stored byte count with a specified byte count.

Based on the result from the evaluation unit 34, the permission unit 37 enables transferring data stored to the second memory 35. When data transfer is enabled by the permission unit 37, the output controller 40 interleaves and sends the encoded data from the second memory 35. The controller 40 includes a multiplier and adder for calculating the interleave address.

Figure 10:
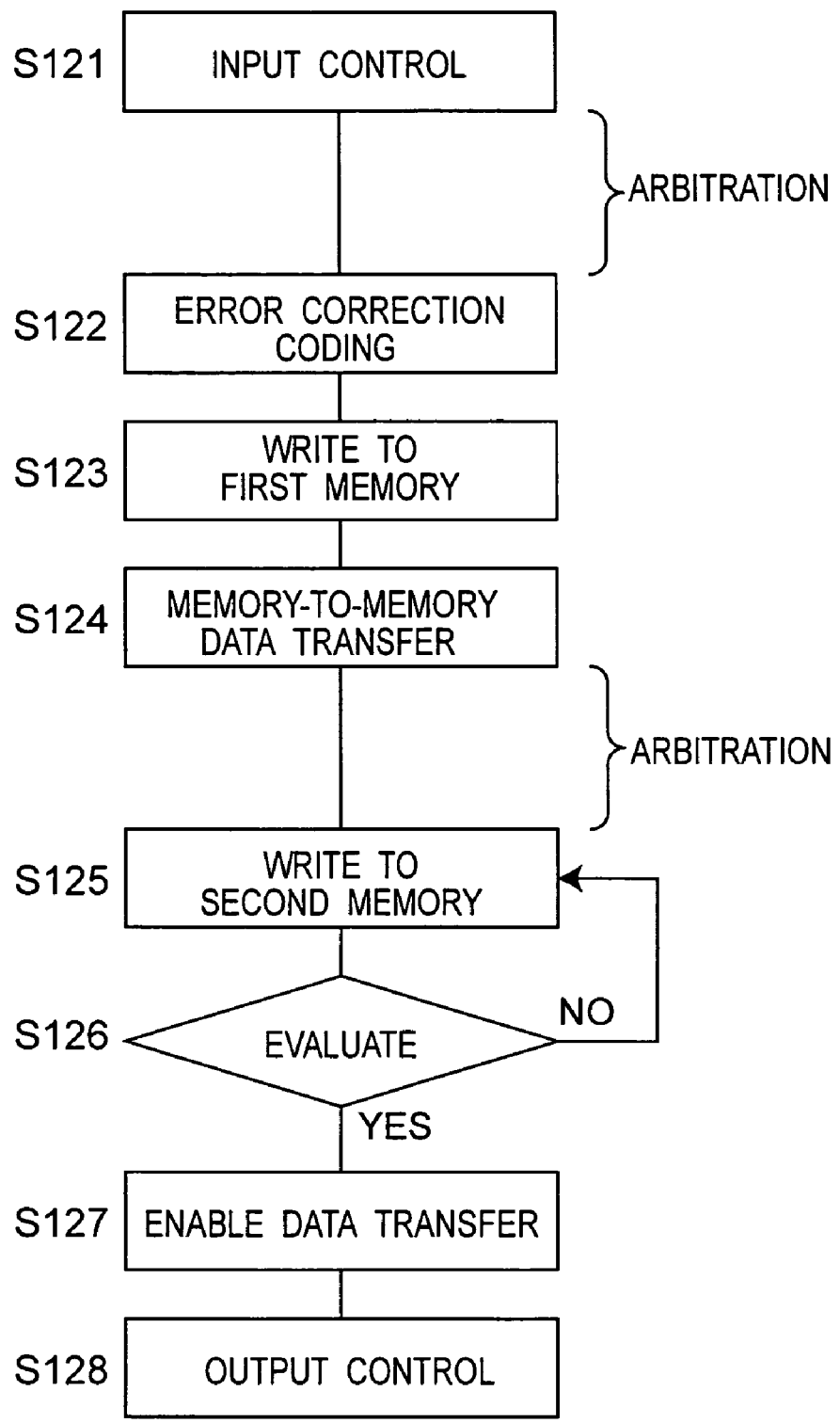
FIG. 10 is a flow chart of the operation of the error-correcting coding circuit in a second embodiment of the invention.

FIG. 10 is a flow chart of the process run by the error-correcting coding circuit. The data transfer operation of the error-correcting coding circuit is described next with reference to FIG. 10.

During data recording, the input controller 33 first receives user data from the video signal processor and passes the received user data to the first memory 31 (S121). The user data is sent through the first arbiter 32 to the error-correcting coding unit 39. The error-correcting coding unit 39 then applies error-correcting coding (ECC) process to the user data (S122), generates parity data, and writes the ECC data to the first memory 31 (S123). The user data and parity data on the first memory 31 are arranged in the error-correcting coding direction. The inter memory data transfer unit 38 then transfers the user data and parity data from the first memory 31 to the second memory 35 (S124). When one memory page storing data equivalent to the specified byte count is filled, the evaluation unit 34 determines that the specified number of bytes have been stored to the second memory 35 (S126) and the permission unit 37 then allows the data stored to page 1 of the second memory 35 to be transferred to the modulator (S127). The output controller 40 thus interleaves and transfers the data to the modulator (S128).

During this operation the first arbiter 32 arbitrates access contention to the first memory 31 by the input controller 33, the error-correcting coding unit 39, and the inter memory data transfer unit 38. The second arbiter 36 arbitrates access contention to the second memory 35 by the data transfer unit 38 and the output controller 40.

The first memory 31 bus access performance can thus be improved by using the second memory 35 with less storage capacity than needed to store one ECC block.

Data transfer operation from the first memory 31 to the second memory 35 by the inter memory data transfer unit 38 is described in further detail below with reference to FIGS. 1 and 11.

Figure 11:
FIG. 11 shows the arrangement of data in a second memory in the second embodiment of the invention.

FIG. 11 schematically shows the encoded data written to the second memory 35. Addresses advances from left to right and top to bottom. This second memory 35 is divided into two pages. The specified number of data bytes noted above is equal to one memory page, and the size is 40 bytes (that is, it is calculated by multiplying the byte length (10) in the interleave direction by the byte width (4) of the first memory 31 bus. The storage capacity of the second memory 35 is therefore 80 bytes. One ECC block contains 1200 bytes, and the second memory 35 can therefore store only less than 7% of one ECC block.

The data transfer sequence is described next.

First, the four bytes (1, 11, 21, 31) stored in rows 1 to 4 of column 1 as shown in FIG. 1 are batch read from the first memory 31, and then written to locations 1, 11, 21, 31 of page 1 in the second memory 35 as shown in FIG. 11. The next four bytes (2, 12, 22, 32) stored in rows 1 to 4 of column 2 as shown in FIG. 1 are then read from the first memory 31, and written to locations 2, 12, 22, 32 of the second memory 35 as shown in FIG. 11. All data stored in rows 1 to 4 in the first memory 31 as shown in FIG. 1 is thus written to page 1 of the second memory 35 by repeating this process.

When page 1 is filled the evaluation unit 34 determines that the specified number of bytes have been written to the second memory 35. Based on the determination result, the permission unit 37 permits transferring the data stored to page 1 of the second memory 35 to the modulator, and the output controller 40 interleaves while sending the data to the modulator. During this operation, the inter memory data transfer unit 38 continues writing the data in the first memory 31 to the next page in the same sequence as described above.

Reading from the second memory 35 is described next. Specifically, the output controller 40 reads the encoded data from the first page of the second memory 35 one byte at a time in the order denoted by the numbers shown in the boxes in FIG. 11, that is, from top to bottom and left to right as seen in the figure.

The output controller 40 sequentially writes the user data and parity data on the first memory 31 in the first page to the second page of the second memory 35. Once the second page is filled, the output controller 40 begins writing the first page again. All user data and parity data as shown in FIG. 4 is thus transferred from the first memory 31 through the second memory 35 to the modulator by simply repeating the process described above.

It is noted that the second arbiter 36 arbitrates access contention to the second memory 35 between the output controller 40 and the inter memory data transfer unit 38 so that the access by the output controller 40 is treated as a priority.

Bus access performance can thus be improved for the first memory 31 using the second memory 35 with capacity (80 bytes) less than the size (1200 bytes) of one ECC block.

This embodiment of the invention thus improves access to the bus of the first memory 31 when recording to the disk by interleaving while transferring data to the modulator after writing the number of bytes equal to the interleave length multiplied by the width of the bus of the first memory 31 from the first memory 31 (for example, DRAM) to the second memory 35 (buffer memory). Furthermore, the capacity of the second memory 35 can also be significantly less than the size of one ECC block by providing the second memory 35 with capacity of twice the data size obtained by multiplying the interleave length by the bus width of the first memory 31.

Embodiment 3

An optical disk apparatus for recording and reproducing video information using an optical disk is described next as a third embodiment of the invention.

Figure 12:
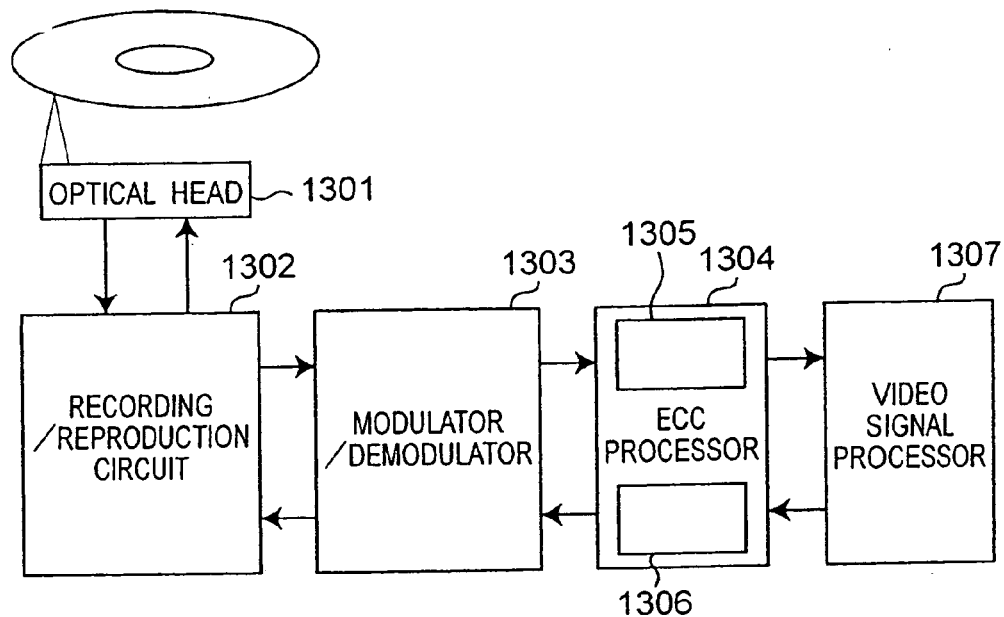
FIG. 12 is a block diagram of a data recording and reproducing apparatus in a third embodiment of the invention.
Figure 13:
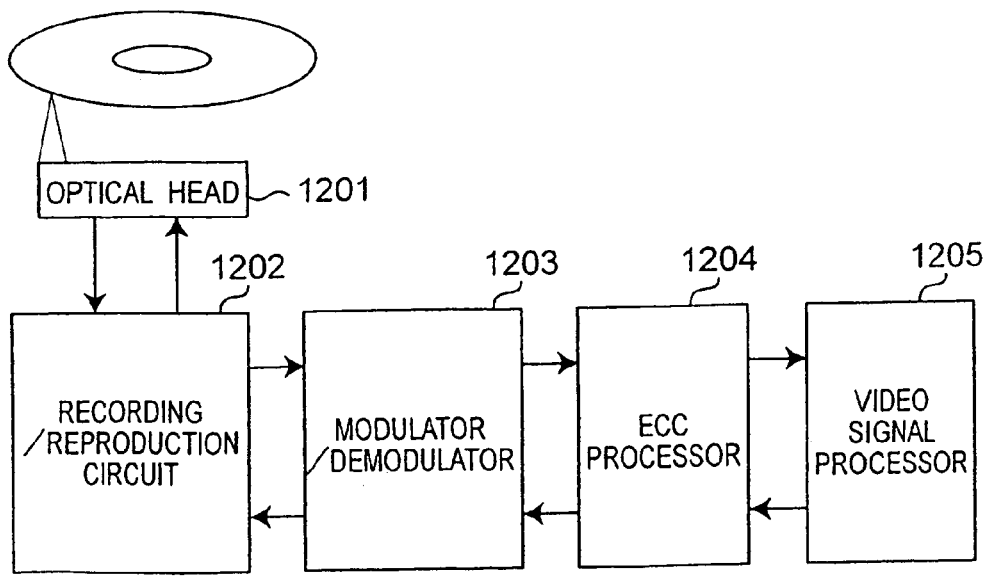
FIG. 13 is a block diagram of a conventional data recording and reproducing apparatus.
Figure 14:
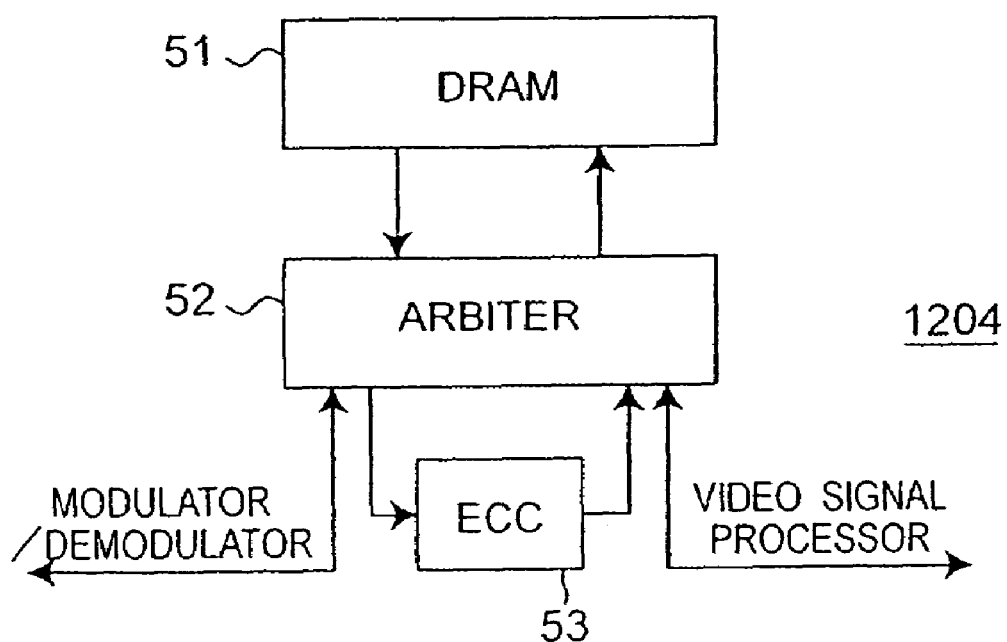
FIG. 14 is a block diagram of a conventional error-correcting circuit.

FIG. 12 is a block diagram of an exemplary optical disk apparatus according to this embodiment of the invention. The optical disk apparatus has an optical head 1301, a recording/reproducing circuit 1302, a modulator/demodulator 1303, an ECC processor 1304, and a video signal processor 1307 for compressing video signals or decompressing and restoring compressed video signals. The ECC processor 1304 includes an error-correcting circuit 1305 described in the first embodiment and an error-correcting coding circuit 1306 according to the second embodiment.

During reproduction operation, the optical disk apparatus scans the optical disk with the optical head 1301 and the recording/reproducing circuit 1302 then digitizes the signal obtained by the scanning. The modulator/demodulator 1303 then demodulates the signal and error-correcting circuit 1305 in the ECC processor 1304 applies error-correcting. The video signal processor 1307 then decompresses the error corrected signal to obtain the desired video information.

During recording operation, the video signal processor 1307 compresses the video information, and the error-correcting coding circuit 1306 of the ECC processor 1304 applies error-correcting coding process to the compressed signal. The modulator/demodulator 1303 modulates the ECC signal, and the recording/reproducing circuit 1302 converts the result to an analog recording signal which is then recorded to the optical disk by the optical head 1301.

This embodiment of the invention thus provides an optical disk apparatus enabling faster optical disk recording and reproduction by incorporating the ECC processor 1304 having the circuits described in the first and second embodiments of the invention.

It will also be apparent that during disk reproduction the optical disk apparatus according to the present embodiment deinterleaves while writing data from the modulator/demodulator 1303 to the first memory and transfers data from the first memory to the second memory in blocks of a specified size (specifically the number of bytes equal to the interleave length multiplied by the width of the first memory bus). Data is thus transferred from the first memory to the second memory in byte units matching the bus width of the second memory, thereby improving access to the second memory.

Furthermore, by sizing the capacity of the first memory to a specific multiple (i.e., 3) of the interleave length times the width of the first memory bus, the storage capacity of the memory can be less than required to store one complete ECC block.

Yet further, by providing three memory pages in the first memory with each page sized to store data equal to the interleave length times the bus width of the first memory, problems arising from data erasure due to bit slip, for example, can be easily handled.

Furthermore, during disk recording, by interleaving and transferring data to the modulator after storing data from the first memory in the second memory in blocks equal to the interleave length times the bus width of the first memory, access to the first memory can be improved.

Yet further, by sizing the storage capacity of the second memory to twice the interleave length times the bus width of the first memory, the storage capacity of the first memory can be less than required to store one complete ECC block.

A reproducing circuit and a recording circuit for reading and writing data to an optical disk using a recording format in which first data and second data alternate are described in the following embodiments. Terms used in the following embodiments are therefore first described below.

<Definitions>

"first data": video, audio, and other data like this

"second data": data provided for detecting burst errors in the first data, such as BIS (Burst Indicating Subcode)

"recording-order arranged data": data recorded with each data byte arranged so that the direction in which data is recorded to the medium (the address direction) and the direction of the data (the direction in which the data continues) match.

"code word sequence data": data recorded so that a parity check is possible. The data bytes are arranged and recorded so that the disk recording direction and the coding direction match.

"synchronization error information": information indicating for each synchronization code if there is a synchronization code error "data error location information": information denoting locations where data errors occurs from burst errors, for example. The first data error location information indicates the beginning or end position of the data area where data is eliminated in the first data.

"erasure pointer": It is generated from the data error location information, and indicates a location (range) where data is eliminated in the first data due to a burst error, for example.

<Recording Format and Interleaving>

The recording format of optical disks used in this and the following embodiments is described first below, before describing the circuit configuration and operation.

Figure 15:
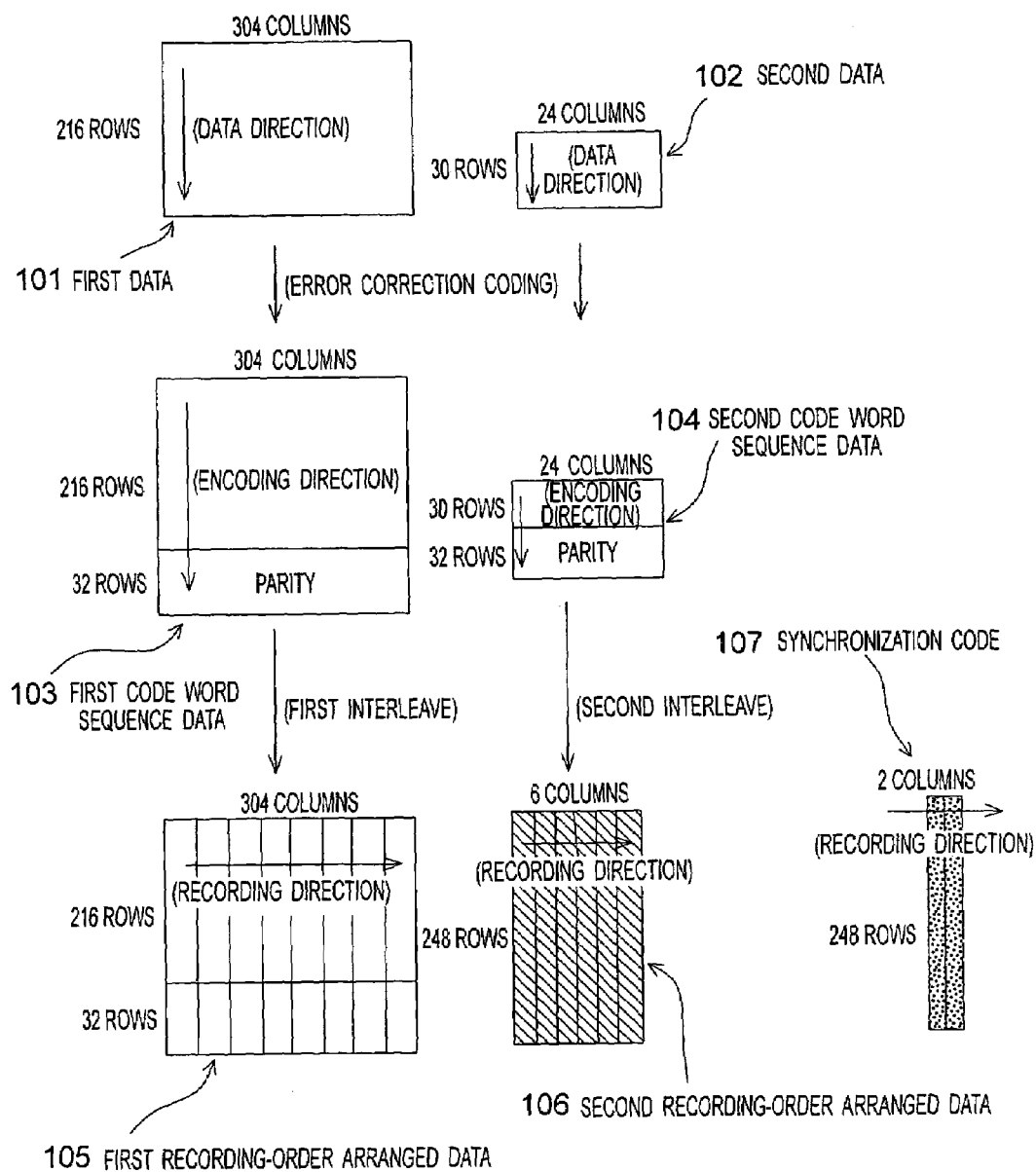
FIG. 15 describes the process which is applicable to embodiments 4 to 13 for generating data in the optical disk recording format.
Figure 16:
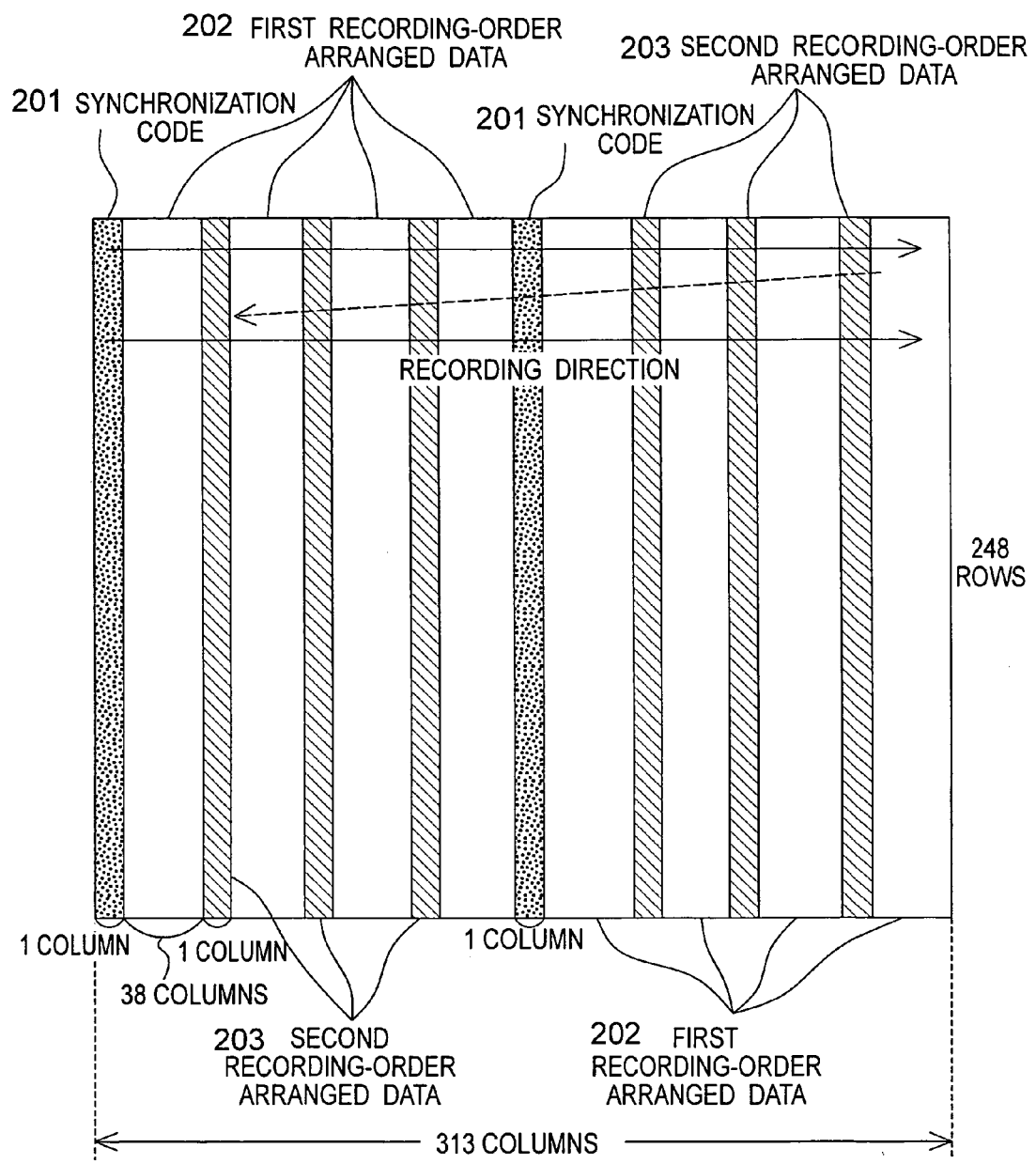
FIG. 16 describes the optical disk recording format applicable to embodiments 4 to 13.

FIG. 15 shows the process for generating data in the recording format of an optical disk handled in the present and following embodiments of the invention. This process produces data with 248 rows×312 columns as shown in FIG. 16 from the first data 101 with 216 rows×304 columns and the second data 102 with 30 rows×24 columns as shown in FIG. 15.

In FIG. 15, the reference numeral "101" denotes first data, and "102" denotes second data. Data is arranged (i.e., the data order) in the column direction in first data 101 and second data 102 shown in FIG. 15. The reference numeral "103" denotes first code word sequence data, and the reference numeral "104" denotes second code word sequence data. The first and second code word sequence data 103 and 104 are coded by column unit. The reference numeral "105" denotes the recording-order arranged data. The first recording-order arranged data 105 are recorded in the row direction. The reference numeral "106" denotes second recording-order arranged data, and the reference numeral "107" denotes a synchronization code. The second recording-order arranged data 106 and synchronization code 107 are recorded in the row direction.

The first code word sequence data 103 is generated by applying error-correcting coding to each 216-byte long column of the first data 101 and then adding 32 bytes of parity data to them.

The second code word sequence data 104 is generated by applying error-correcting coding to each 30-byte long column of the second data 102 and then adding 32 bytes of parity data to them. The error-correcting coding applied to the second code word sequence data 104 is more robust than that applied to the first code word sequence data 103.

The first recording-order arranged data 105 is produced by a first interleave operation applied to the first code word sequence data 103. The second recording-order arranged data 106 is produced by applying a second interleave operation to the second code word sequence data 104.

FIG. 16 shows the recording data produced by dividing the first recording-order arranged data 105 shown in FIG. 15 into 8 equal groups of 38 columns each, and alternating these eight groups of the first recording-order arranged data 105 with a column of second recording-order arranged data 106 or a column of synchronization code 107.

In FIG. 16, data 201 is a synchronization code. Data 202 is first recording-order arranged data 202 with 38-column wide. Data 203 is one column of second recording-order arranged data. As will be clear from FIG. 16, 38-column wide groups of the first recording-order arranged data 202 are bracketed by the synchronization code 201 or the second recording-order arranged data 203. The arrows in FIG. 16 indicate a direction in which the data is recorded or read from the disk. Each row is recorded from the most-significant row to the least-significant row.

Thus, the recording format to the optical disk premised in this embodiment is a data format combining a code with robust error-correcting capability and a code with weaker error-correcting capability.

An example of the first interleave operation is described next with reference to FIG. 17A and FIG. 17B.

Figure 17A:
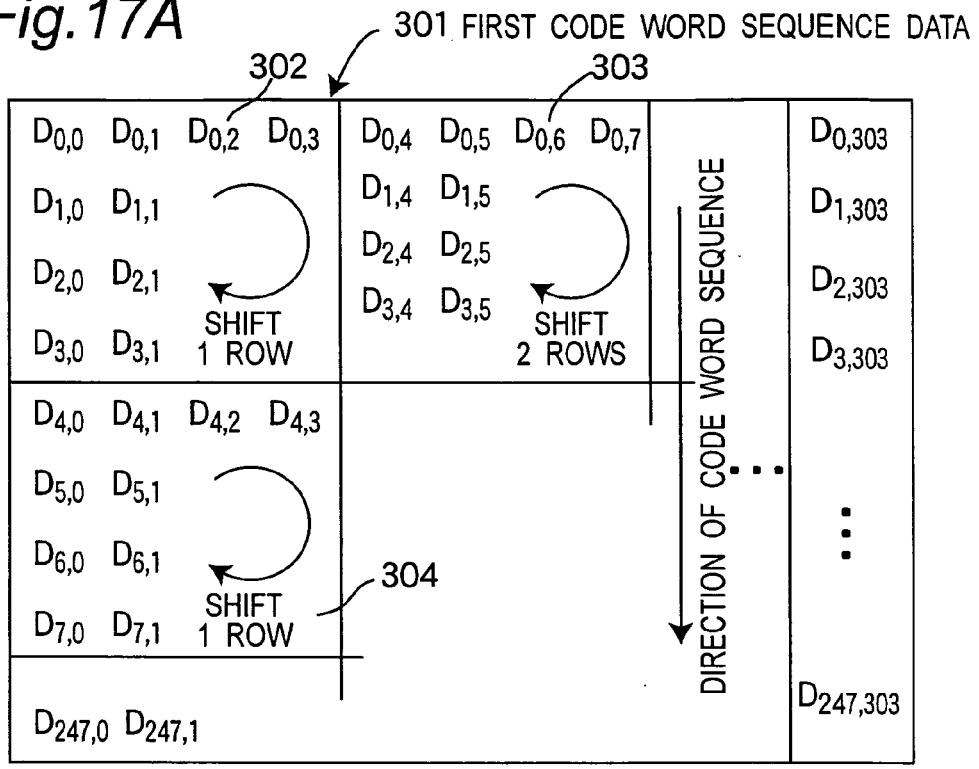
FIG. 17A and FIG. 17B show an example of a first interleave.

Referring to FIG. 17A, the first code word sequence data 301 contains multiple data blocks 302 to 304 each 4 rows by 4 columns wide. The first recording-order arranged data 305 shown in FIG. 17B is the data after the first interleave.

The first interleave is done as follows.

First, the first code word sequence data 301 is segmented into 4-row×4-column blocks 302 to 304, and the rows in each block are cyclically shifted. Cyclically shifting of row in each block is described below. First, a modulo 4 cyclic shift of one row is applied in the top left block 302, i.e., the first block in each row. In the next block 303 right adjacent to block 302, two rows are cyclically shifted, three rows are shifted in the next adjacent block and so forth so that the number of rows shifted increases by one in each right adjacent block. When this operation is completed in the first row of blocks, operation proceeds to the first block 304 in the second row of blocks where one row is cyclically shifted. Regarding the following blocks, rows in each block are similarly shifted cyclically.

This cyclically shifting operation is described yet more specifically below. Each byte in first code word sequence data 301 is labeled Di,j (where i is an integer from 0 to 247, and j is an integer from 0 to 303). Data Di,j on row i, column j is aligned by this first interleave operation at row [4*div(i,4)+mod(mod(div(j,4)+1,4)+i−4*div(i,4),4)], and column j, where div(x,y) is a function returning the quotient x divided by y, and mod(x,y) is a modulo function returning the remainder of x divided by y.

Figure 17B:
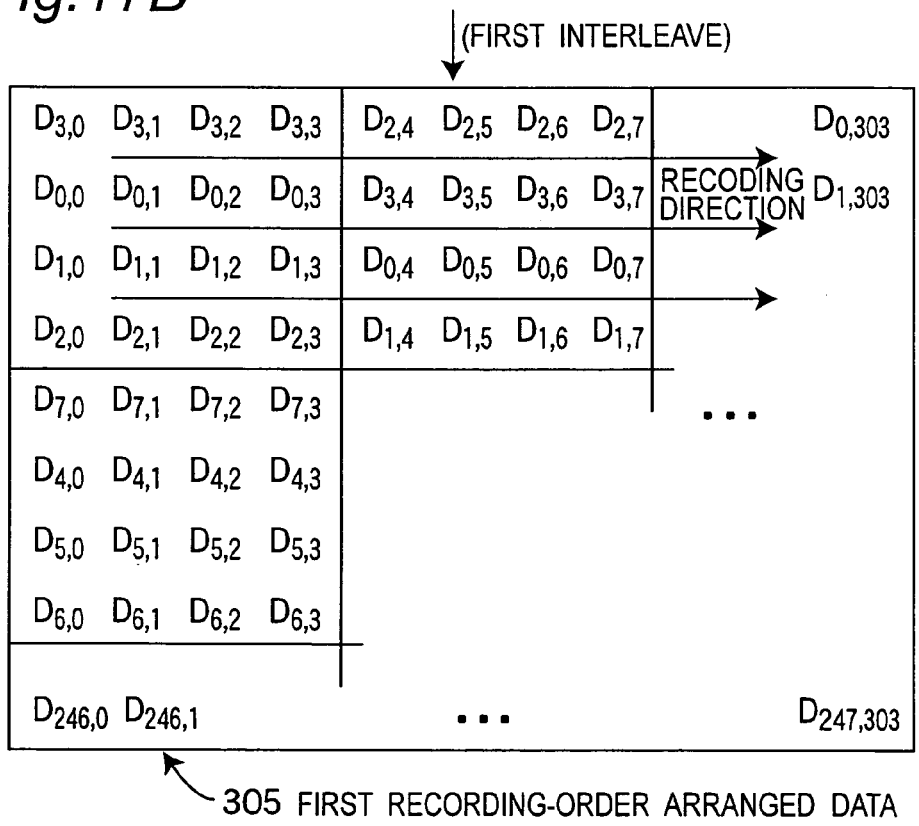

This interleave operation produces the first recording-order arranged data 305 shown in FIG. 17B. The recording sequence in the first recording-order arranged data 305 is row by row from the most-significant row to the least-significant row. Within each row, data is recorded from left to right, that is, sequentially in the row direction.

The second interleave is described with reference to FIG. 18A and FIG. 18B. FIG. 18A shows the second code word sequence data 401 before the second interleave, and FIG. 18B shows the second recording-order arranged data 402 after the second interleave. The second interleave arranges 24 code word sequences arranged in column direction in second code word sequence data 401 diagonally through the second recording-order arranged data 402, and records them in the row direction. More specifically, when Bi,j (where i is an integer from 0 to 61, and j is an integer from 0 to 23) represent each byte in the second code word sequence data 401, after interleaving, an element at row i, and column j is located at row [mod(i+62*j,248)], and column [mod(i+62*j,6)].

This second interleave produces the second recording-order arranged data 402. The recording sequence in the second recording-order arranged data 402 is row by row from the most-significant row to the least-significant row, and within each row data is recorded from left to right, that is, sequentially in the row direction. It will be obvious that the first and second interleaves are not limited to the above examples.

Embodiment 4

A reproducing circuit for reproducing data from an optical disk recorded with a recording format of alternating first data and second data is described next.

FIG. 19 is a block diagram of a data reproducing circuit according to this embodiment of the invention. This data reproducing circuit reproduces data from an optical disk recorded with the recording format described with reference to FIG. 15 to FIG. 18. As shown in FIG. 19, this data reproducing circuit has plural processing units 3501 to 3513.

The data separator 3501 separates the recorded data read from the optical disk into synchronization signals, first recording-order arranged data, and second recording-order arranged data. The first code word sequence data generator 3502 applies a first deinterleave to the first recording-order arranged data to generate the first code word sequence data. The second code word sequence data generator 3503 applies a second deinterleave to the second recording-order arranged data to generate the second code word sequence data.

The second code word sequence data error location generator 3504 applies an error-correcting to the second code word sequence data to generate error location information arranged in an order corresponding to the order of the second code word sequence data. The second recording-order arranged data error location generator 3505 interleaves data error location information arranged in the order of the second code word sequence data, in the order of the second recording-order arranged data so as to generate error location information of which data order corresponds to the order of the second recording-order arranged data.

The synchronization error extractor 3506 extracts synchronization errors from the synchronization code. The first data error location generator 3507 merges, in the order of the recorded data, error location information in the order of the second code word sequence data and synchronization error information, so as to generate the first data error location information. The first recording-order arranged erasure pointer generator 3508 generates erasure pointers arranged in the order of the first recording-order arranged data from the first data error location information. The first code word sequence erasure pointer generator 3509 applies a first deinterleave to the first recording-order arranged erasure pointers, and produces erasure pointers arranged in the order of the first code word sequence data. The first code word sequence data error-correcting unit 3510 uses the first code word sequence erasure pointer to perform error-correcting for erasure of the first code word sequence data.

The data reproducing circuit also has the input interface 3511, the output interface 3512, the bus controller 3514, and the memory 3515.

The master controller 3513 controls the operation of the other components to control overall operation of the reproducing circuit by means of a CPU and sequencer.

FIG. 20 is a flow chart of the data reproducing circuit operation. The processors of the data reproducing circuit shown in FIG. 19 execute the corresponding steps shown in FIG. 20.

Figure 22:
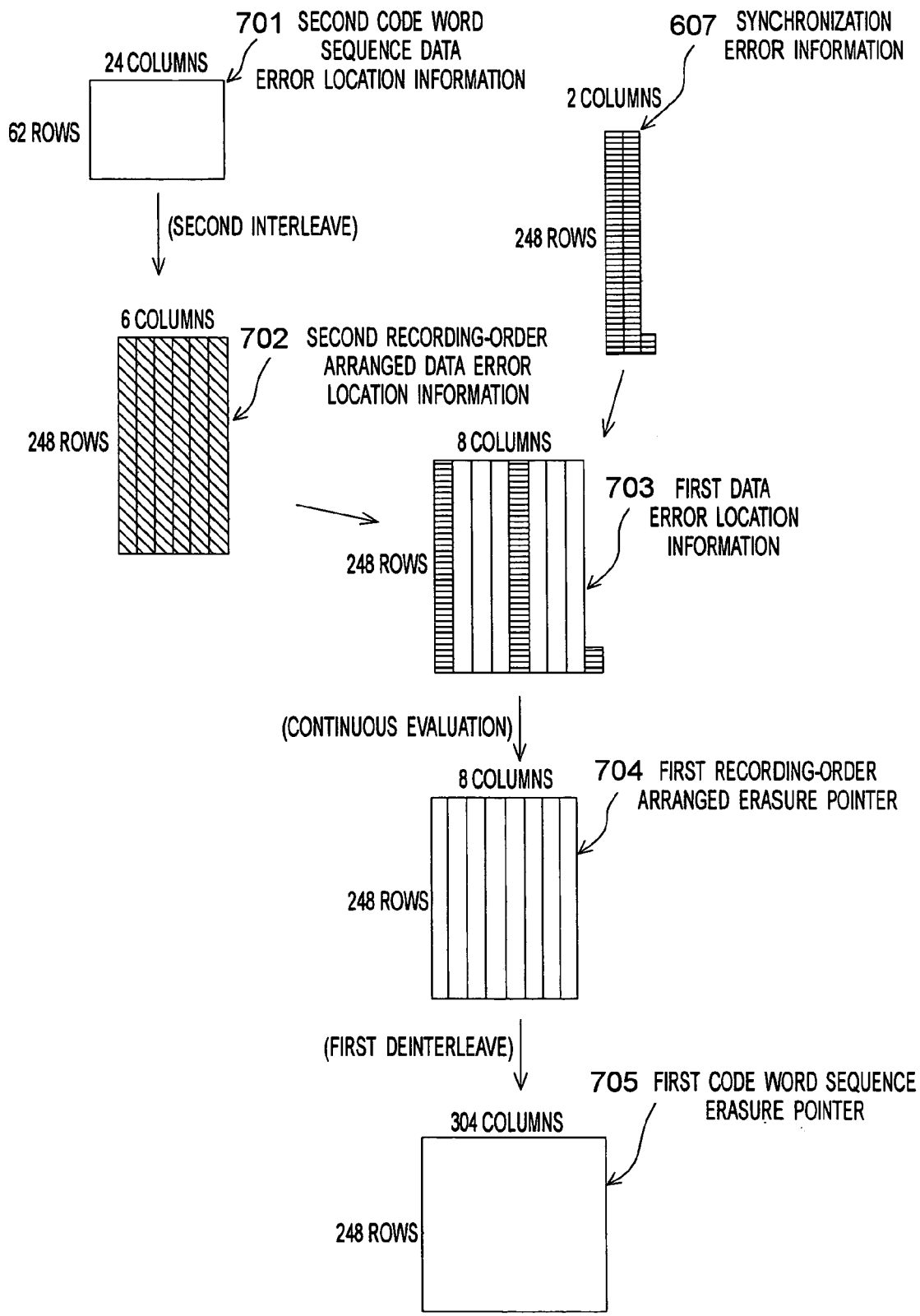
FIG. 22 is a continuation of the data format description from FIG. 21.

FIG. 21 and FIG. 22 describe the data formats handled in the operation of the data reproducing circuit.

In FIG. 21, the reference numeral "601" denotes recorded data which is recorded in the recording format shown in FIG. 16 with the data recorded in the row direction. The reference numeral "602" denotes the first recording-order arranged data separated from the recorded data, of which recording direction is equal to the row direction. The reference numeral "603" denotes second recording-order arranged data extracted from the recorded data 601, which are recorded in the row direction. The reference numeral "604" denotes synchronization code extracted from the recorded data 601, which are recorded in the row direction. The reference numeral "605" denotes first code word sequence data which results from a first deinterleave of the first recording-order arranged data 602. The reference numeral "606" denotes second code word sequence data which results from a second deinterleave applied to the second recording-order arranged data 603. The code word sequences in first and second code word sequence data 605 and 606 are aligned in the column direction. The reference numeral "607" denotes synchronization error information extracted from the synchronization code 604.

Referring to FIG. 22, the reference numeral "701" denotes error location information (second code word sequence data error location information) for the second code word sequence data, which is acquired by applying error-correcting to the second code word sequence data 606. This error location information denotes the start and end positions of a data range where an error is detected. The reference numeral "702" denotes error location information to the second recording-order arranged data. The information 702 is acquired by interleaving the error location information 701 in the sequence of the second code word sequence data.

The reference numeral "703" denotes first data error location information, which is acquired by combining the second recording-order arranged data error location information 702 and the synchronization error information 607 in the order of the recorded data. The reference numeral "704" denotes first recording-order arranged erasure pointers, which are produced by a continuous evaluation of the first data error location information 703, as described below. The erasure pointer is a pointer denoting that an area corresponding to the pointer is an area in which data has been erased. The reference numeral "705" denotes first code word sequence erasure pointer, which is produced by applying a first deinterleave to the first recording-order arranged erasure pointers 704.

Operation of the data reproducing circuit according to this embodiment of the invention is described next.

The data separator 3501 first separates the recorded data 601 into the synchronization code 604, first recording-order arranged data 602, and second recording-order arranged data 603 (S501).

The first code word sequence data generator 3502 generates the first code word sequence data 605 by applying a first deinterleave to the first recording-order arranged data 602 (S502). This first deinterleave applies a modulo-4 row unit cyclical shift in each 4-row×4-column block in the first recording-order arranged data 602.

The second code word sequence data generator 3503 applies a second deinterleave to the second recording-order arranged data 603, to generate the second code word sequence data 606 (S503). This second deinterleave rearranges the code word sequences arranged diagonally to the second recording-order arranged data 603 in the column direction.

The second code word sequence data error location generator 3504 applies error-correcting to the second code word sequence data 606 and generates the second code word sequence data error location information 701 (S504).

The second recording-order arranged data error location generator 3505 applies a second interleave to the second code word sequence data error location information 701 in the data sequence of the second recording-order arranged data 603, and generates second recording-order arranged data error location information 702 having the sequence of the second recording-order arranged data 603 (S505)_.

The synchronization error extractor 3506 extracts synchronization error information 607 from the synchronization code 604 (S506).

The first data error location generator 3507 merges the second recording-order arranged data error location information 702 and synchronization error information 607 to match the data sequence of the recorded data 601, and generates the first data error location information 703 (S507).

The first recording-order arranged erasure pointer generator 3508 generates erasure pointers corresponding to the sequence of the first recording-order arranged data 602 from the first data error location information 703 (S508).

The first code word sequence erasure pointer generator 3509 applies a first deinterleave to the first recording-order arranged erasure pointers 704, and generates first code word sequence erasure pointer 705 corresponding to the order of the first code word sequence data 605 (S509). Each of the first recording-order arranged erasure pointers 704 corresponds to 1 row of 38-columns of data in the first recording-order arranged data. In the first code word sequence erasure pointer generation step 509, the first deinterleave handles each pointer in the first recording-order arranged erasure pointers 704 as a pointer to a 1-row×38-column block.

The first code word sequence data error-correcting unit 3510 applies error-correcting to the first code word sequence data 605 using the first code word sequence erasure pointer 705 (S510).

Figure 23:
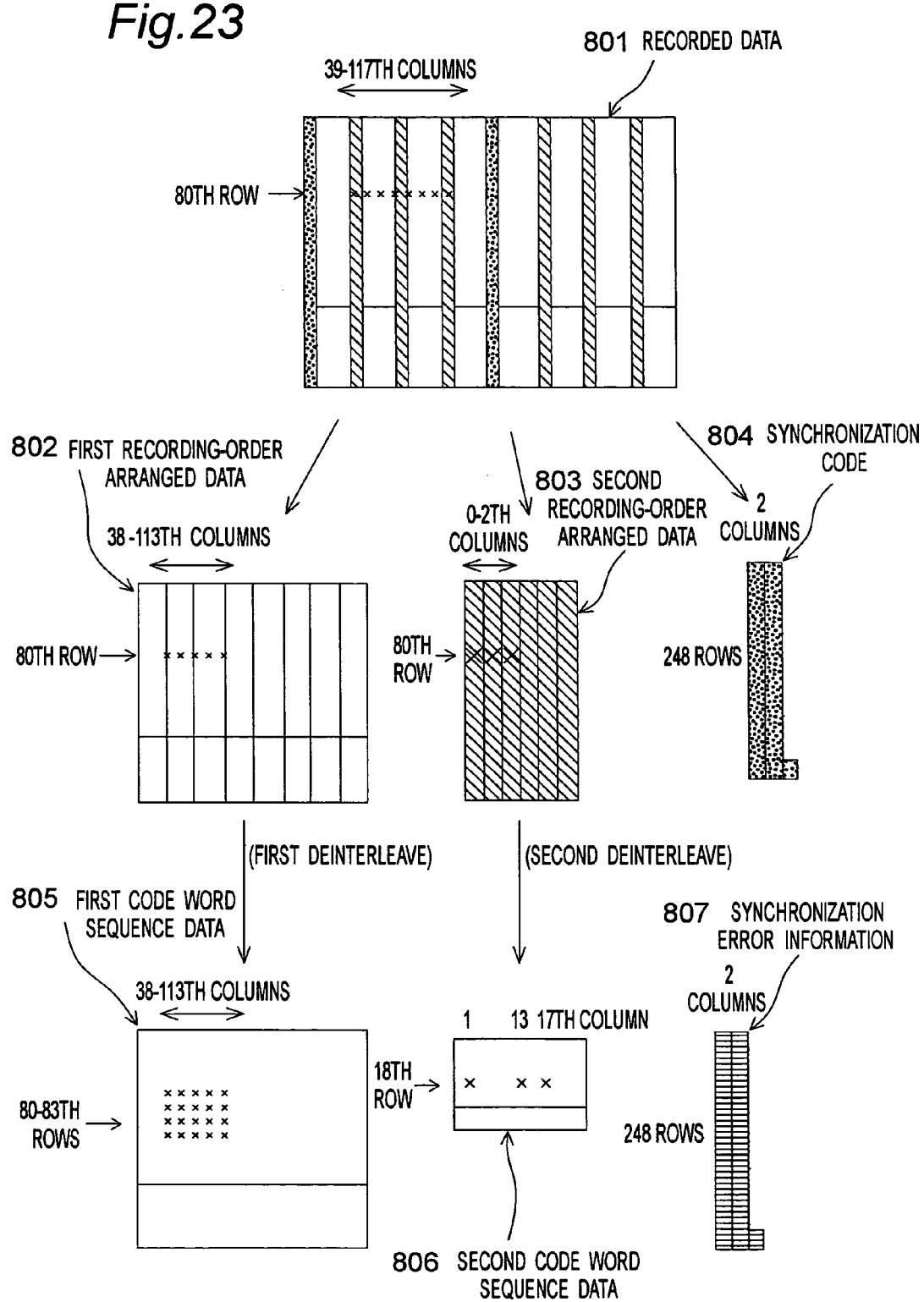
FIG. 23 describes the data formats generated in the reproduction operation of the data reproducing circuit according to a fourth embodiment of the invention when there are burst errors in the reproduced recorded data.

How the first recording-order arranged erasure pointer generator 3508 generates the first recording-order arranged erasure pointers is described in detail next with reference to FIG. 23 and FIG. 24. It is assumed in FIG. 23 and FIG. 24 that there are burst errors from column 39 to column 117 of row 80 in the recorded data 801 reproduced from optical disk. Errors are denoted by an "x" and error location information is denoted by a white triangle in the figures.

Errors are also located from column 38 to column 113 of row 80 in the first recording-order arranged data 802, and from column 0 to column 2 in row 80 in the second recording-order arranged data 803. There are no errors in the synchronization code 804. Errors are dispersed from column 38 to column 113 in rows 80 to 83 in the first code word sequence data 805 which is acquired by a first deinterleave applied to the first recording-order arranged data 802. Errors are also located at columns 1, 13, and 17 in row 18 in the second code word sequence data 806 which is acquired by a second deinterleave applied to the second recording-order arranged data 803. The synchronization error information 807 is acquired from synchronization code 804.

Figure 24:
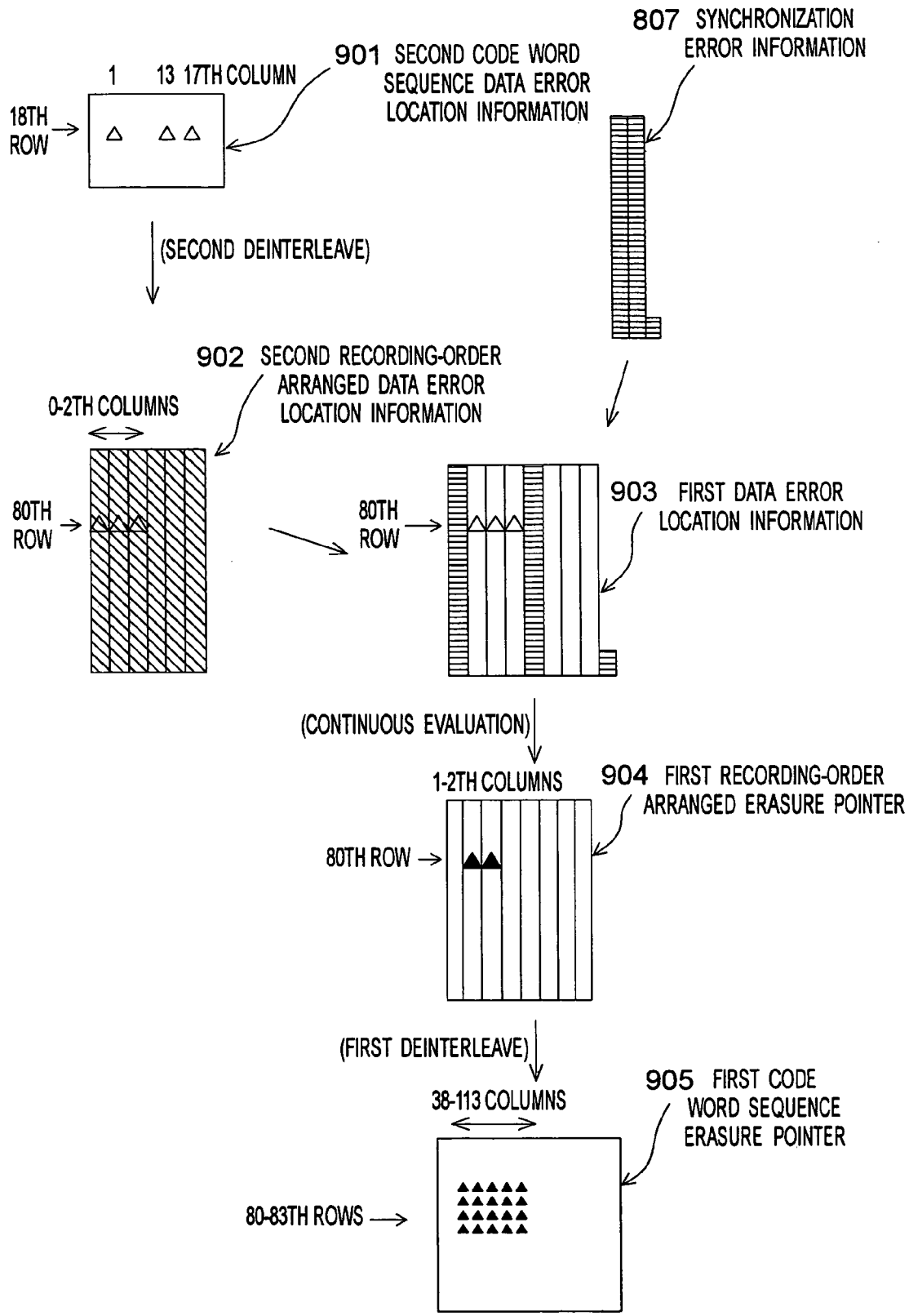
FIG. 24 is a continuation of the data format description in FIG. 23.

Referring to FIG. 24, the reference numeral "901" denotes second code word sequence data error location information which is acquired by error-correcting to the second code word sequence data 806. It is indicated that errors have been found at columns 1, 13, and 17 in row 18.

The reference numeral "902" denotes second recording-order arranged data error location information. The second deinterleave applied to the second code word sequence data error location information 901 provides the location of data errors from column 0 to column 2 in row 80. The reference numeral "903" denotes first data error location information. There are data errors from column 1 to column 3 in row 80. Continuous evaluation of the first data error location information 903 sets erasure pointers to column 1 and column 2 of row 80 in the first recording-order arranged erasure pointers 904. Solid triangles ("▲") in the figures denote erasure pointers. As described above, one erasure pointer corresponds to a 1-row×38-column block in the first recording-order arranged data. The first deinterleave therefore handles one of first recording-order arranged erasure pointers 904 as a pointer to a 1-row×38-column block. This results in erasure pointers populating the range from column 38 to column 113 of rows 80 to 83 in the first code word sequence erasure pointers 905. Errors in the first code word sequence data 805 are thus erased and corrected using the first code word sequence erasure pointers 905.

It should be noted that a simple interleaving technique is described above for simplicity, and more complex interleaving methods can be used to enable more robust error-correcting. The operation described above will, of course, become correspondingly complex.

The data reproduction method of this embodiment thus offers high reliability data reproduction by generating erasure pointers to the first error-correcting code from synchronization error information and error location information for the second error-correcting code, those information having a different data order, and correcting erasure of the first error-correcting code having a low error-correcting capability.

Embodiment 5

This embodiment of the invention describes another data reproducing circuit for reproducing data from an optical disk recorded with the recording format shown in FIG. 15 to FIG. 18.

Figure 25:
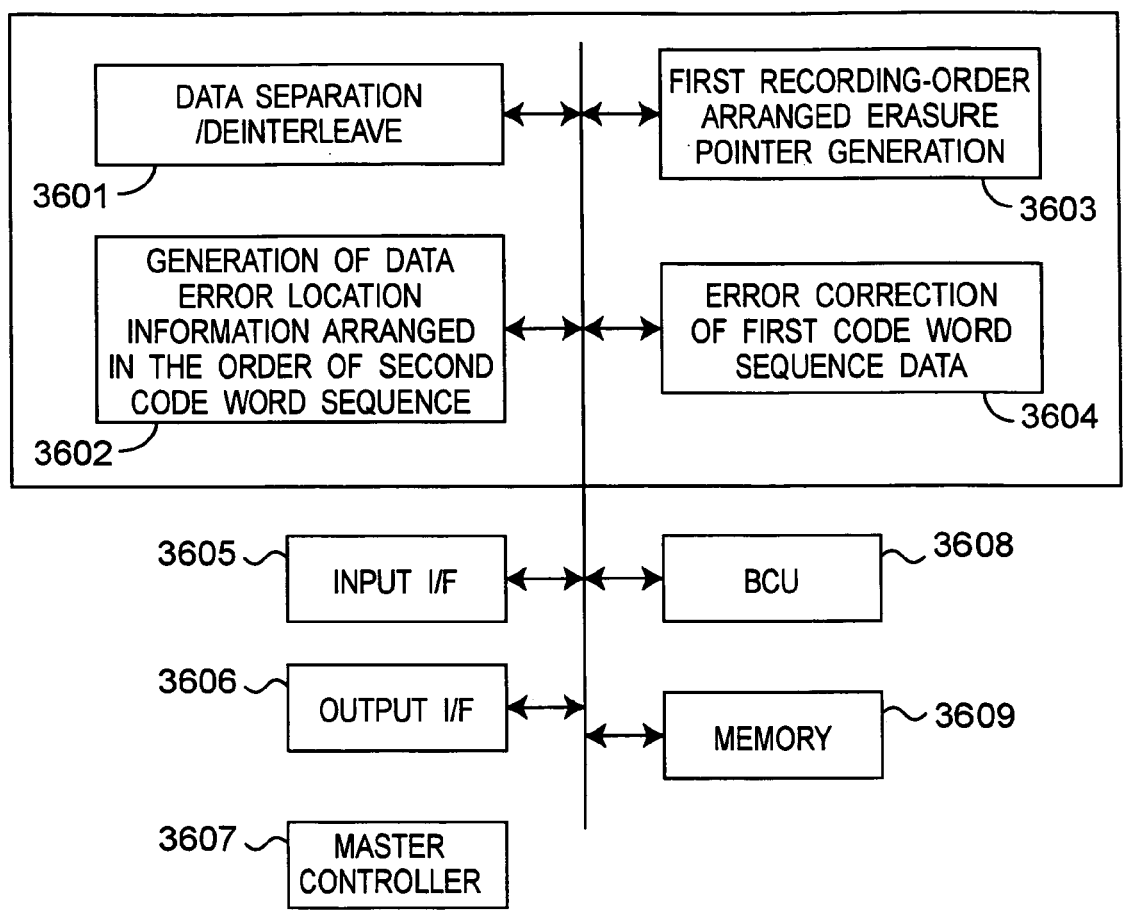
FIG. 25 is a block diagram of a data reproducing circuit according to a fifth embodiment of the invention.

FIG. 25 is a block diagram of this data reproducing circuit.

This data reproducing circuit has an input interface 3605, output interface 3606, controller 3607, bus controller 3608, and processing units 3601 to 3604 as described below.

Data separator/deinterleaver 3601 separates the recorded data read from the disk into synchronization codes, the first recording-order arranged data, and the second recording-order arranged data. It then extracts the synchronization error information from the synchronization codes, generates first code word sequence data by a first deinterleave applied to the first recording-order arranged data, and generates second code word sequence data by a second deinterleave applied to the second recording-order arranged data.

The second code word sequence data error location information generator 3602 performs error-correcting to the second code word sequence data, and produces error location information in the order of the second code word sequence data.

The first recording-order arranged erasure pointer generator 3603 generates erasure pointers corresponding to the order of the first recording-order arranged data from the second code word sequence data error location information and synchronization error information.

The first code word sequence data error-correcting unit 3604 performs error-correcting to erasure of the first code word sequence data, by using the first recording-order arranged erasure pointers while deinterleaving them.

Figure 27:
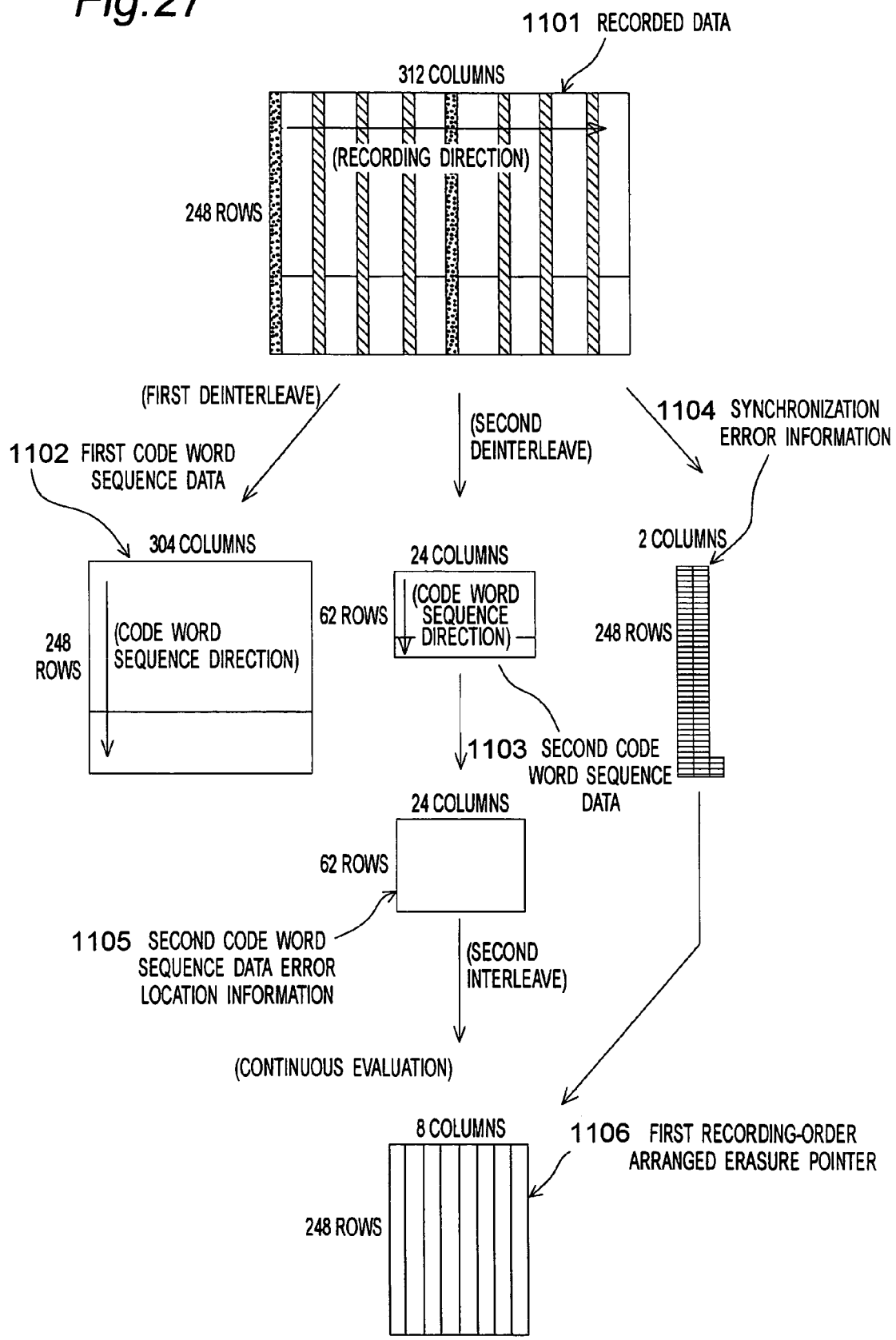
FIG. 27 describes the data formats generated in the reproduction operation of the data reproducing circuit of the fifth embodiment.

FIG. 27 shows the several kinds of data generated in the process by this reproducing circuit in this embodiment.

The reference numeral "1101" denotes data recorded to disk in the format shown in FIG. 16, in which the recording direction matches the row direction. The reference numeral "1102" denotes first code word sequence data which is extracted from the recorded data 1101 and is applied with a first deinterleave, in which the direction of the code word sequence matches the column direction.

The reference numeral "1103" denotes second code word sequence data which is extracted from the recorded data 1101 and is applied with a second deinterleave, in which the direction of the code word sequence matches the column direction.

The reference numeral "1104" denotes synchronization error information is extracted from the recorded data 1101. The reference numeral "1105" denotes data error location information 1105 with the sequence of the second code word sequence, which is acquired from the error corrected second code word sequence data 1103. The reference numeral "1106" denotes first recording-order arranged erasure pointers, which are generated from the second code word sequence data error location information 1105 and synchronization error information 1104.

Operation of this data reproducing circuit is described next.

Figure 26:
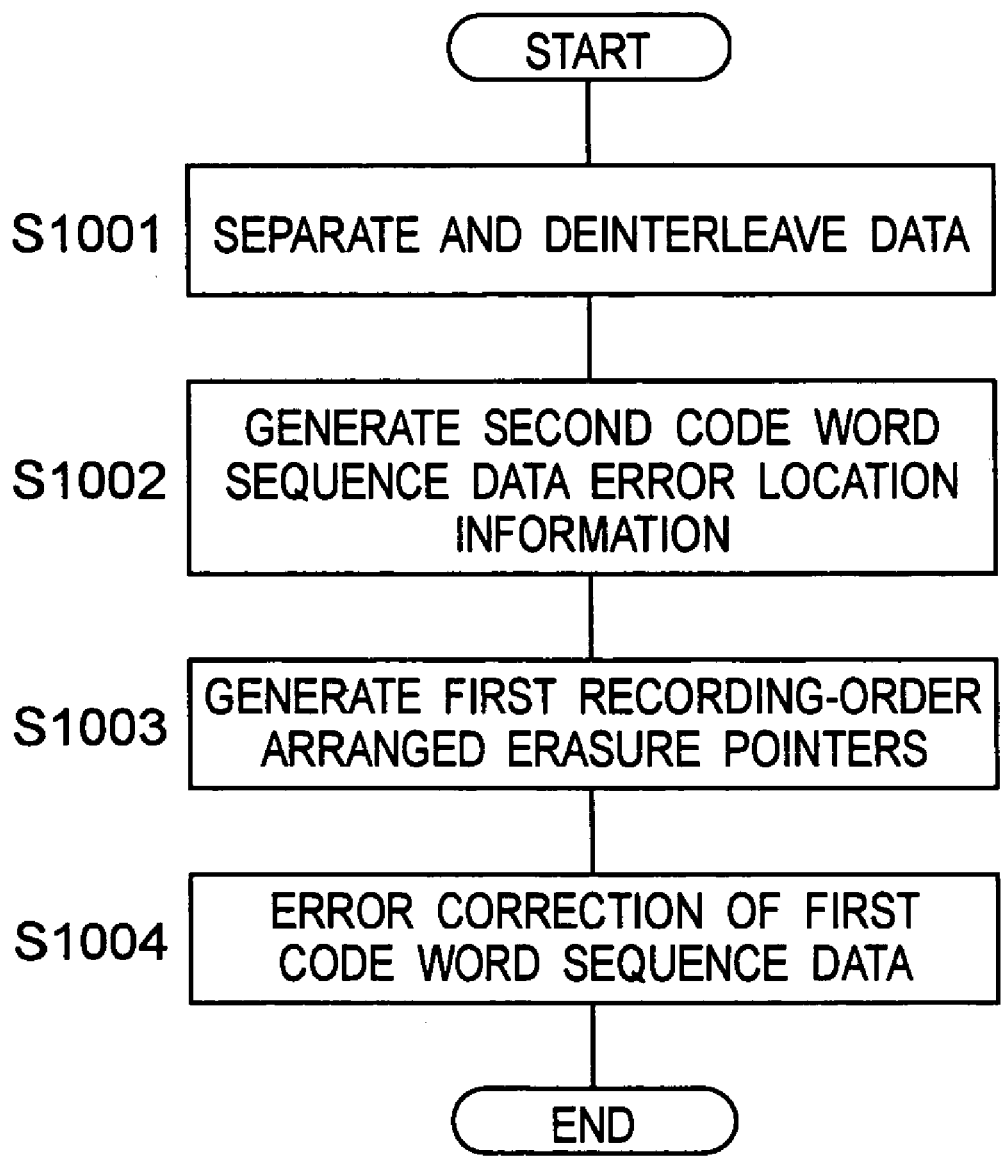
FIG. 26 is a flow chart of the reproduction operation of the data reproducing circuit according to the fifth embodiment.

FIG. 26 is a flow chart of the reproduction process run by the data reproducing circuit of this embodiment. The similarly named processing units shown in FIG. 25 perform the steps shown in FIG. 26.

Specifically, the data separator/deinterleaver 3601, while separating the recorded data 1101, generates first code word sequence data 1102 with a first deinterleave, generates the second code word sequence data 1103 by a second deinterleave, and extracts the synchronization error information 1104 from the recorded data 1101 (S1001).

The second code word sequence data error location information generator 3602 performs error-correcting to a second code word sequence data 1103, and generates second code word sequence data error location information 1105 in the order of the second code word sequence data 1103 (S1002).

The first recording-order arranged erasure pointer generator 3603 applies a second deinterleave to the second code word sequence data error location information 1105, continuously evaluates the synchronization error information 1104 and second-deinterleaved second code word sequence data error location information 1105, and generates first recording-order arranged erasure pointers 1106 in the order of the first recording-order arranged data (S1003).

The first code word sequence data error-correcting unit 3604 uses, while applying a second deinterleave, the first recording-order arranged erasure pointers 1106 to correct erasure of the first code word sequence data 1102 (S1004).

The data reproduction method of this embodiment thus achieves high reliability data reproduction with fewer process steps by generating erasure pointers to the first error-correcting code from synchronization error information and error location information for the second error-correcting code, those having a different data sequence, and correcting of erasure of the first error-correcting code having a low error-correcting capability.

Embodiment 6

This embodiment of the invention describes another data reproducing circuit for reproducing data from an optical disk recorded with the recording format shown in FIG. 15 to FIG. 18.

Figure 28:
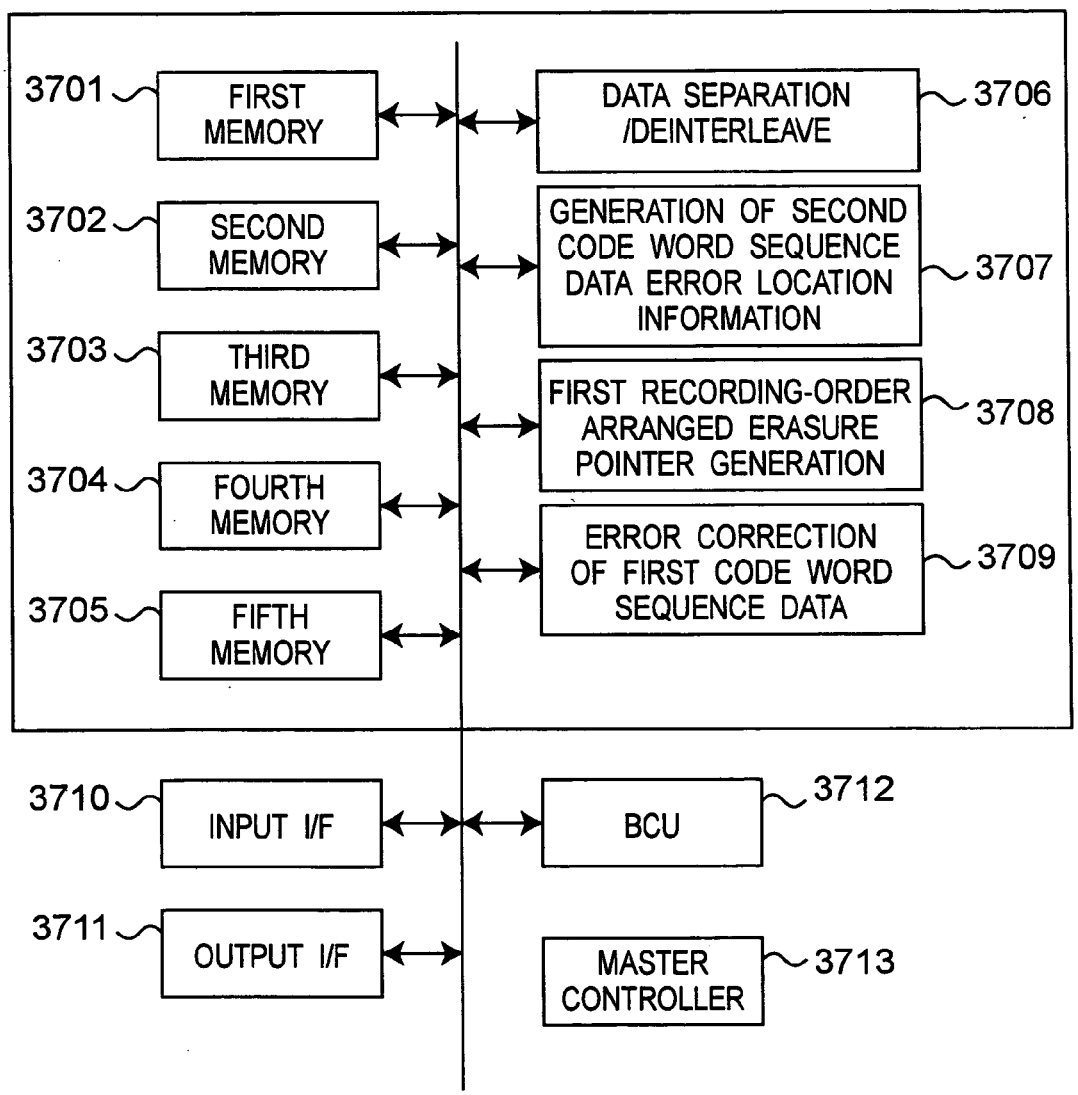
FIG. 28 is a block diagram of a data reproducing circuit according to a sixth embodiment of the invention.

FIG. 28 is a block diagram of this data reproducing circuit.

This data reproducing circuit has first to fifth memories 3701 to 3705, input interface 3710, output interface 3711, master controller 3712, bus controller 3713, and other processing units 3706 to 3709 as described below.

The data separator/deinterleaver 3706 splits the recorded data read from the disk into synchronization codes, first recording-order arranged data, and second recording-order arranged data. It then extracts and writes the synchronization error information from the synchronization codes to the first memory, generates first code word sequence data by a first deinterleave applied to the first recording-order arranged data to write it to the second memory, and generates second code word sequence data by a second deinterleave applied to the second recording-order arranged data to write it to the third memory.

The second code word sequence data error location information generator 3707 performs error-correcting to the second code word sequence data and writes error location information in the order of the second code word sequence data to the fourth memory.

The first recording-order arranged erasure pointer generator 3708 generates erasure pointers corresponding to the order of the first recording-order arranged data from the error location information with the sequence of the second code word sequence data and the synchronization error location information, and writes the erasure pointers to the fifth memory.

The first code word sequence data error-correcting unit 3709 uses, while deinterleaving, the first recording-order arranged erasure pointers to correct erasure of the first code word sequence data.

Figure 29:
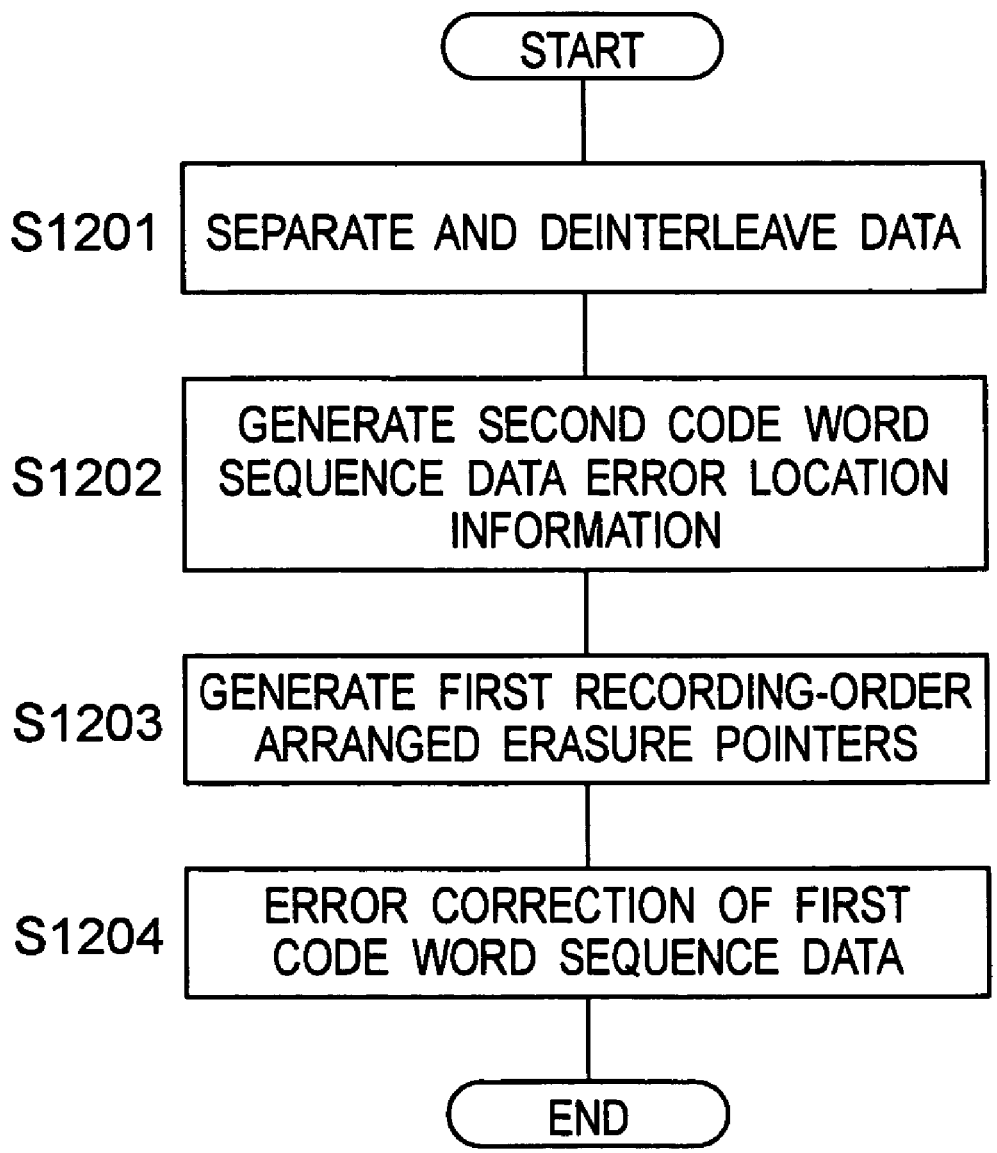
FIG. 29 is a flow chart of the reproduction operation of the data reproducing circuit according to the sixth embodiment.

FIG. 29 is a flow chart of the data reproduction method for reproducing data recorded according to the recording format described above.

It should be noted that the data formats handled by the data reproducing circuit in this embodiment of the invention are the same as shown in FIG. 27 and described in the sixth embodiment above.

FIG. 29 is a flow chart of the reproduction process run by the data reproducing circuit of this embodiment. The similarly named processing units shown in FIG. 28 perform the steps shown in FIG. 29.

The data separator/deinterleaver 3706 extracts the synchronization error information from the recorded data 1101 and writes it to the first memory 3701, extracts the first code word sequence data 1102 from the recorded data 1101 and writes to second memory 3702 with the first deinterleave, and extracts the second code word sequence data 1103 from the recorded data 1101 and writes to the third memory 3703 with the second deinterleave (S1201).

The second code word sequence data error location information generator 3707 reads the second code word sequence data 1103 from the third memory 3703 to error-correct it, and writes second code word sequence data error location information 1105 in the order of the second code word sequence data 1103 to the fourth memory 3704 (S1202).

The first recording-order arranged erasure pointer generator 3708 reads data error location information 1105 with the sequence of the second code word sequence from the fourth memory 3704 while applying the second deinterleave, continuously evaluates the error location information 1105 and the synchronization error information 1104, and writes the first recording-order arranged erasure pointers 1106 in the order of the first recording-order arranged data to the fifth memory 3705 (S1203).

The first code word sequence data error-correcting unit 3709 reads the first recording-order arranged erasure pointers 1106 from the fifth memory 3705 while applying the second deinterleave, and performs error-correcting to erasure of the first code word sequence data 1102 using these erasure pointers (S1204).

The data reproduction method of this embodiment thus achieves high reliability data reproduction with fewer process steps by generating erasure pointers to the first error-correcting code from synchronization error information and error location information for the second error-correcting code, these information having different sequence, and correcting erasure of the first error-correcting code having a low error-correcting capability.

It should be noted that second memory 3702 and third memory 3703 can be in different areas in the same buffer memory. More specifically, the first code word sequence data 1102 and second code word sequence data 1103 can be written to specifically defined areas in buffer memory.

Figure 30:
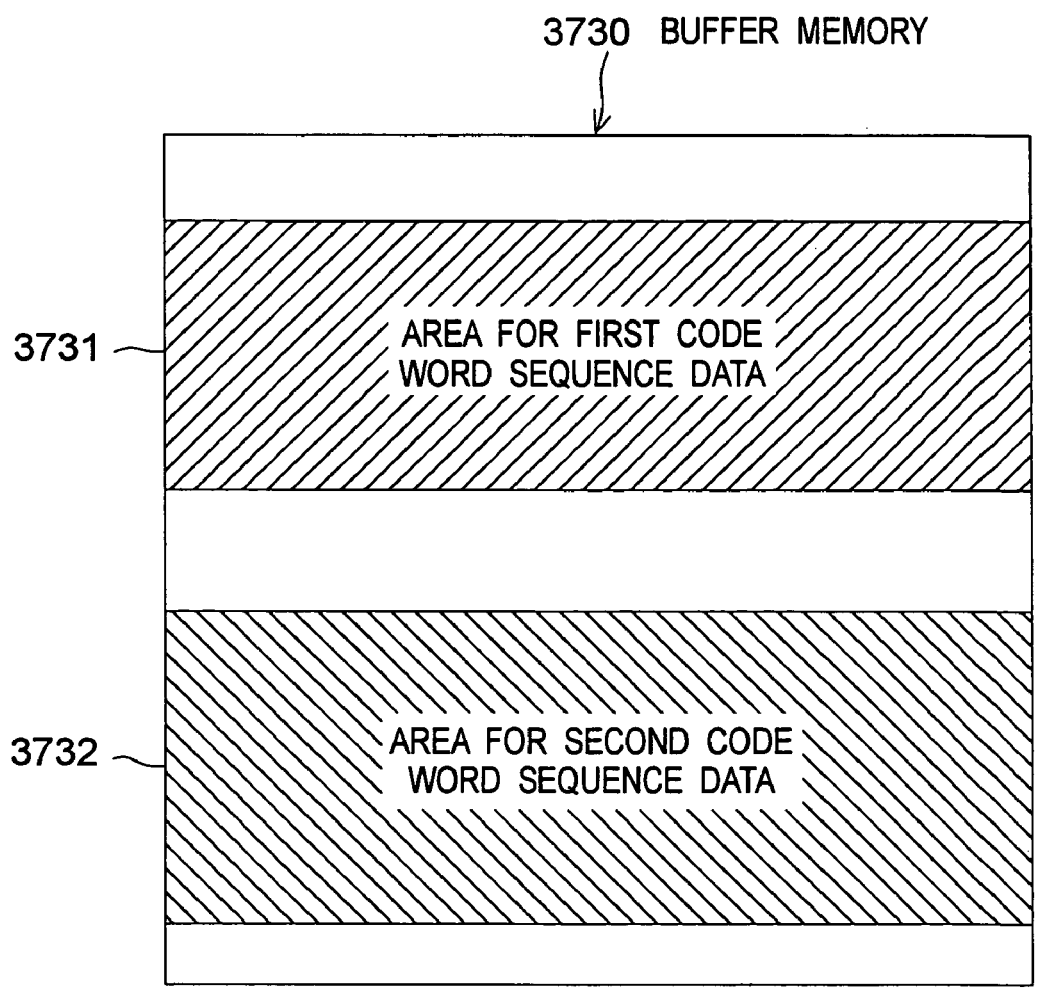
FIG. 30 illustrates providing areas corresponding to the second memory and third memory in the same buffer memory in the sixth embodiment of the invention.

FIG. 30 shows a buffer memory with second and third memory areas corresponding to the above second and third memories. This buffer memory 3730 is DRAM or SRAM, for example, having an area 3731 for storing first code word sequence data 1102, and an area 3732 for storing second code word sequence data 1103.

Figure 31:
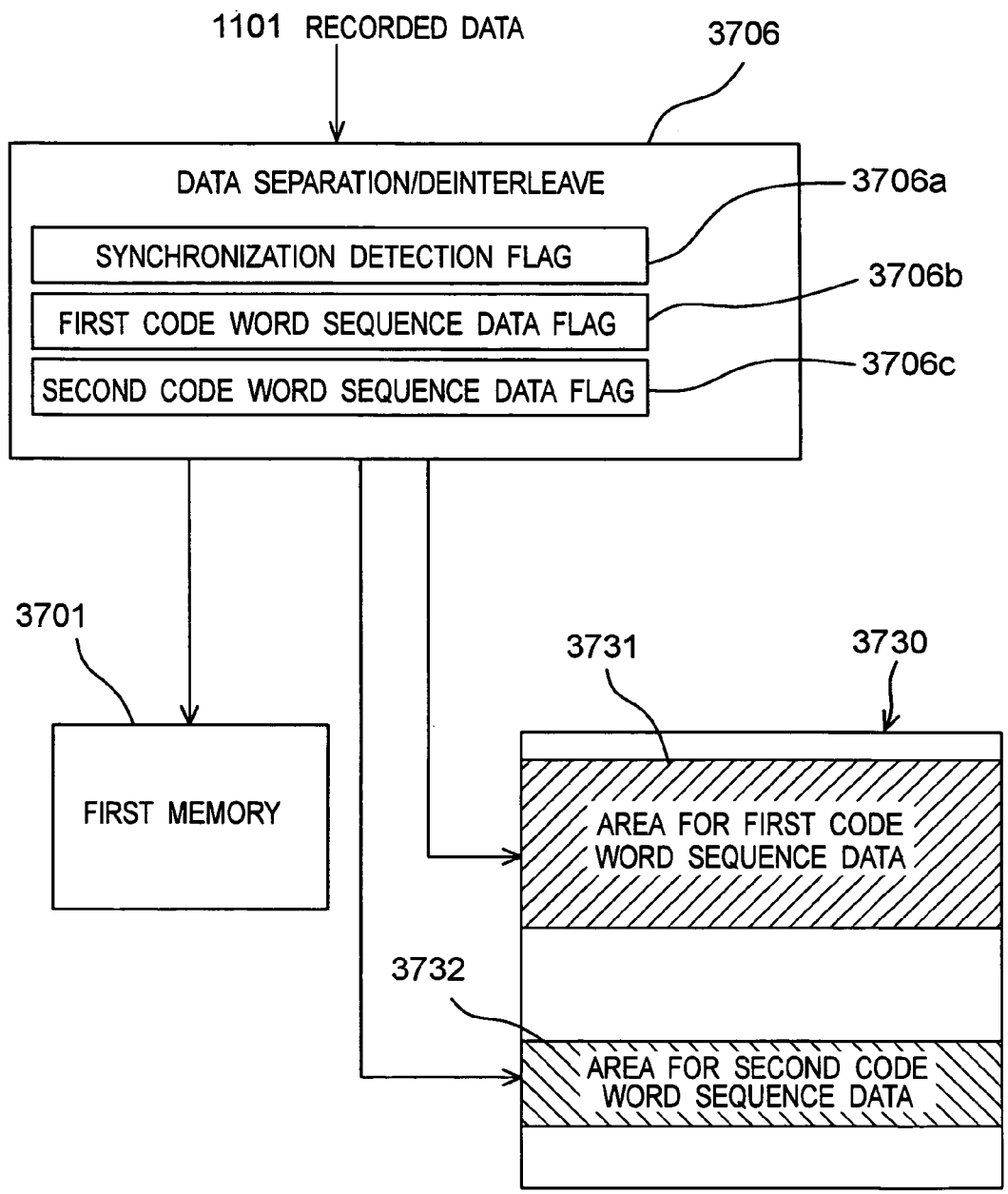
FIG. 31 describes setting flags corresponding to the synchronization detection information, first code word sequence data, and second code word sequence data in the data separating and deinterleaving unit in the sixth embodiment of the invention.

As shown in FIG. 31, data separator/deinterleaver 3706 could also set flags 3706a, 3706b, and 3706c for synchronization error information 1104, first code word sequence data 1102, and second code word sequence data 1103, respectively. Based on whether these flags 3706a, 3706b, and 3706c are on or off, writing the recorded data could be directed to first memory 3701, first code word sequence data area 3731 in buffer memory 3730, or second code word sequence data area 3732 in buffer memory 3730. These flags 3706a, 3706b, and 3706c are set on or off according to the order of the recorded data 1101.

If the synchronization detection flag 3706a is on, the data separator/deinterleaver 3706 extracts the synchronization error information 1104 from the recorded data 1101 and writes it to the first memory 3701. If the first code word sequence data flag 3706b is on, the data separator/deinterleaver 3706 applies the first deinterleave to the recorded data 1101 and writes it to the first code word sequence data area 3731 in the buffer memory 3730. If the second code word sequence data flag 3706c is on, the data separator/deinterleaver 3706 applies a second deinterleave to the recorded data 1101 and writes it to the second code word sequence data area 3732 in the buffer memory 3730.

One bit could also be allocated to a code word sequence unit in the format of the data error location information 1105 with the sequence of the second code word sequence. That is, one bit can be allocated to one byte of the second code word sequence data 1103.

Figure 32:
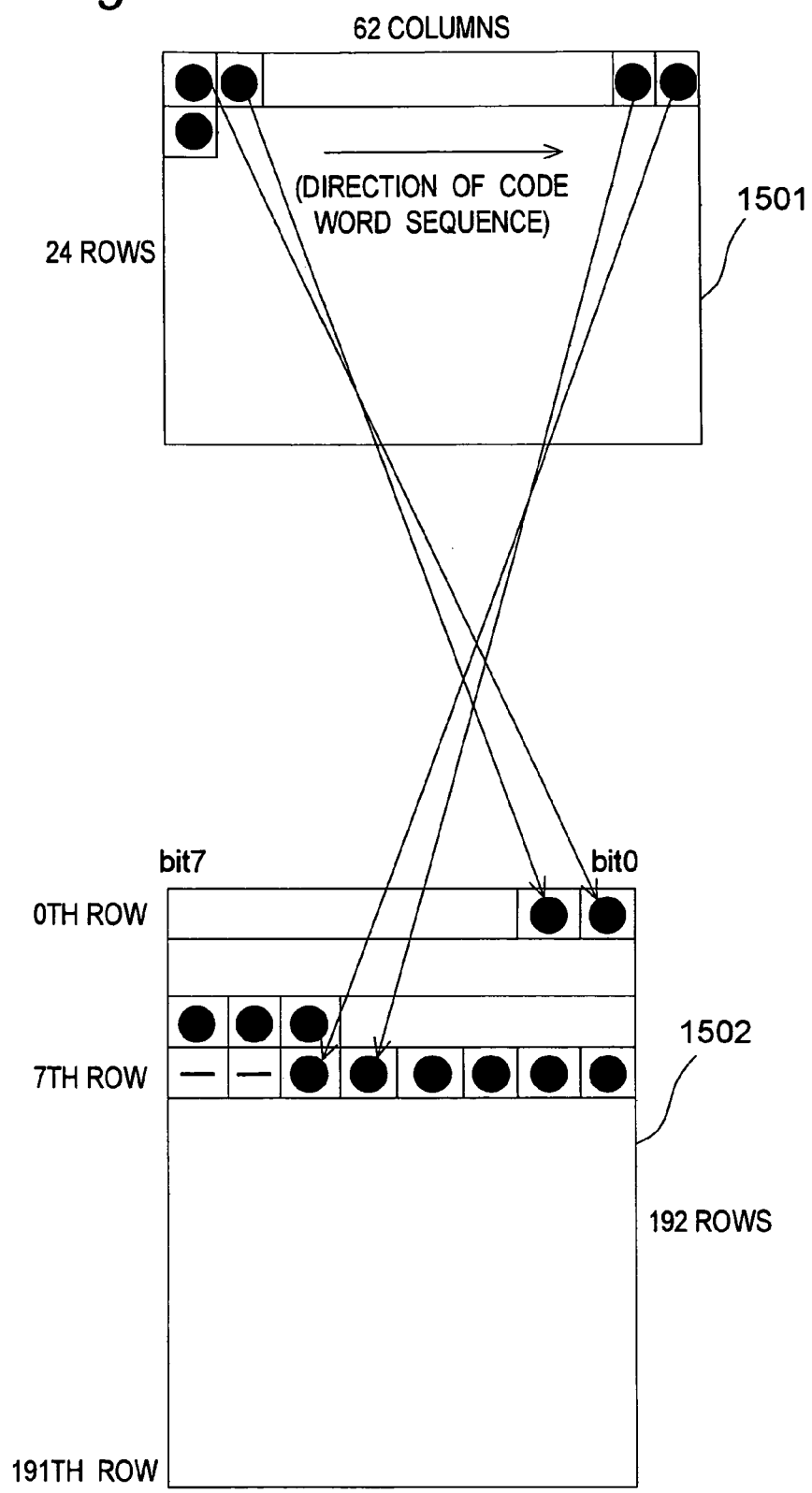
FIG. 32 shows a format of data error location information arranged in the order of the second code word sequence.

FIG. 32 shows a format in which one bit in the data error location information 1105 is allocated to each byte of the second code word sequence data. The second code word sequence data 1501 is arranged in the row direction. The second code word sequence data error location information 1502 contains 192 rows of one byte each. One byte of the second code word sequence data 1501 is sequentially assigned to one bit of the second code word sequence data error location information 1502.

Based on the results of error-correcting the second code word sequence data 1501, the second code word sequence data error location information generator 3707 generates one bit of error information for each byte of second code word sequence data 1501. Error information for the code word sequence in the most-significant row of the second code word sequence data 1501 is stored sequentially from the left end of the code word sequence from row 0, bit 0 to row 7 bit 5 of the second code word sequence data error location information 1502. Bits 6 and 7 in row 7 are empty, and row 0 to row 7 are data error location information with the sequence of the second code word sequence corresponding to the code word sequence in the most-significant row of the second code word sequence data 1501. This format continues through the following rows. In other words, the second code word sequence data error location information 1502 is managed so that one code word sequence in the second code word sequence data 1501 corresponds to m-bytes (where m is a natural number) of the error location information 1502 with the sequence of the second code word sequence.

The format of the synchronization error information 1104 could also map the synchronization error information 1104 to one byte of data which is arranged in the order of the recorded data.

Figures 33A, 33B:
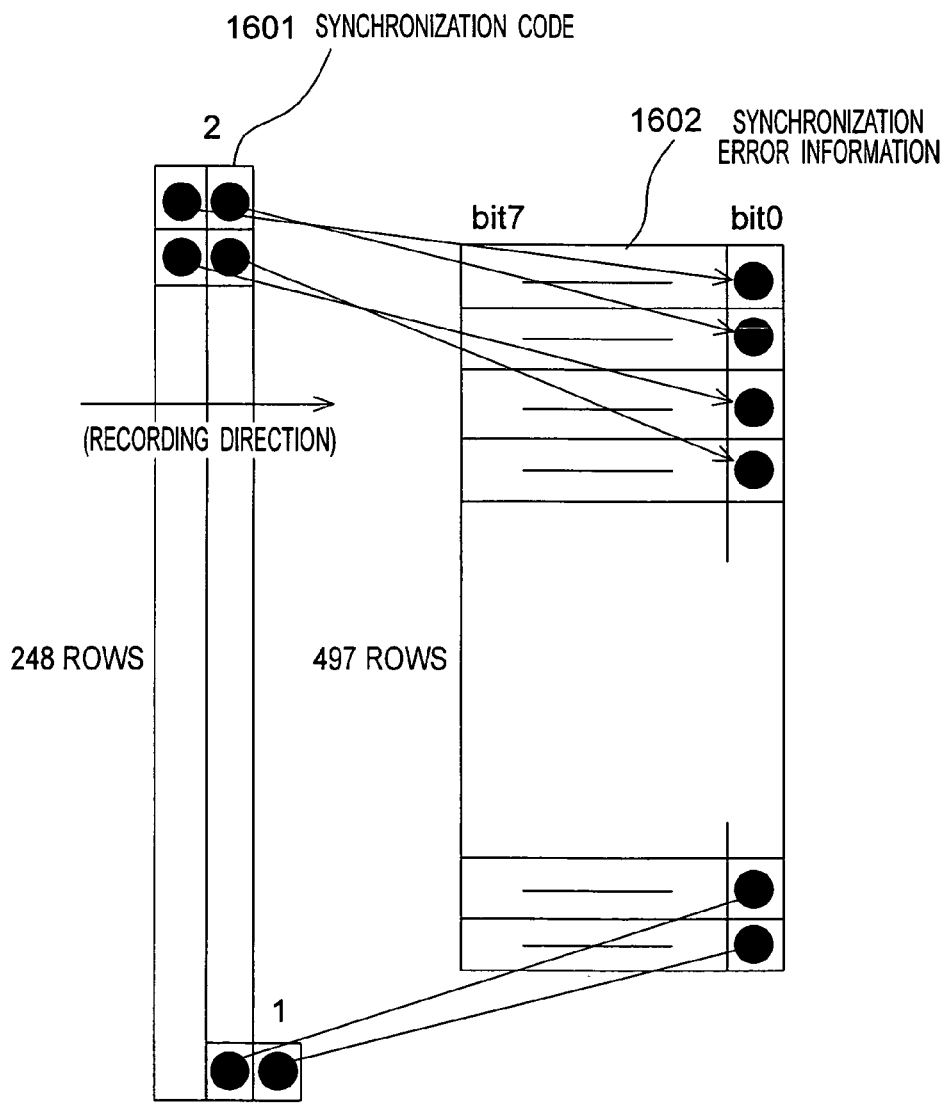
FIG. 33A describes a method for generating synchronization error information from the synchronization code.
FIG. 33B shows an example of synchronization error information mapping.

FIG. 33A describes generating the synchronization error information from the synchronization code, and FIG. 33B describes mapping the synchronization error information.

FIG. 33A shows the correlation between synchronization codes in the recorded data on optical disk, and the synchronization error information for the synchronization code. In this example, for synchronization code 1 for which a value is expected to "100001010", the value "100001010" was detected in the recorded data after reproduction. In this case the synchronization error information is set to "0" (no error) because the expected value and detected value are the same. The value "100001010" is also expected for synchronization code 2, but the value detected after data reproduction is "101101010". The expected and detected values thus do not match, and the synchronization error bit is set to "1" (error). The synchronization error bits are thus set to "0" if the expected and detected values match, and "1" if they do not match.

FIG. 33B shows one arrangement of the synchronization error information. The reference numeral "1601" denotes synchronization code which is recorded in the row direction. The reference numeral "1602" denotes synchronization error information. One byte of synchronization error information 1602 is allocated for one piece of data of the synchronization code 1601. The synchronization error information 1602 is arranged from top to bottom in the recording sequence of the synchronization code 1601.

In the format of the first recording-order arranged erasure pointers 1106, one erasure pointer can be mapped to one byte of data and arranged in the order of the first recording-order arranged data.

FIG. 34 shows an example in which one first recording-order arranged erasure pointer 1106 is composed of one byte and a pointer is stored only to the least-significant bit (bit 0). The numeral reference "1701" denotes data arranged with the format of the first recording-order arranged erasure pointer format in which one erasure pointer is mapped to one byte of data and arranged in the order of the first recording-order arranged data. The arrows in FIG. 34 denote the correlation between pointers.

Figure 35:
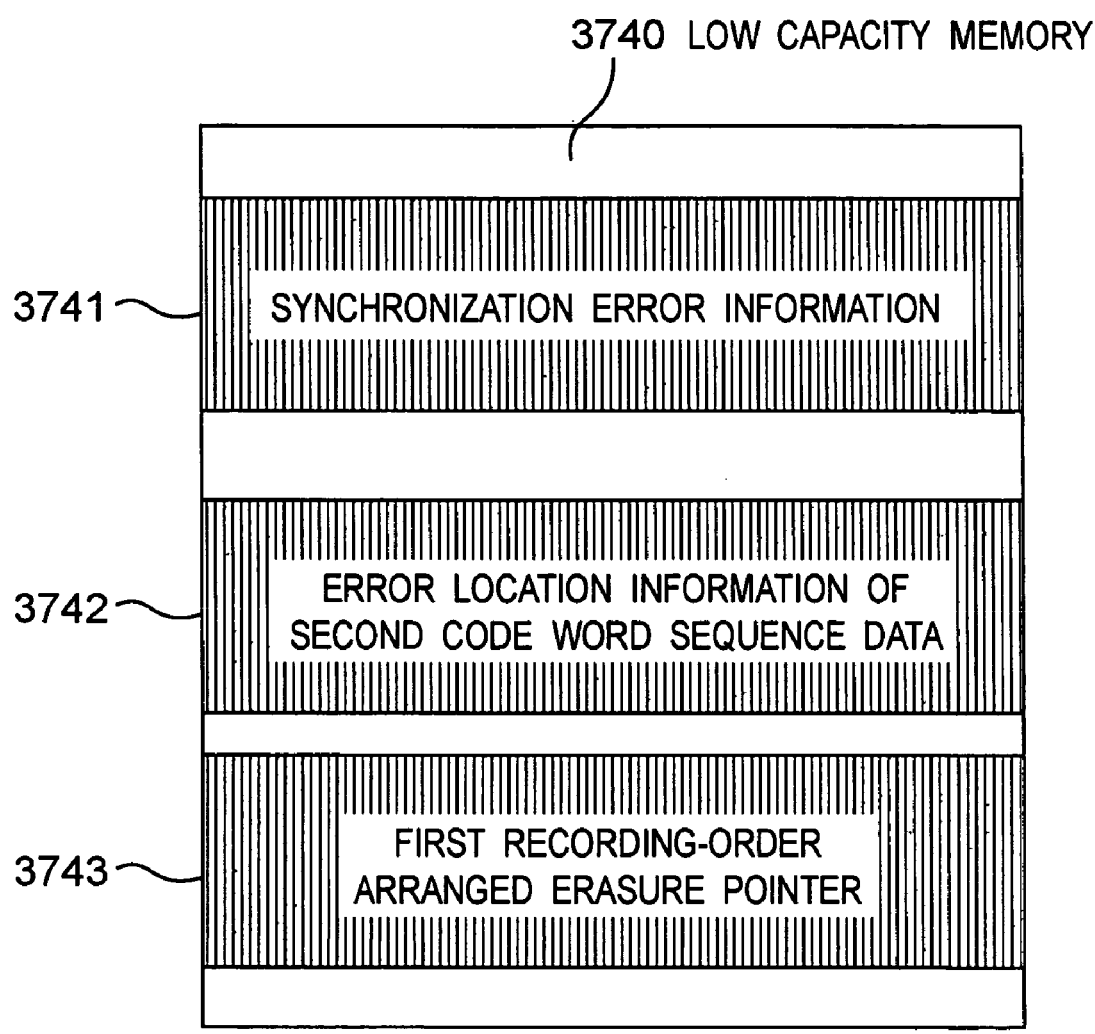
FIG. 35 shows an example of data areas allocated in one small capacity memory.

As shown in FIG. 35, the first memory 3701, the fourth memory 3704, and the fifth memory 3705 can also be allocated to areas in one low capacity memory. The low capacity memory 3740 allocates an area 3741 for storing the synchronization error information 1104, an area 3742 for storing the second code word sequence data error location information 1105, and an area 3743 for storing the first recording-order arranged erasure pointers 1701.

Figure 36:
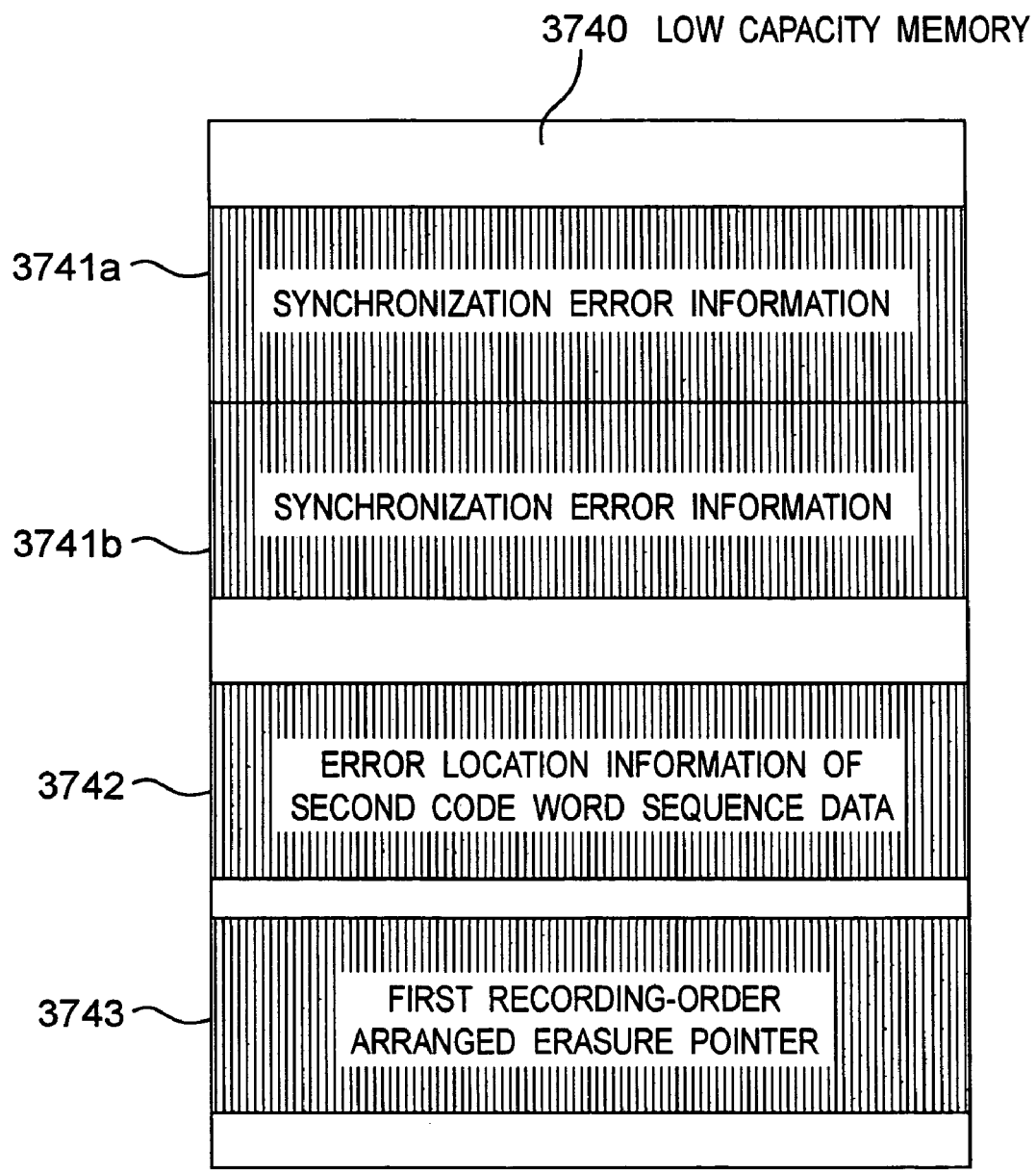
FIG. 36 shows an example of data areas allocated in one small capacity memory.

As shown in FIG. 36, there could also be two areas 3741a and 3741b for storing the synchronization error information 1104, one 3742 for storing the second code word sequence data error location information 1105, and one 3743 for storing the first recording-order arranged erasure pointers 1701.

Embodiment 7

This embodiment of the invention describes another data reproducing circuit for reproducing data from an optical disk recorded with the recording format shown in FIG. 15 to FIG. 18.

Figure 37:
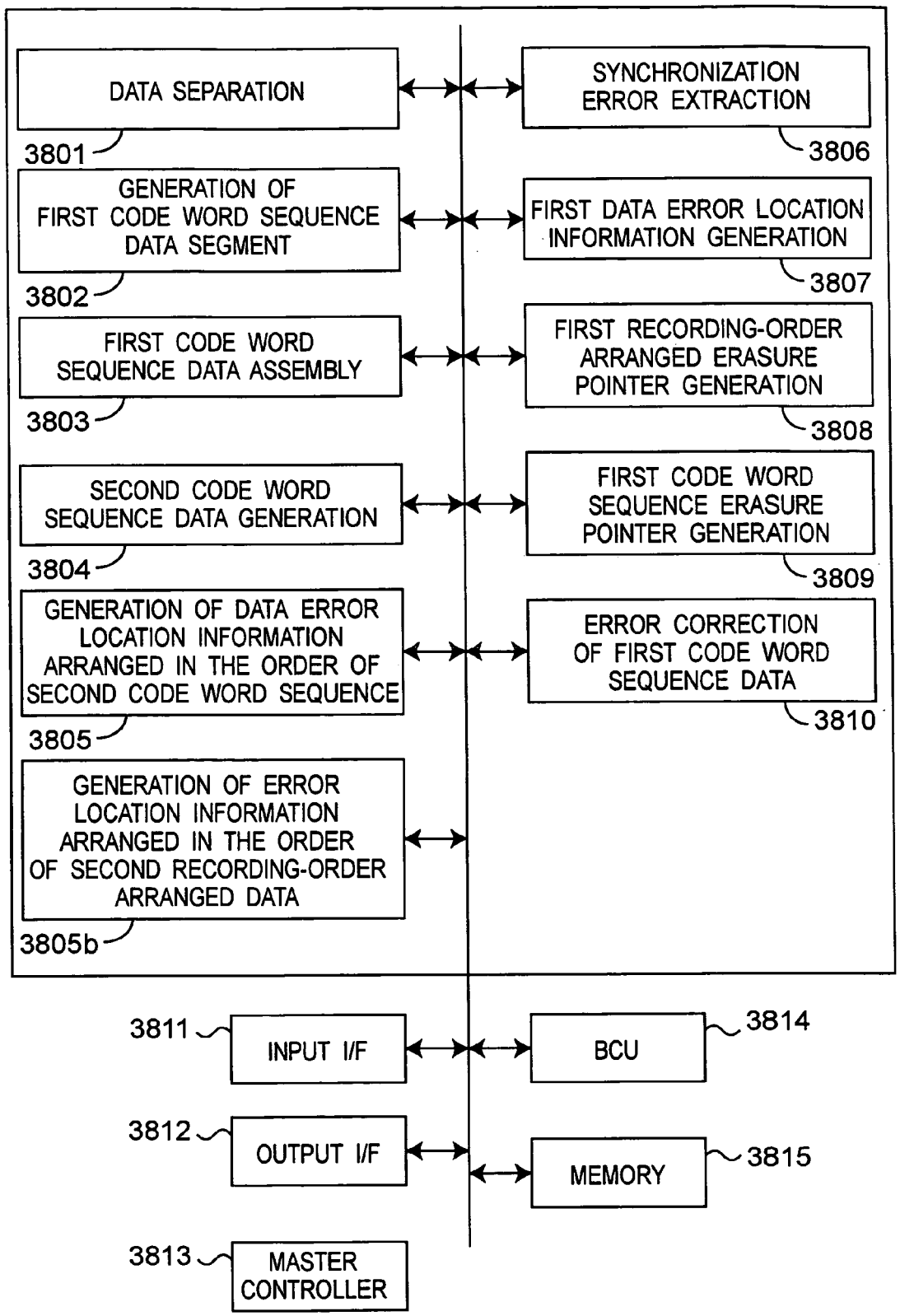
FIG. 37 is a block diagram of a data reproducing circuit according to a seventh embodiment of the invention.

FIG. 37 is a block diagram of this data reproducing circuit.

This data reproducing circuit has input interface 3811, output interface 3812, master controller 3813, bus controller 3814, memory 3815, and processing units 3801 to 3810 as described below.

Figure 38:
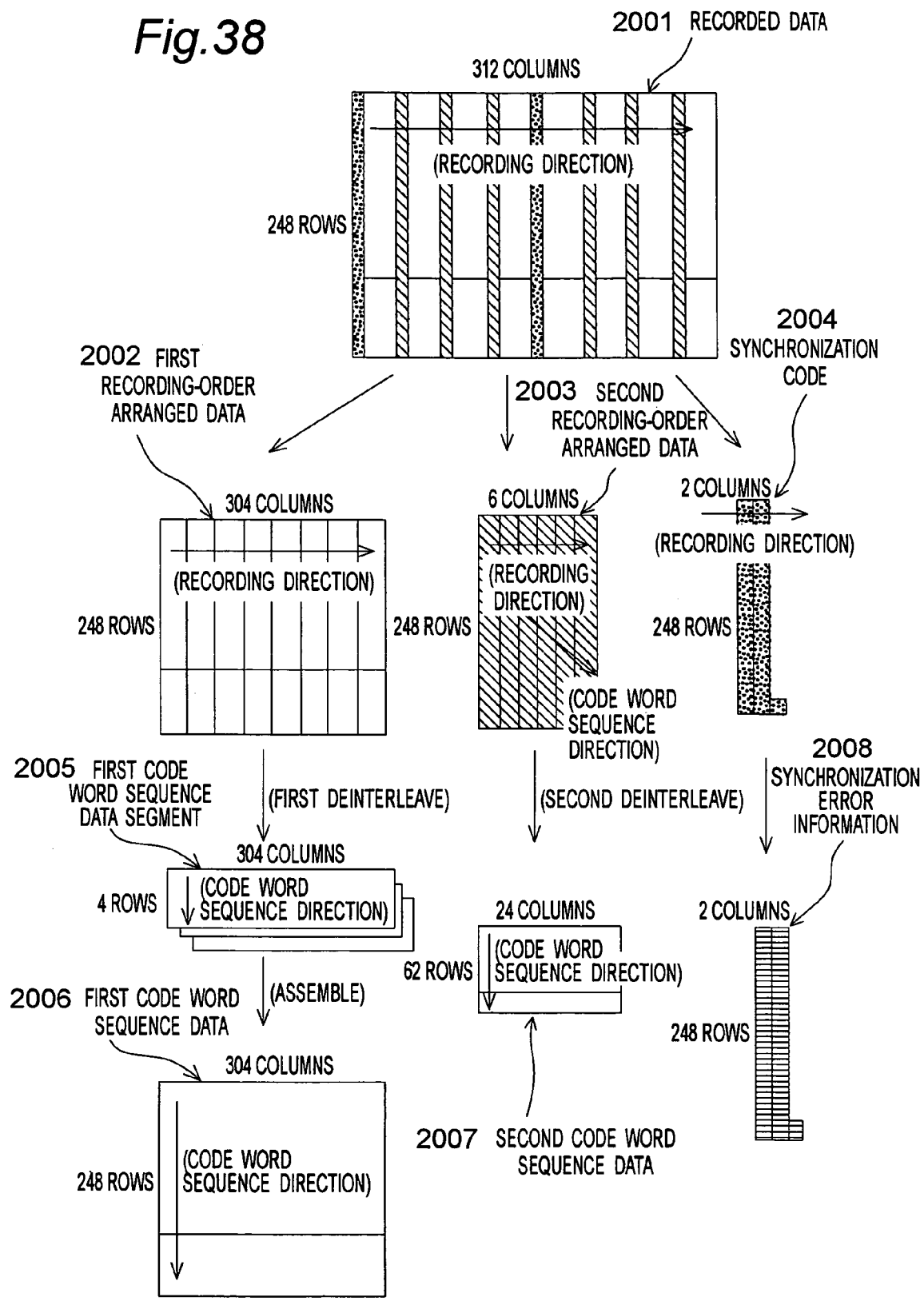
FIG. 38 describes the data formats generated in the reproduction operation of a data reproducing circuit according to the seventh embodiment.
Figure 39:
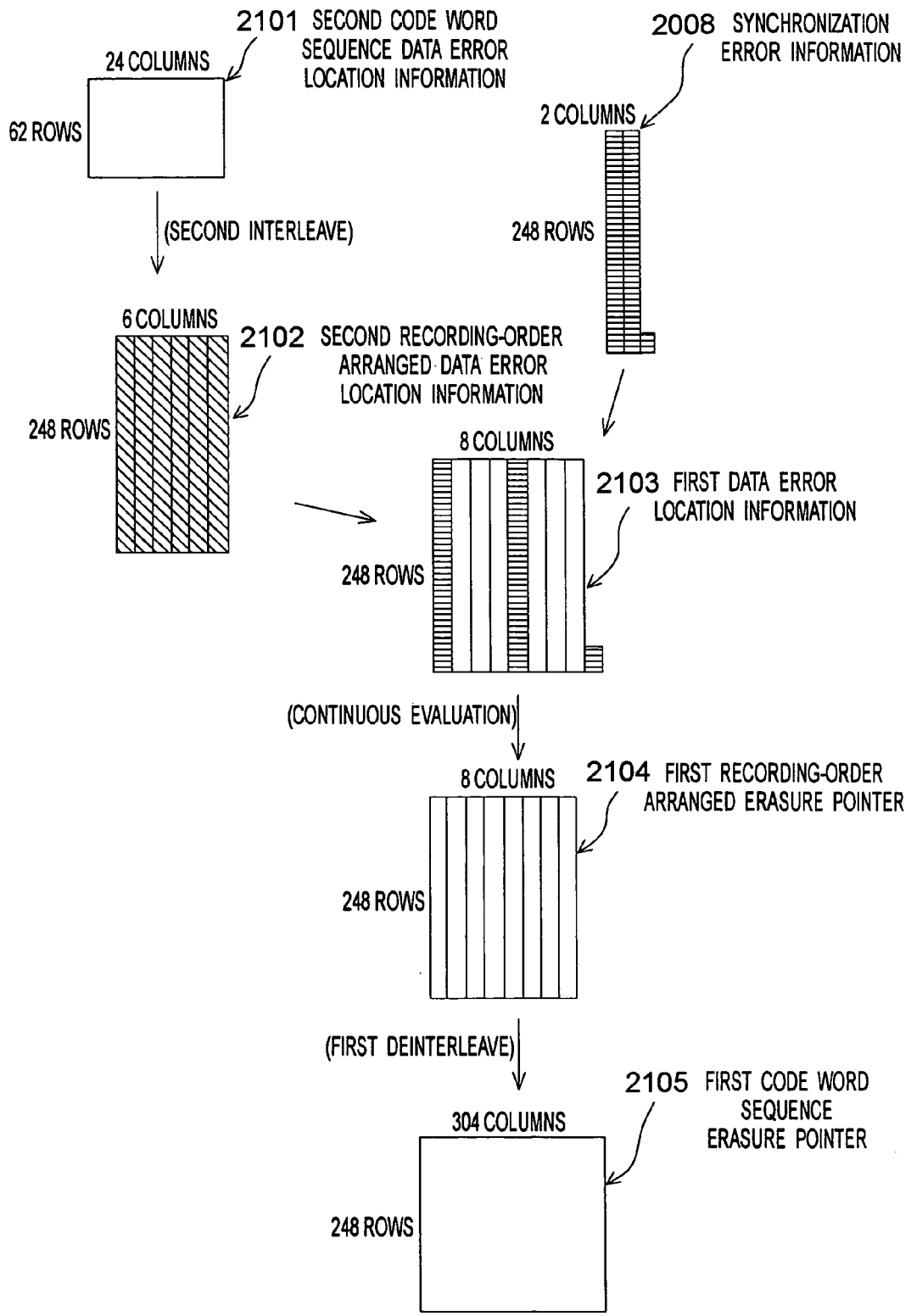
FIG. 39 is a continuation of the data format description in FIG. 38.

FIG. 38 and FIG. 39 show the data formats processed by the data reproducing circuit of this embodiment.

Referring to FIG. 38, the reference numeral "2001" denotes data recorded to the disk in the format shown in FIG. 16, in which the recording direction matches the row direction.

The reference numeral "2002" denotes first recording-order arranged data which is extracted from the recorded data 2001 and is recorded by row.

The reference numeral "2003" denotes second recording-order arranged data which is likewise extracted from the recorded data and is recorded by row.

The reference numeral "2004" denotes synchronization code which is likewise extracted from the recorded data 2001 and recorded by row.

The reference numeral "2005" denotes first code word sequence data segment which is generated by dividing the first recording-order arranged data 2002 and applying the first deinterleave to it. The codes are arranged in the column direction.

The reference numeral "2006" denotes first code word sequence data which is generated by assembling the first code word sequence data segments 2005 with the codes arranged in the column direction.

The reference numeral "2007" denotes second code word sequence data results from a second deinterleave of the second recording-order arranged data 2003 with the codes arranged in the column direction.

The reference numeral "2008" denotes synchronization error information which is extracted from the synchronization code 2004.

Referring to FIG. 39, the reference numeral "2101" denotes data error location information with the sequence of the second code word sequence, which is acquired by error-correcting of the second code word sequence data 2007. The reference numeral "2102" denotes the second recording-order arranged data error location information which is acquired by interleaving the error location information 2101 in the order of the second code word sequence data 2007.

The reference numeral "2103" denotes first data error location information which is acquired by merging the second recording-order arranged data error location information 2102 and synchronization error information 2008 in the order of the recorded data.

The reference numeral "2104" denotes first recording-order arranged erasure pointers 2104 which are produced by continuous evaluation of the first data error location information 2103 as further described below.

The reference numeral "2105" denotes first code word sequence erasure pointers which are acquired by a first deinterleave of the first recording-order arranged erasure pointers 2104.

The data reproduction operation of this data reproducing circuit is described next.

Data separator 3801 separates the recorded data 2001 read from the disk into the synchronization code 2004, the first recording-order arranged data 2002, and the second recording-order arranged data 2003.

The first code word sequence data segment generator 3802 splits the first recording-order arranged data 2002 into data segments to which the first deinterleave can be applied, and applies the first deinterleave to each data segment to generate the first code word sequence data segment 2005.

The first code word sequence data assembler 3803 combines multiple first code word sequence data segments 2005 to produce the first code word sequence data 2006. Data segments 2005 are stored to the first memory 11 having a specified small storage capacity as described in the first embodiment, and the individual data segments 2005 are transferred to the second memory 15 as described in the first embodiment where they are reassembled to generate first code word sequence data 2006. It is therefore possible to improve bus access performance as described in the first embodiment by using memory with storage capacity less than required to store one ECC block.

The second code word sequence data generator 3804 applies a second deinterleave to the second recording-order arranged data 2003 to generate the second code word sequence data 2007.

The second code word sequence data error location information generator 3805 performs error-correcting to the second code word sequence data 2007 to generate the second code word sequence data error location information 2101 having the order of the second code word sequence in the order of the second code word sequence data.

The second recording-order arranged data error location information generator 3805b applies a second interleave to the error location information 2101 in the order of the second code word sequence data, and generates the data error location information 2102 having the same order of the second recording-order arranged data.

The synchronization error information extractor 3806 extracts the synchronization error the information 2008 from the synchronization code 2004.

The first data error location information generator 3807 synthesizes the second recording-order arranged data error location information 2102 and the synchronization error information 2008 in the data sequence of the recorded data 2001, and generates the first data error location information 2103.

The first recording-order arranged erasure pointer generator 3808 generates first recording-order arranged erasure pointers 2104 in the order of the first recording-order arranged data from the first data error location information 2103.

The first code word sequence erasure pointer generator 3809 applies a first deinterleave to the first recording-order arranged erasure pointers 2104 and generates the first code word sequence erasure pointers 2105 corresponding to the sequence of the first code word sequence data 2006.

The first code word sequence data error-correcting unit 3810 uses the first code word sequence erasure pointers 2105 for correcting erasure of the first code word sequence data 2006.

Figure 40:
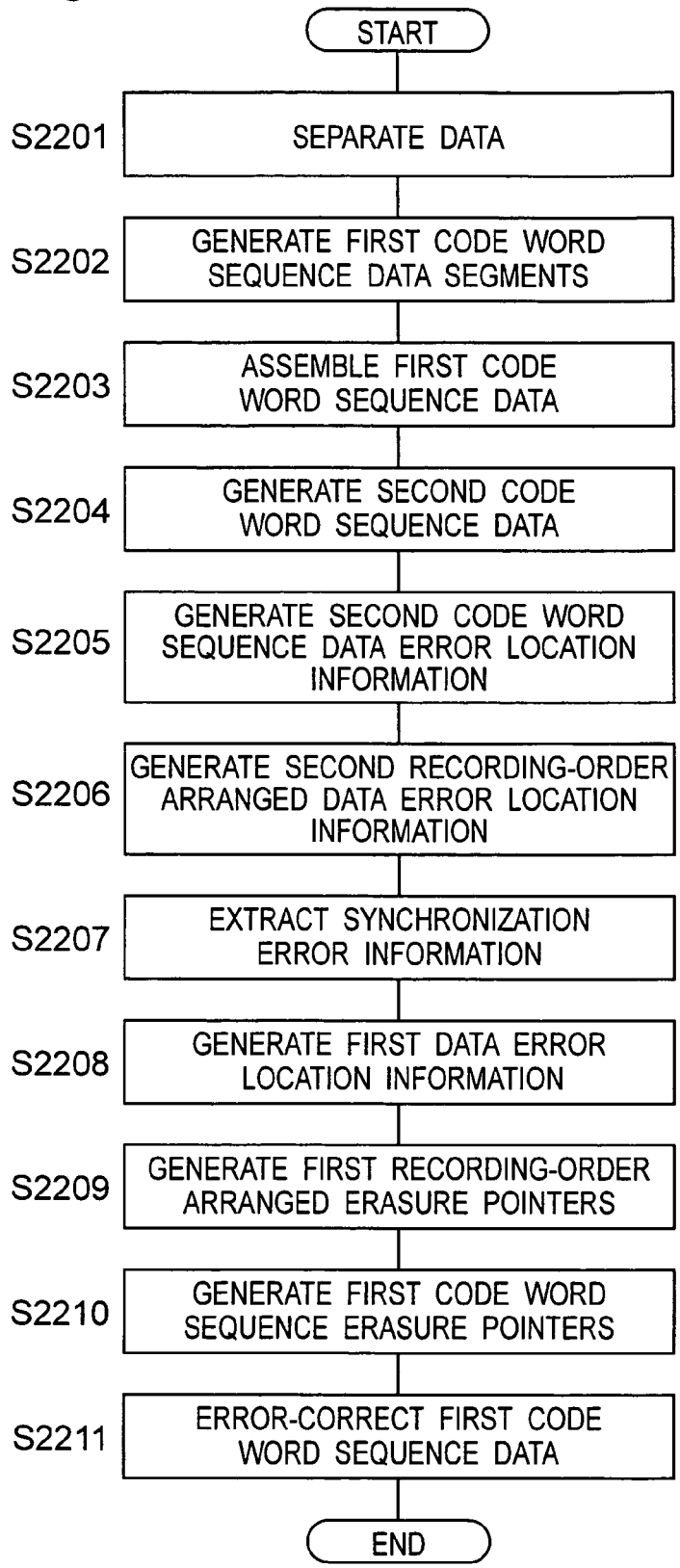
FIG. 40 is a flow chart of the reproduction operation of the data reproducing circuit according to the seventh embodiment of the invention.

FIG. 40 is a flow chart of this reproduction process. Steps S2201 to S2211 correspond to the operations performed by processing units 3801 to 3810 of the reproducing circuit.

The data reproduction method of this embodiment thus achieves high reliability data reproduction by generating erasure pointers to the first error-correcting code from synchronization error information and error location information for the second error-correcting code, those information having different data sequence, and correcting erasure of the first error-correcting code having a low error-correcting capability. Furthermore, by applying the first deinterleave to segments of the first recording-order arranged data, the first deinterleave can be applied without storing all of the first recording-order arranged data.

Embodiment 8

This embodiment of the invention describes another data reproducing circuit for reproducing data from an optical disk recorded with the recording format shown in FIG. 15 to FIG. 18.

Figure 41:
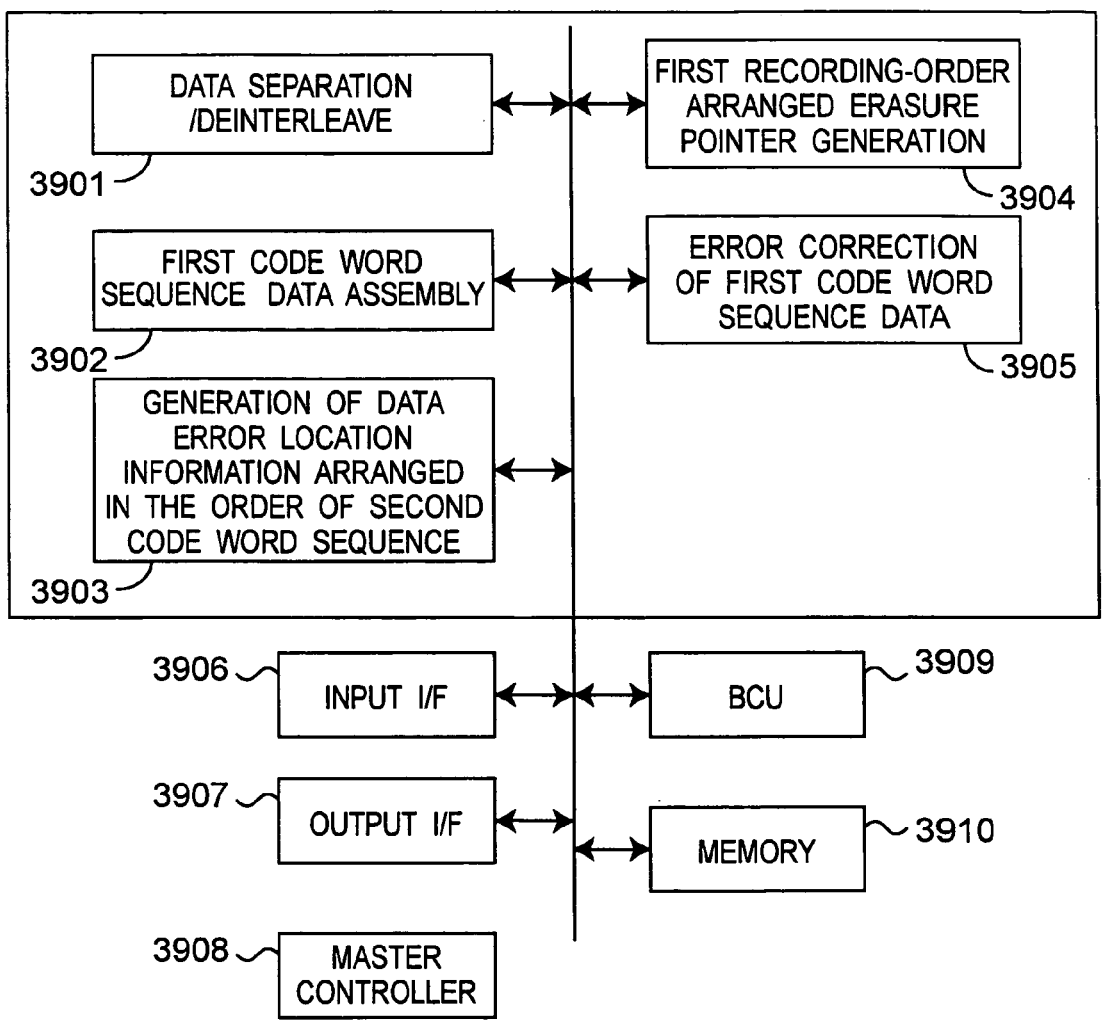
FIG. 41 is a block diagram of a data reproducing circuit according to an eighth embodiment of the invention.

FIG. 41 is a block diagram of this data reproducing circuit. This data reproducing circuit has input interface 3906, output interface 3907, master controller 3908, bus controller 3909, memory 3910, and processing units 3901 to 3905.

Figure 43:
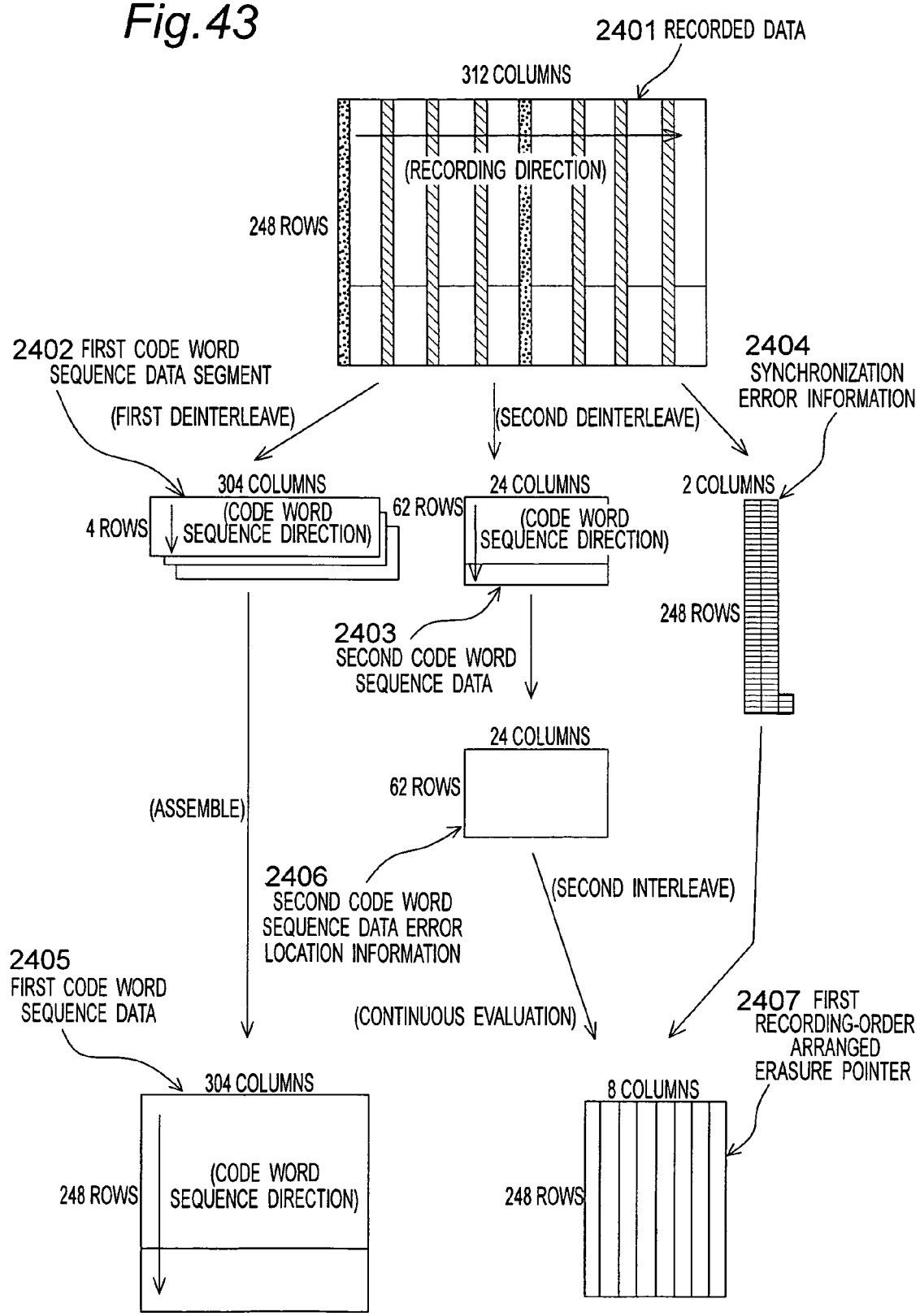
FIG. 43 describes the data formats generated in the reproduction operation of a data reproducing circuit according to the eighth embodiment.

FIG. 43 shows the data formats processed by the data reproducing circuit of this embodiment.

The reference numeral "2401" denotes data which is recorded to the disk according to the data recording format shown in FIG. 16, with the recording direction matching the row direction. The reference numeral "2402" denotes first code word sequence data segment which is separated from the recorded data 2401, segmented, and then interleaved with a first interleave, with codes arranged in the column direction. The reference numeral "2403" denotes second code word sequence data which is extracted from the recorded data 2401 and then applied with a second interleave. The codes are in the column direction. The reference numeral "2404" denotes synchronization error information which is extracted from the recorded data 2401. The reference numeral "2405" denotes first code word sequence data generated by assembling multiple first code word sequence data segments 2402 with the codes arranged in the column direction. The reference numeral "2406" denotes data error location information arranged in the sequence of the second code word sequence, which is acquired from the error corrected second code word sequence data 2403. The reference numeral "2407" denotes first recording-order arranged erasure pointers, which are generated from the data error location information 2406 and the synchronization error information 2404.

The reproduction operation of this reproducing circuit is described next.

The data separator/deinterleaver 3901 generates first code word sequence data segment 2402 by applying a first deinterleave while extracting the data from the recorded data 2401, generates the second code word sequence data 2403 by applying a second deinterleave while extracting the data from the recorded data 2401, and extracts the synchronization error information 2404.

The first code word sequence data assembler 3902 combines multiple first code word sequence data segments 2402 to generate the first code word sequence data 2405. The data segments 2402 are, for example, stored to the first memory 11 with a specified small storage capacity as described in the first embodiment, and the individual data segments 2402 are transferred to the second memory 15 as described in the first embodiment where they are reassembled to generate the first code word sequence data 2405.

The second code word sequence data error location information generator 3903 applies error-correcting to the second code word sequence data 2403 to generate the second code word sequence data error location information 2406 in an order corresponding to the sequence of the second code word sequence data.

The first recording-order arranged erasure pointer generator 3904 applies a second interleave to the error location information 2406, and generates the first recording-order arranged erasure pointers 2407 corresponding to the order of the first recording-order arranged data, from the error location information 2406 applied with a second interleave and the synchronization error information 2404.

The first code word sequence data error-correcting unit 3905 uses the first recording-order arranged erasure pointers 2407 while applying the first deinterleave thereto and correct erasure of the first code word sequence data 2405.

Figure 42:
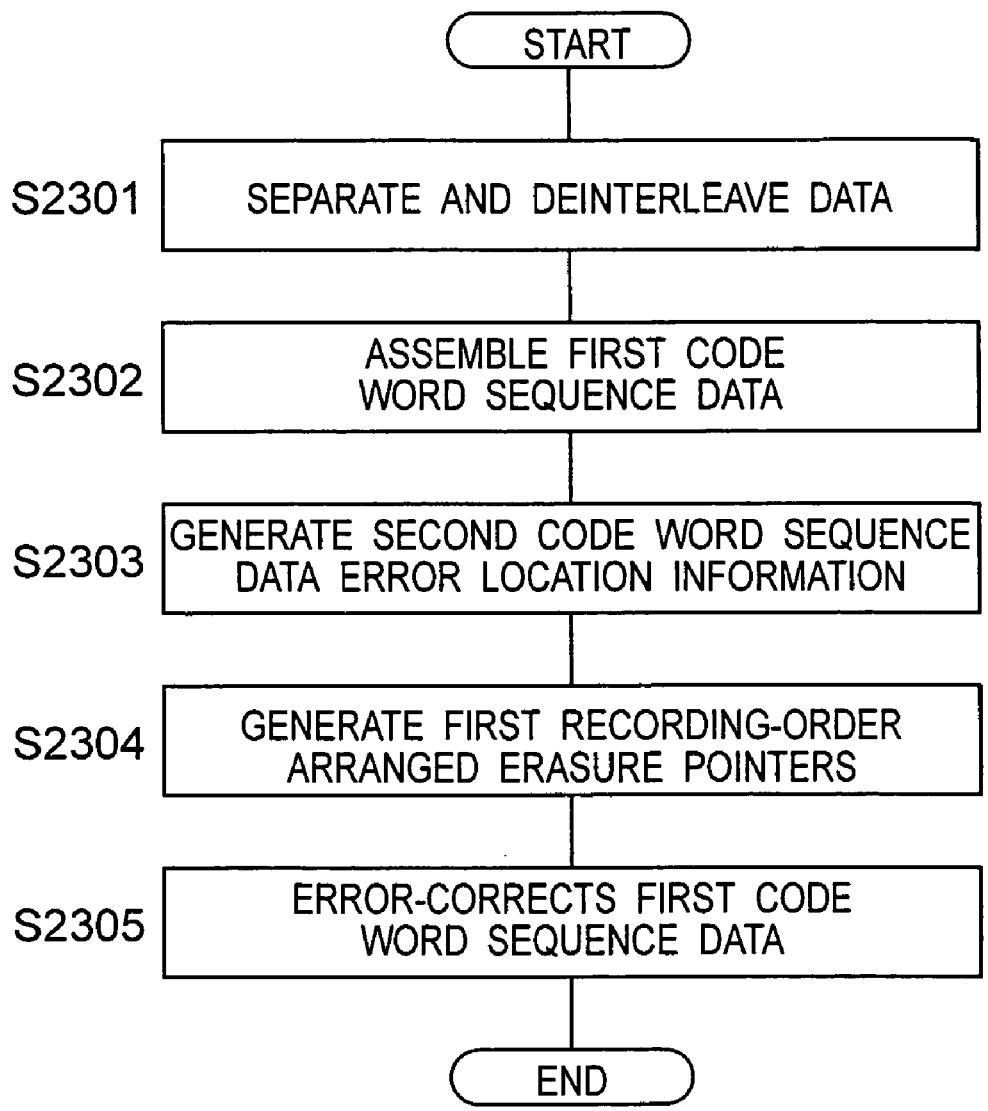
FIG. 42 is a flow chart of the reproduction operation of the data reproducing circuit according to the seventh embodiment of the invention.

FIG. 42 is a flow chart of the reproduction process run by this reproducing circuit. Steps S2301 to S2305 correspond to the operations performed by processing units 3901 to 3905 in the reproducing circuit.

The data reproduction method of this embodiment thus achieves high reliability data reproduction using fewer process steps by generating erasure pointers to the first error-correcting code from synchronization error information and error location information for the second error-correcting code those having different sequence, and correcting erasure of the first error-correcting code having a low error-correcting capability. Furthermore, by applying the first deinterleave to segments of the first recording-order arranged data, the first deinterleave can be applied without storing all of the first recording-order arranged data in the memory.

Embodiment 9

Figure 44:
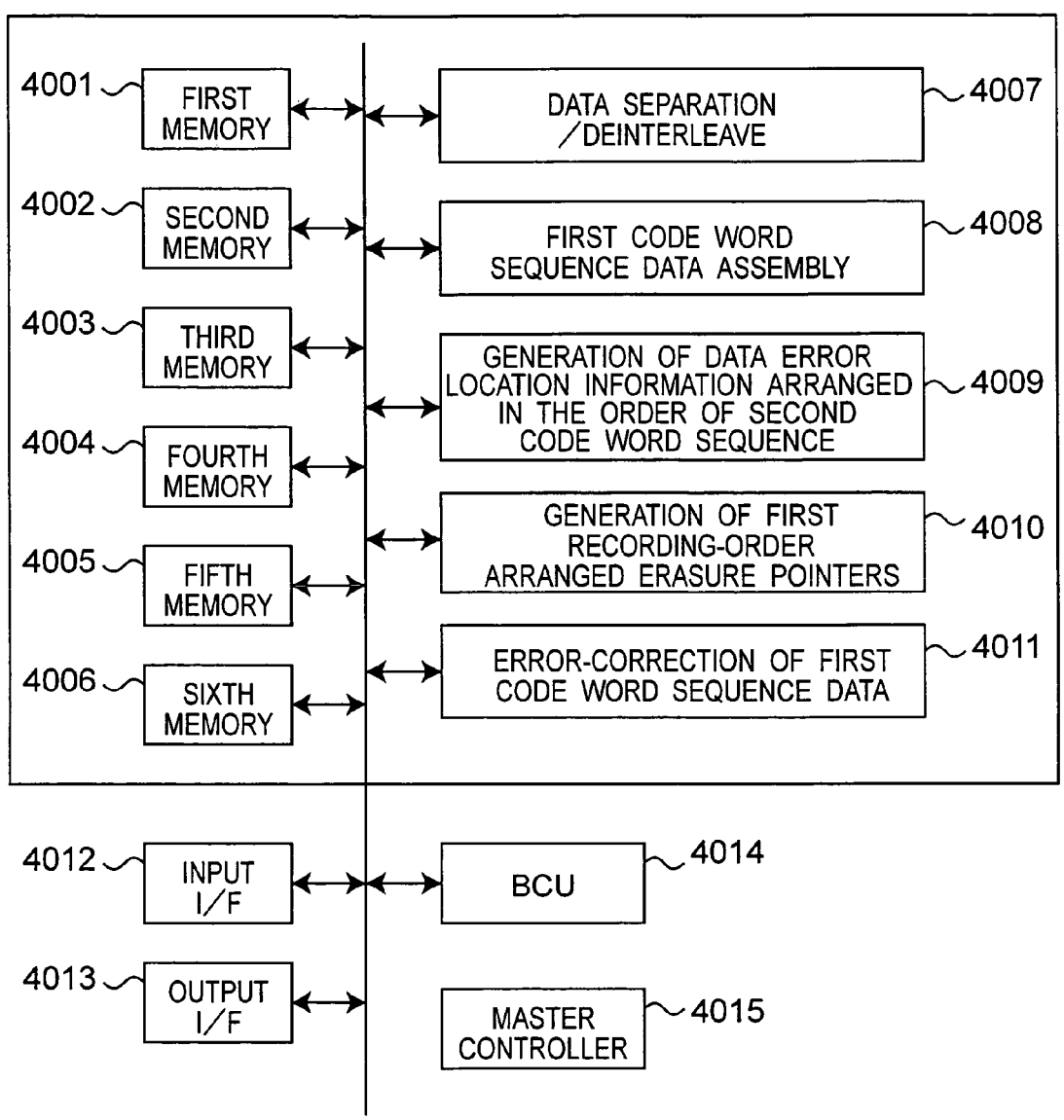
FIG. 44 is a block diagram of a data reproducing circuit according to a ninth embodiment of the invention.
Figure 45:
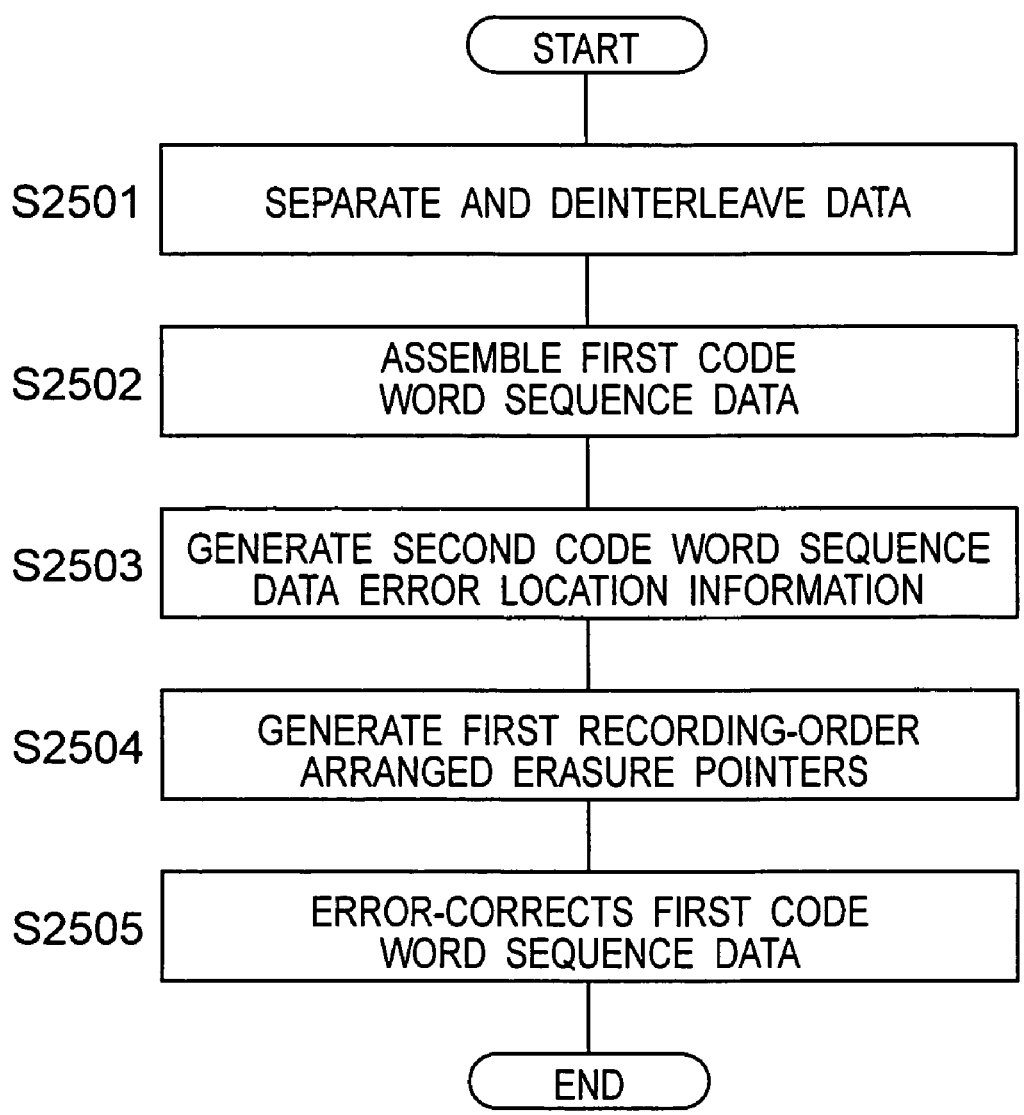
FIG. 45 is a flow chart of the reproduction operation of the data reproducing circuit according to the ninth embodiment of the invention.

FIG. 44 shows the configuration of another data reproducing circuit according to the present invention. This data reproducing circuit adds to the configuration of the eighth embodiment described above first to sixth memories 4001 to 4006. The operation of this embodiment is substantially the same as the eighth embodiment, but more specifically describes how memory is used. The data format generated during reproduction operation is shown in FIG. 43.

The operation of this reproducing circuit is described next.

The data separator/deinterleaver 4007 extracts the synchronization error information 2404 from the recorded data 2401, and writes it to the first memory 4001, writes the first code word sequence data segment 2402 to the second memory 4002 while applying the first deinterleave to segments, and writes the second code word sequence data 2403 to the third memory 4003 while applying the second deinterleave to the data 2403 (S2501).

The first code word sequence data assembler 4008 sequentially writes the first code word sequence data segments 2402 in the second memory 4002 to the fourth memory 4004 and generates the first code word sequence data 2405 (S2502).

The second code word sequence data error location information generator 4009 error-corrects the second code word sequence data 2403 and writes the second code word sequence data error location information 2406 in an order corresponding to the second code word sequence data, to the fifth memory 4005 (S2503).

The first recording-order arranged erasure pointer generator 4010 applies a second deinterleave to the second code word sequence data error location information 2406, generates the first recording-order arranged erasure pointers 2407 corresponding to the order of the first recording-order arranged data from the error location information 2406 applied with the second deinterleave and synchronization error information 2404, and writes it to the sixth memory 4006 (S2504).

The first code word sequence data error-correcting unit 4011 uses first recording-order arranged erasure pointers 2407 while applying the first deinterleave thereto to error-correct erasure of the first code word sequence data 2405 (S2505).

The same technical benefit described in the eighth embodiment is also achieved by the above configuration.

It should be noted that the second memory 4002 in this embodiment corresponds to the small capacity first memory 11 in the first embodiment, and the fourth memory 4004 corresponds to the second memory 15 in the first embodiment. By thus using a second memory 4002 with less capacity than is needed to store an entire ECC block, bus access performance can be improved as described in the first embodiment.

Furthermore, the third memory 4003 and fourth memory 4004 can be separate areas in the same buffer memory, allocated for storing the first code word sequence data 2405 and the second code word sequence data 2403, respectively. This is the same as described in the sixth embodiment above.

In the data separator/deinterleaver 4007, some flags can be provided to synchronization error information 2404, first code word sequence data segment 2402, and second code word sequence data 2403, respectively. These flags are set in the formatting order of the recorded data 2401, and the data to be written and whether the data is written to the first memory 4001, the second memory 4002, or the second code word sequence data area in buffer memory is selected based on these flags.

Figure 46:
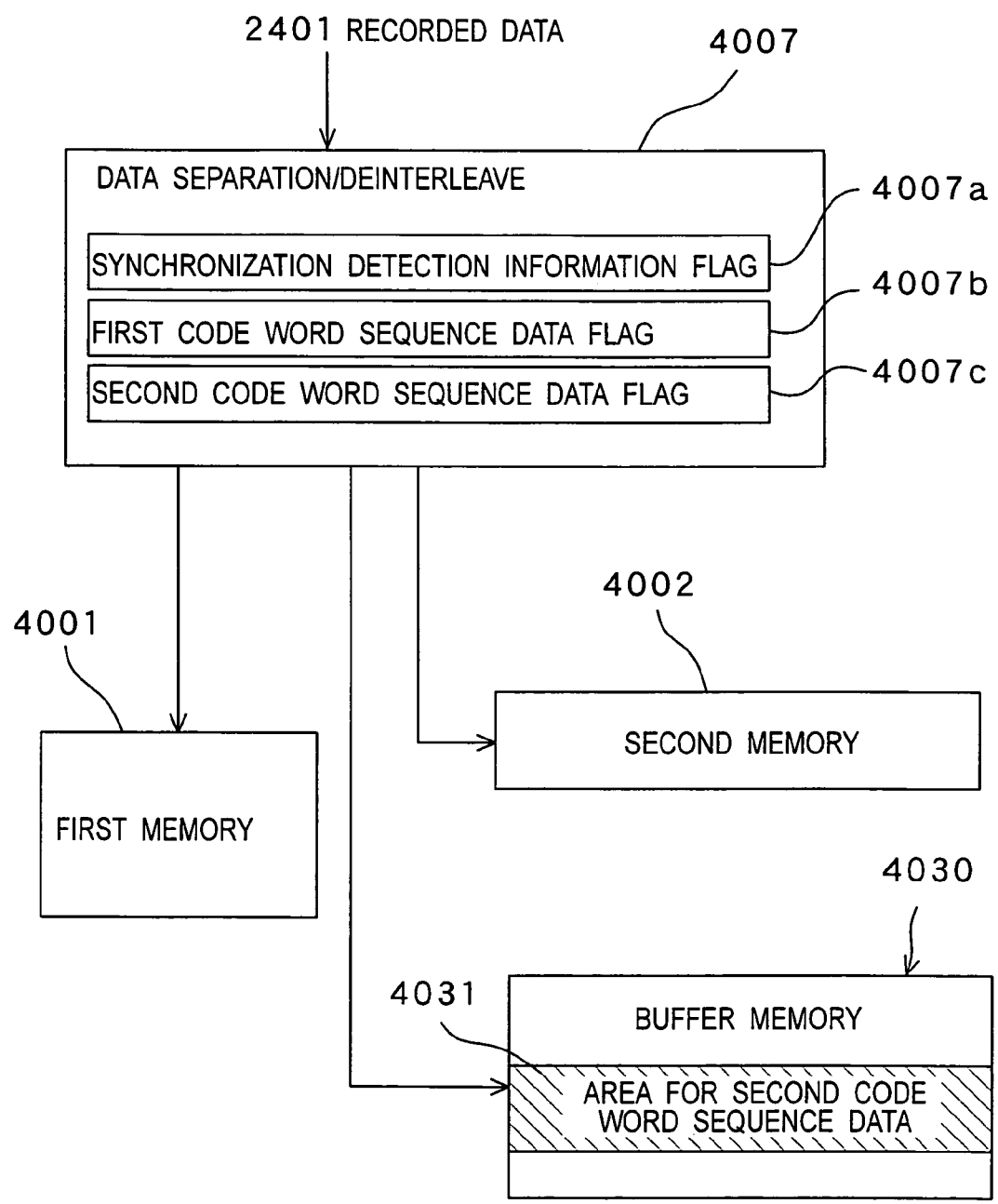
FIG. 46 describes flags corresponding to the synchronization detection information, first code word sequence data, and second code word sequence data in the data separating and deinterleaving unit of the ninth embodiment of the invention.

The configuration of the data separator/deinterleaver 4007 is shown in FIG. 46.

In the data separator/deinterleaver 4007, synchronization detection flag 4007a, first code word sequence data flag 4007b, and second code word sequence data flag 4007c are provided. The third and fourth memories are composed of the buffer memory 4030 which is internally provided with an area 4031 for storing the second code word sequence data.

When the synchronization detection flag 4007a is on, the data separator/deinterleaver 4007 extracts the synchronization error information 2404 from the recorded data 2401 to write it to the first memory 4001. When the first code word sequence data flag 4007b is on, the data separator/deinterleaver 4007 first deinterleaves the recorded data 2401 to write it to the second memory 4002. When the second code word sequence data flag 4007c is on, the data separator/ deinterleaver 4007 applies the second deinterleave to the recorded data 2401 to write it to the second code word sequence data area 4031 in the buffer memory 4030.

The format of error location information having the order of the second code word sequence data may allocate one bit to each byte of the second code word sequence data, that is, error location information can be managed in each code word sequence (See FIG. 32 in Embodiment 6).

The synchronization error information format may map the synchronization error information 2404 to one byte, and can be arranged in the recorded data sequence (See FIGS. 33A and 33B, Embodiment 6).

The first recording-order arranged erasure pointers 2407 can map one erasure pointer to one data byte, and can be formatted so that pointers 2407 are arranged in the order of the first recording-order arranged data (See FIG. 34, Embodiment 6).

The first, fifth, and sixth memories can also be allocated to separate areas in one small capacity memory (See FIG. 35, Embodiment 6).

Yet further, two areas for storing synchronization error information, one area for storing second data error location information, and one area for storing the first recording-order arranged erasure pointers, can also be provided in a small capacity memory (see FIG. 36, embodiment 6.).

Embodiment 10

An optical disk data recording circuit for recording data according to the data recording format shown in FIGS. 17A and 17B, and FIGS. 18A and 18B, in the fourth embodiment is described next.

Figure 47:
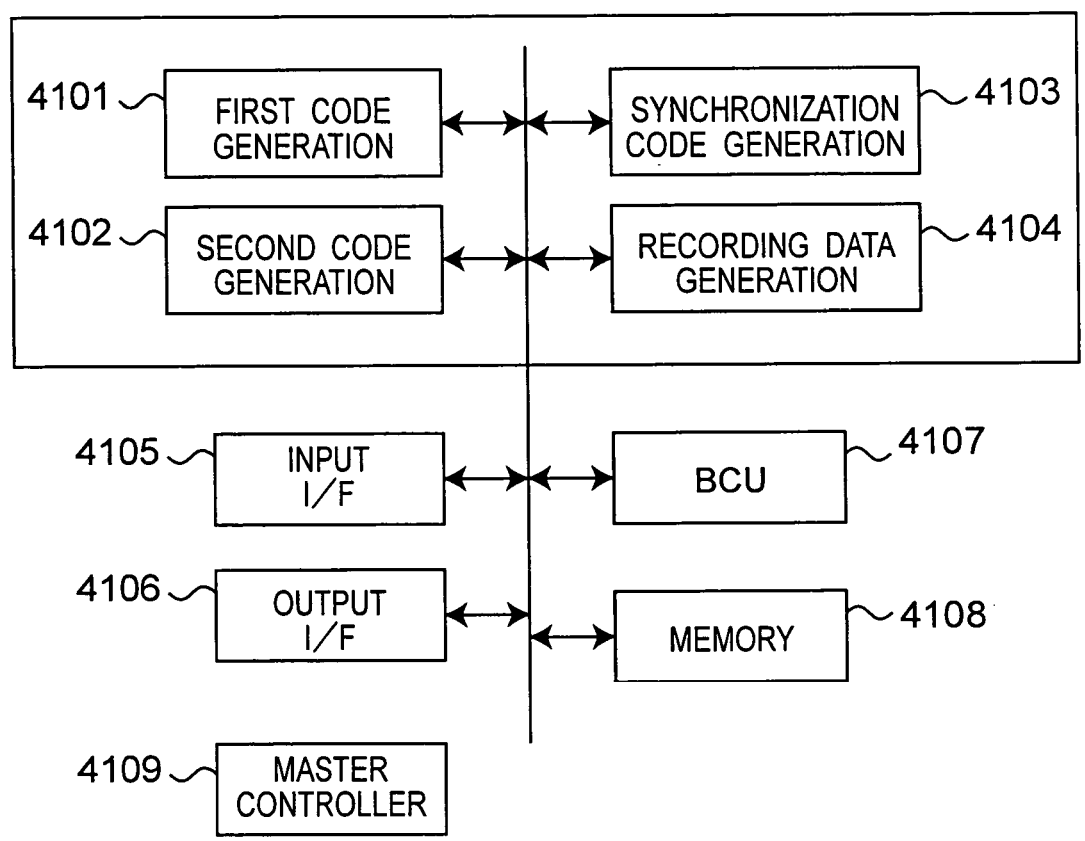
FIG. 47 is a block diagram of a data reproducing circuit according to a tenth embodiment of the invention.

FIG. 47 is a block diagram of a data recording circuit according to this embodiment of the invention. This data recording circuit has an input interface 4105, an output interface 4106, a master controller 4109, a bus controller 4107, a memory 4108, and other processing units 4101 to 4104.

Figure 48:
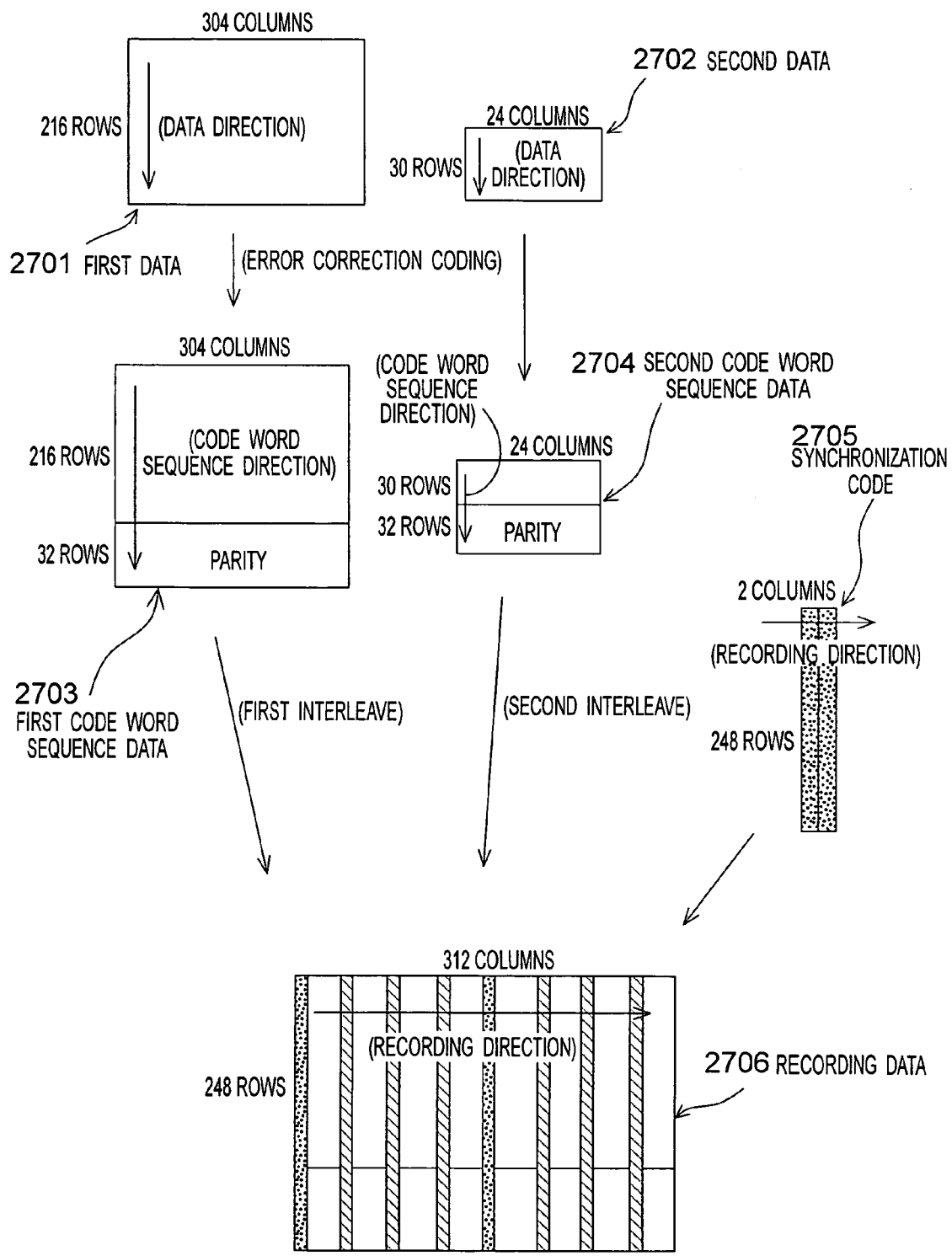
FIG. 48 describes the data formats generated in the reproduction operation of the tenth embodiment of the invention.

FIG. 48 shows several data generated by the data recording circuit according to the invention.

The reference numeral "2701" denotes first data which is ordered in the column direction. The reference numeral "2702" denotes second data which is ordered in the column direction. The reference numeral "2703" denotes first code word sequence data. The reference numeral "2704" denotes second code word sequence data. Both data 2703 and 2704 are coded in column units. The reference numeral "2705" denotes the synchronization code which is recorded in the row direction.

The first code word sequence data 2703 is generated by error-correcting coding of each 216-byte column of the first data 2701 and then adding 32 bytes of parity thereto.

The second code word sequence data 2704 is generated by error-correcting coding of each 30-byte column of the second data 2702 and then adding 32 bytes of parity thereto. The error-correcting code used with the second code word sequence data 2704 is more robust than the error-correcting code used to the first data.

The recording data 2706 is generated by applying a first interleave to the first code word sequence data 2703, segmenting the result into eight equal groups of 38 columns, and allocating these column groups between synchronization code 2705 and the second code word sequence data 2704 applied with the second interleave. The arrows denote the direction of recording to the disk, row by row from the most-significant row to the least-significant row.

The first interleave and second interleave are the same as those described in the first embodiment.

The first code generator 4101 applies error-correcting coding to the first data 2701 to generate the first code word sequence data 2703. The second code generator 4102 applies error-correcting coding to the second data 2702 to generate the second code word sequence data 2704. The synchronization code generator 4103 generates the synchronization code 2705. The recording data generator 4104 generates the recording data 2706 by alternately recording the synchronization code 2705, the first code word sequence data 2703, and the second code word sequence data 2704 at a regular period while applying a first interleave to the first code word sequence data 2703 and applying a second interleave to the second code word sequence data 2704.

Figure 49:
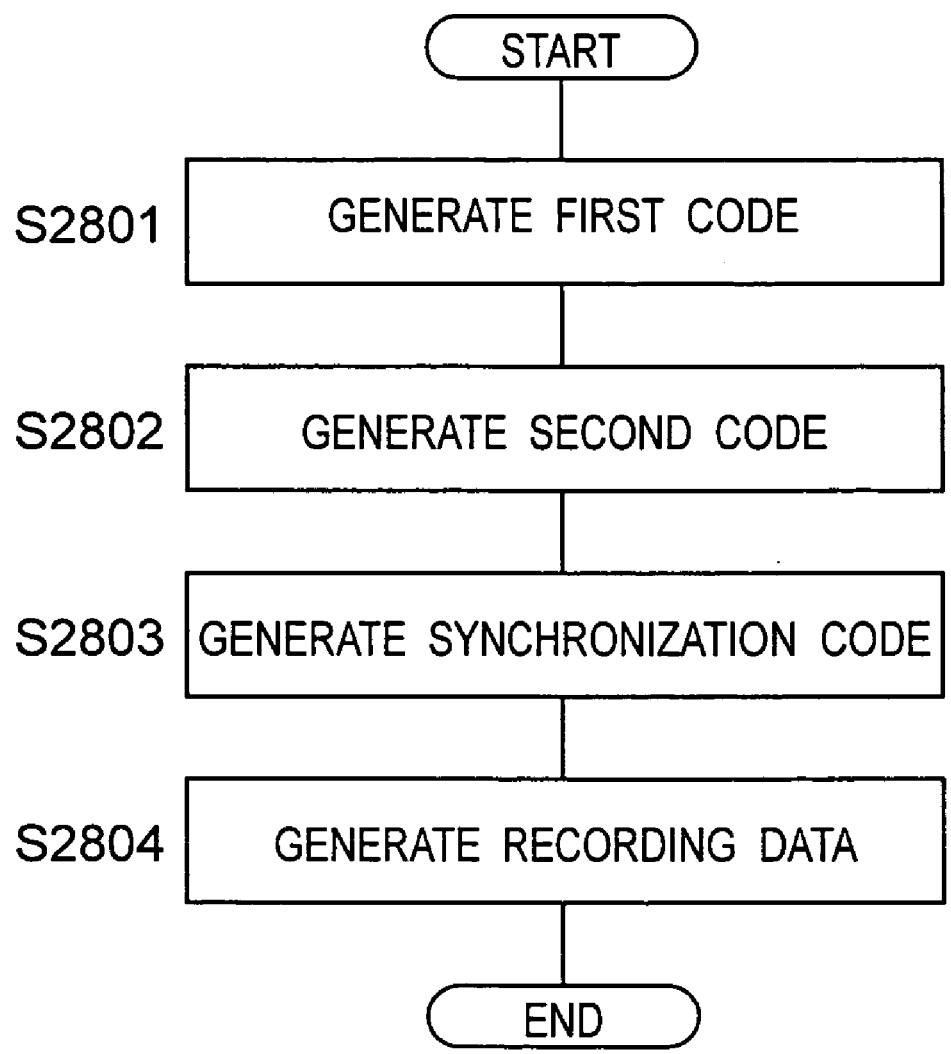
FIG. 49 is a flow chart of the reproduction operation of the data reproducing circuit according to the tenth embodiment of the invention.

FIG. 49 is a flow chart of the recording process run by this data recording circuit. Steps S2801 to S2804 correspond to the processes run by processing units 4101 to 4104 of this data recording circuit.

Recording while interleaving the data as described above eliminates the steps of first generating the recording-order arranged data and then recording the data.

This embodiment of the invention thus provides a recording method of fewer steps while having a step of encoding the synchronization code, the first code word sequence data, and the second code word sequence data to the recording format at one time.

Embodiment 11

Figure 50:
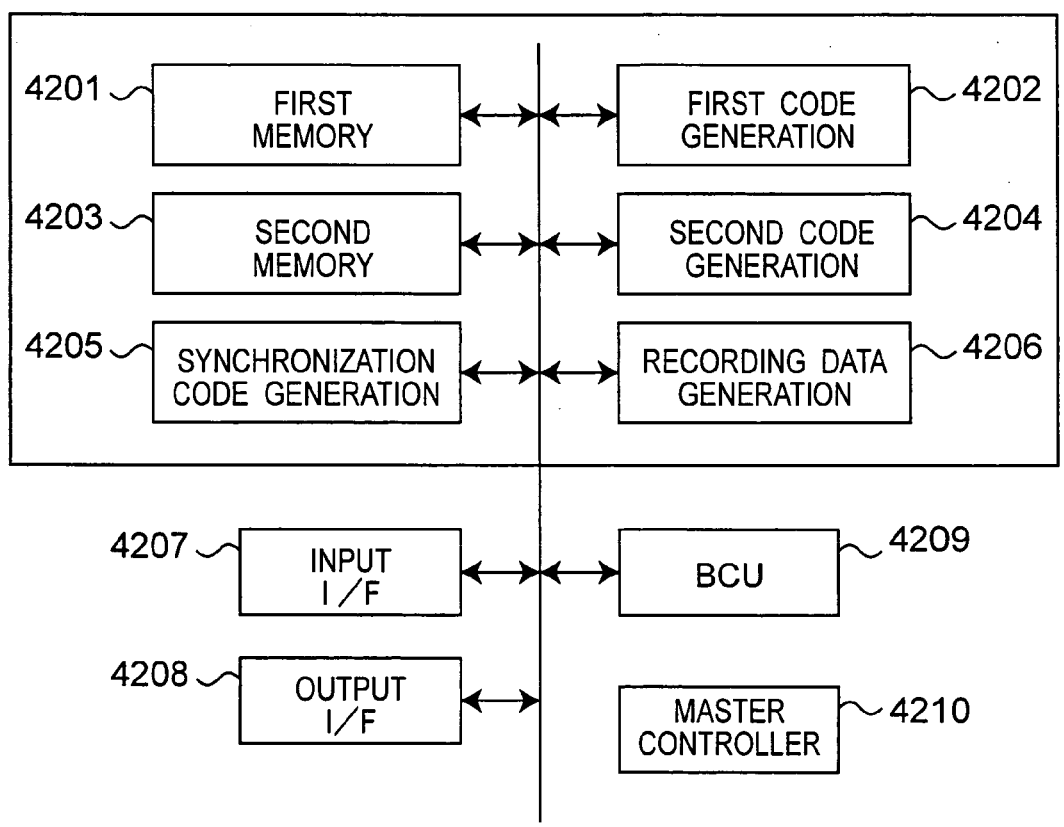
FIG. 50 is a block diagram of a data reproducing circuit according to an eleventh embodiment of the invention.

FIG. 50 shows the configuration of a data recording circuit according to this embodiment of the invention. This data recording circuit adds a first memory 4201 and a second memory 4203 to the data recording circuit described in the tenth embodiment above. The basic operation of this embodiment is the same as the tenth embodiment. This embodiment describes memory usage more specifically. The data generated in the recording process of this embodiment is as shown in FIG. 48.

The operation of a data recording circuit according to this embodiment of the invention is described next with reference to FIG. 48 and FIG. 50.

A first code generator 4202 performs error-correcting coding to first data 2701 and writes first code word sequence data 2703 to a first memory 4201.

A second code generator 4204 performs error-correcting coding to second data 2702, and writes second code word sequence data 2704 to a second memory 4203.

A synchronization code generator 4205 generates synchronization code 2705.

A recording data generator 4206 reads the first code word sequence data 2703 written in the first memory 4201 while applying a first interleave thereto, reads the second code word sequence data 2704 written in the second memory 4203 while applying a second interleave thereto, and alternately records synchronization code 2705, first code word sequence data 2703 applied with the first interleave, and second code word sequence data 2704 applied with the second interleave at a specified cycle, thus generating recording data 2706.

Figure 51:
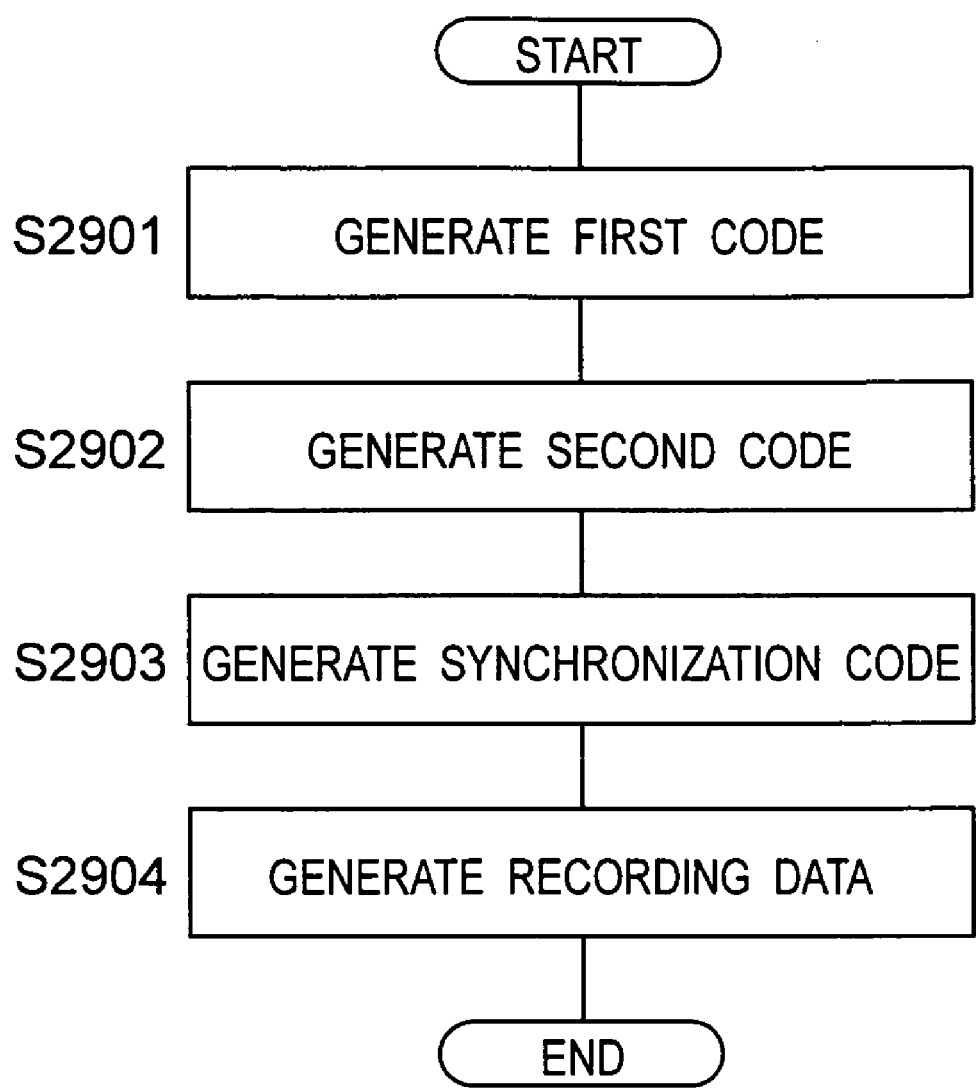
FIG. 51 is a flow chart of the reproduction operation of the data reproducing circuit according to the eleventh embodiment.

FIG. 51 is a flow chart of the process run by this data recording circuit. Steps S2901 to S2904 correspond to the operations run by processing units 4202, 4204, 4205, and 4206 in the data recording circuit of this embodiment.

This embodiment of the invention thus provides a recording method of fewer steps while having a step of encoding, at one time, the synchronization code, first code word sequence data, and second code word sequence data to the recording format.

It should be noted that first memory 4201 and the second memory 4203 can be areas in the same buffer memory, and the first code word sequence data and the second code word sequence data can be written to respectively allocated areas (See FIG. 30, Embodiment 6).

Flags corresponding to the synchronization code, first code word sequence data, and second code word sequence data can be set in the recording data generator 4206. These flags can be set in the order of the recording data, and a device from which data is read can be changed based on the flags to synchronization code generator 4205, first memory 4201, or second memory 4203.

Figure 52:
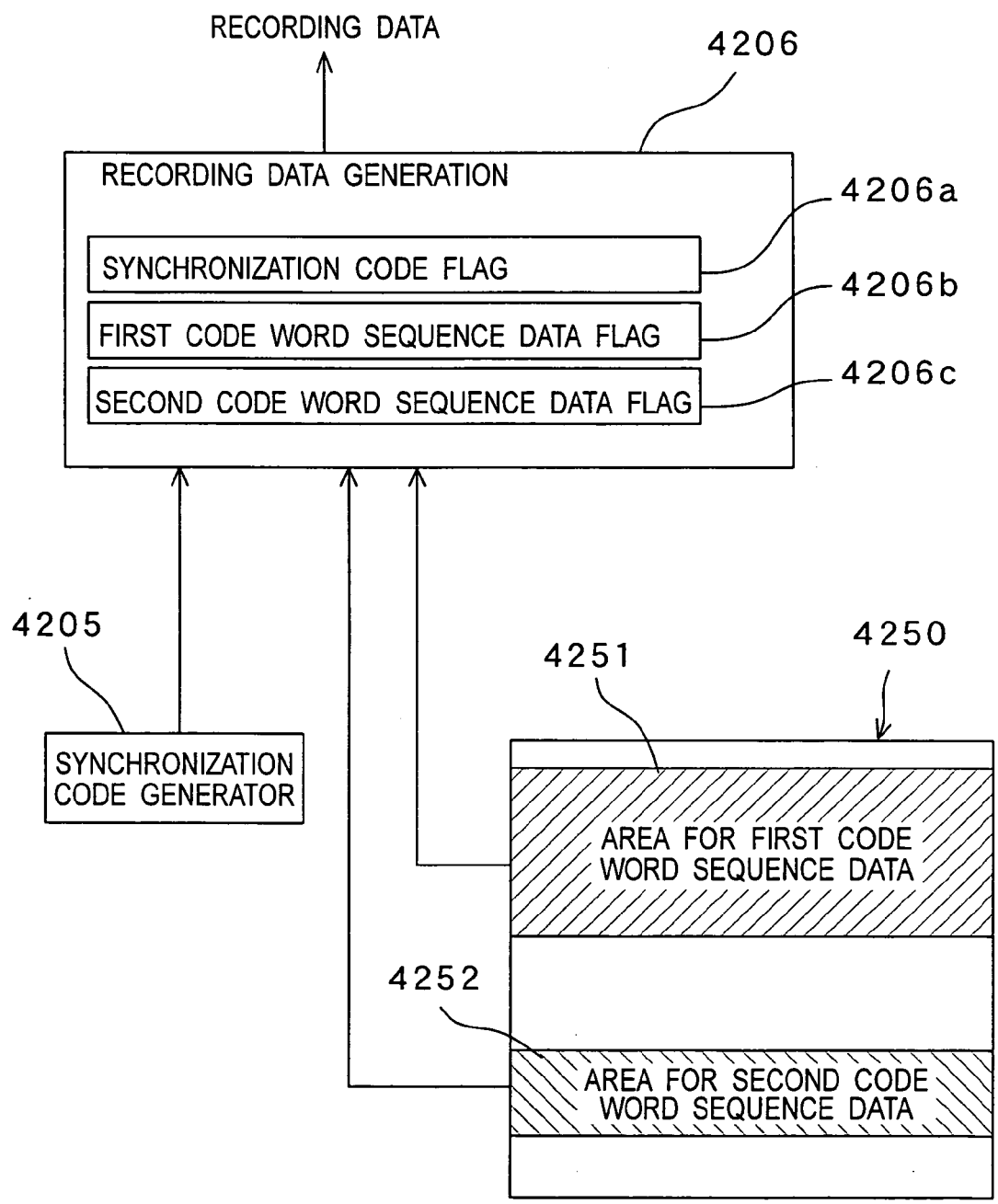
FIG. 52 describes flags corresponding to the synchronization detection information, first code word sequence data, and second code word sequence data in the data separating and deinterleaving unit of the eleventh embodiment of the invention.

FIG. 52 shows a configuration of the recording data generator 4206 having flags for the synchronization code, first code word sequence data, and second code word sequence data. As shown in the figure the recording data generator 4206 has a synchronization code flag 4206a, a first code word sequence data flag 4206b, and a second code word sequence data flag 4206c. First and second memories are also composed of the same buffer memory. More specifically, a first code word sequence data area 4251 and a second code word sequence data area 4252 are allocated in a buffer memory 4250.

When the synchronization code flag 4206a is on, the recording data generator 4206 receives the synchronization code from the synchronization code generator 4205 to generate the recording data 2706. When the first code word sequence data flag 4206b is on, the recording data generator 4206 reads, while applying a first interleave, the first code word sequence data 2703 from the area 4251 storing the first code word sequence data to generate the recording data 2706. When the second code word sequence data flag 4206c is on, the recording data generator 4206 reads, while applying a second interleave, the second code word sequence data 2704 from the area 4252 storing the second code word sequence data 2704 to generate the recording data 2706.

Embodiment 12

Figure 53:
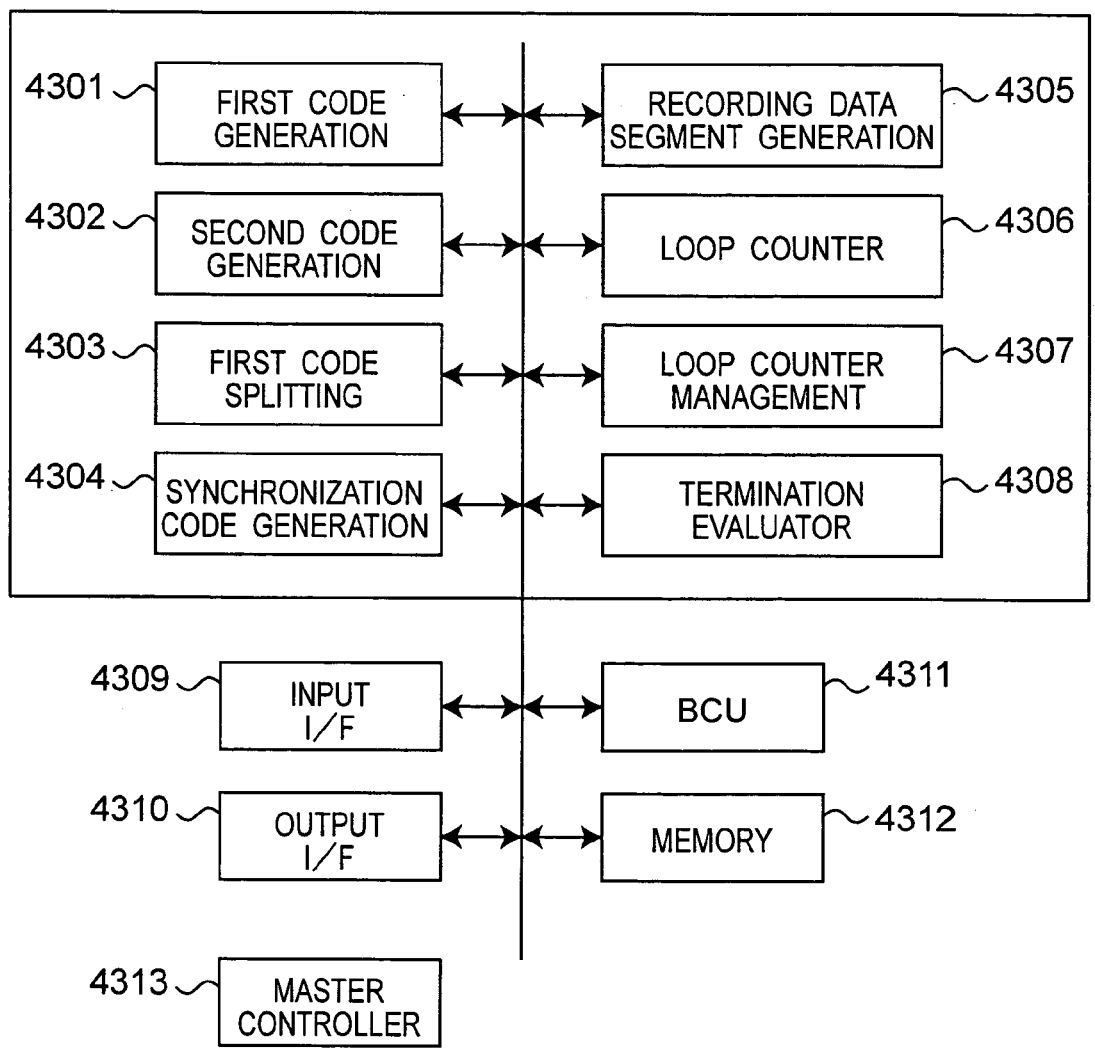
FIG. 53 is a block diagram of a data reproducing circuit according to a twelfth embodiment of the invention.

Another configuration of the optical disk data recording circuit according to the invention is described next. FIG. 53 shows a configuration of the optical disk data recording circuit according to this embodiment. This data recording circuit has an input interface 4309, an output interface 4310, a bus controller 4311, a master controller 4313, a memory 4312, and processing units 4301 to 4308.

Figure 54:
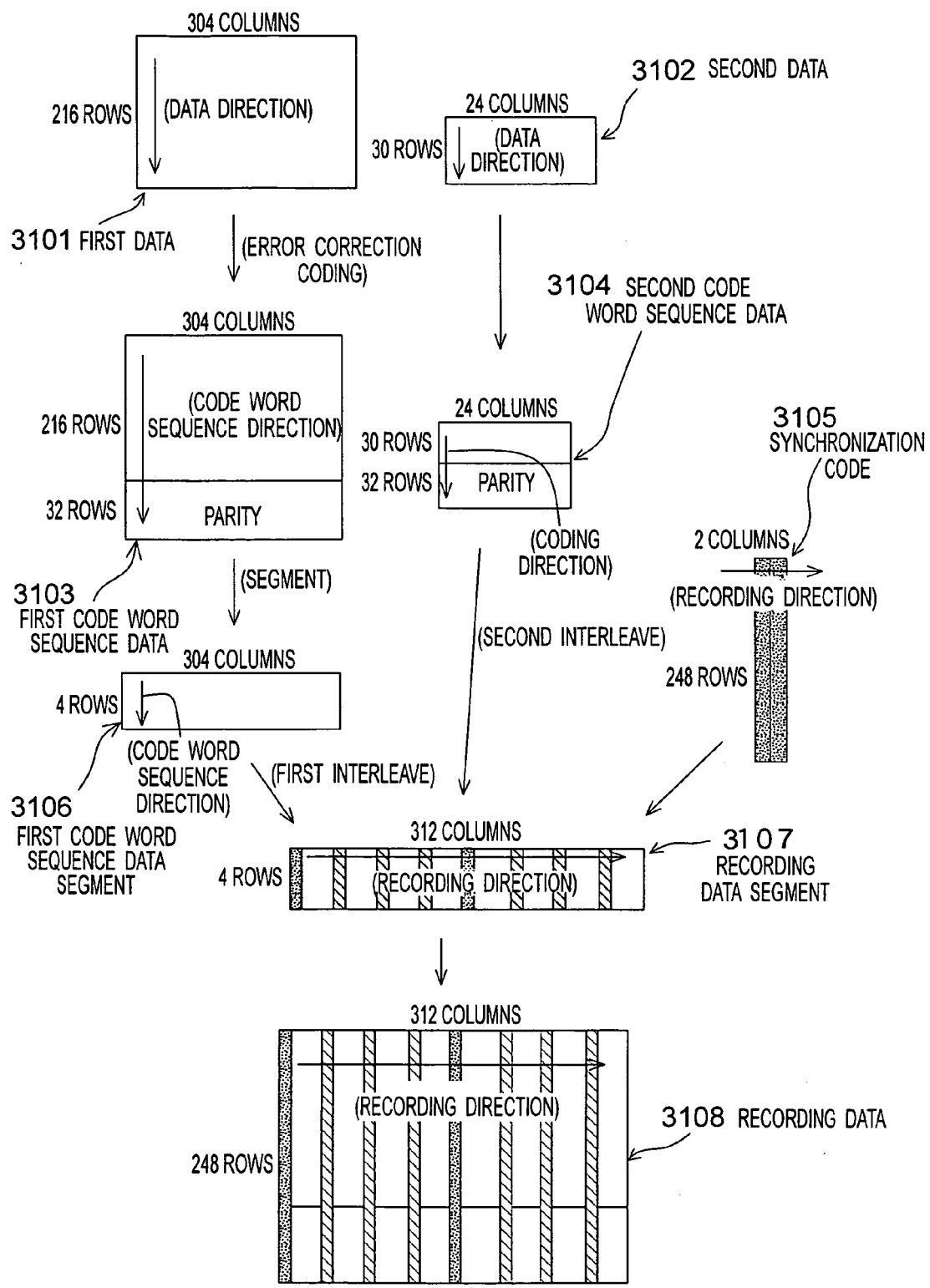
FIG. 54 describes the data formats generated in the reproduction operation of a data reproducing circuit according to the twelfth embodiment of the invention.

FIG. 54 shows the process of generating the data formats produced in the recording operation of a data recording circuit according to this embodiment of the invention. The reference numeral "3101" denotes first data with data arranged in the column direction. The reference numeral "3102" denotes second data with data arranged in the column direction. The reference numeral "3103" denotes first code word sequence data 3103 and the reference numeral "3104" denotes second code word sequence data. First and second code word sequence data 3103 and 3104 are encoded by a column unit. The reference numeral "3105" denotes synchronization codes 3105 which are recorded in the row direction.

The first code word sequence data 3103 is generated by applying error-correcting coding to each 216-byte column of the first data 3101 and then adding 32 bytes of parity to the error-correcting result.

The second code word sequence data 3104 is generated by applying error-correcting coding to each 30-byte column of the second data 3102 and then adding 32 bytes of parity to the error-correcting result. The error-correcting code used with second code word sequence data 3104 is more robust than the first error-correcting code.

First code word sequence data segments 3106 are obtained by segmenting each line of first code word sequence data 3103. In this embodiment first code word sequence data segment 3106 is a 4-row×304-column segment obtained by dividing a row of first code word sequence data 3103 into 62 parts. A different divisor could, of course, be used.

The reference numeral "3106" denotes first code word sequence data segments into which the first code word sequence data is divided. Each first code word sequence data segment is 4-row×304-column data segment which is obtained by dividing the first code word sequence data into 62 segments. Number of division can be a value other than 62.

A data segment 3107 is produced by applying a first interleave to the first code word sequence data segment 3106, dividing the result into 8 equal groups of 38 columns, and alternating these groups with the second code word sequence data 3104 applied with a second interleave and synchronization code 3105. The arrows denote the direction of recording to the disk, row by row from the most-significant row to the least-significant row.

The reference numeral "3108" denotes recording data composing the recording data segments 3107 arranged in the recording sequence.

Figure 55:
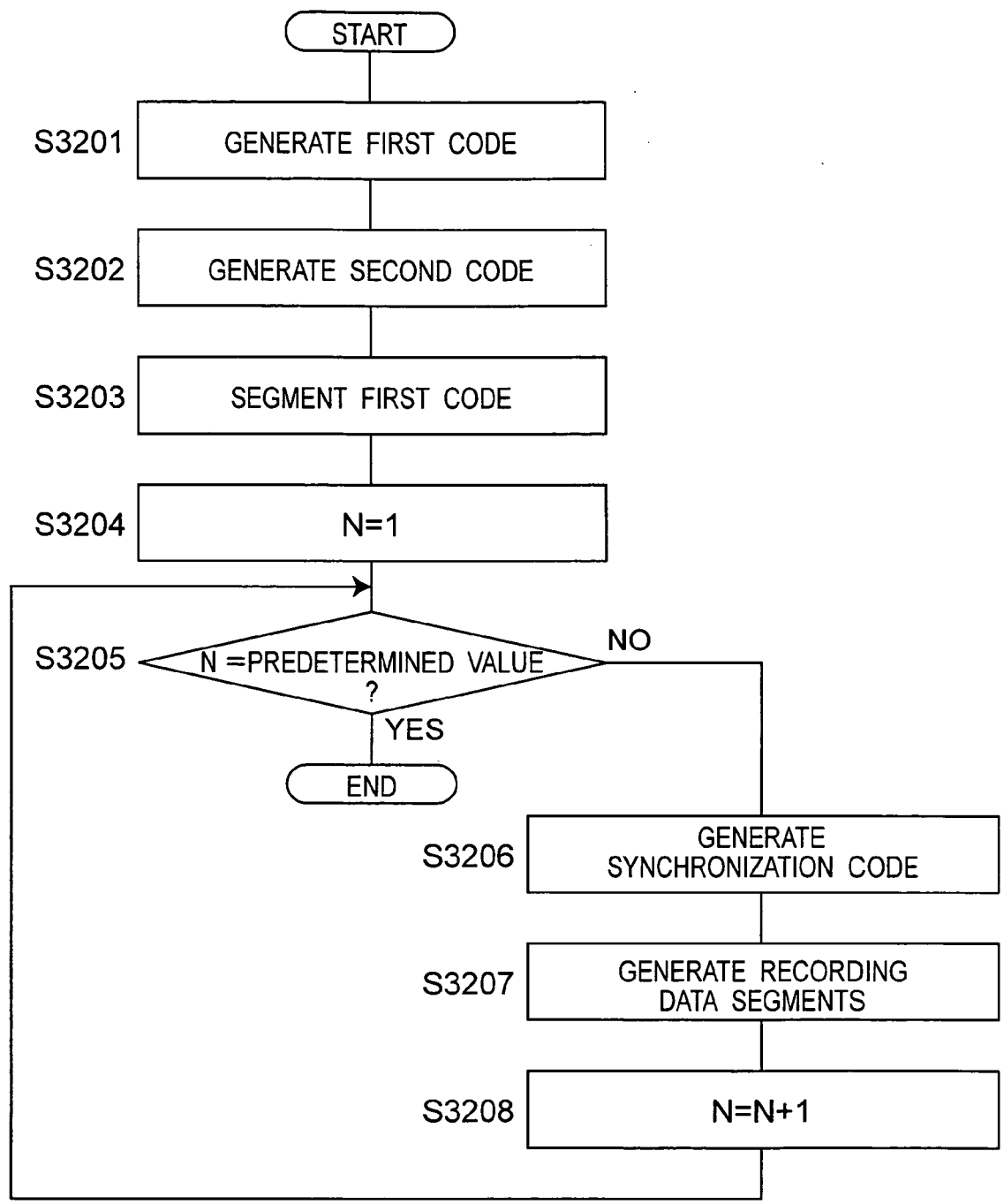
FIG. 55 is a flow chart of the reproduction operation of the data reproducing circuit according to the twelfth embodiment.

FIG. 55 is a flow chart of the recording operation of this data recording circuit.

The first code generator 4301 applies error-correcting coding to the first data 3101 to generate the first code word sequence data 3103 (step S3201). The second code generator 4302 applies error-correcting coding to the second data 3102 to generate the second code word sequence data 3104 (step S3202).

The first code splitter 4303 divides the code word sequence data 3103 of the first data into a predetermined number of groups (step S3203), specifically 62 in the example shown in FIG. 54. A value N which is an output of a loop counter 4306 is set to "1" (step S3204).

The termination controller 4308 then determines if N equals a predetermined value (step S3205). If it does, the process ends.

If N does not equal the predetermined value, the synchronization code generator 4304 generates synchronization code 3105 (step S3206). The recording data segment generator 4305 applies a first interleave to the first code word sequence data segment 3106, applies a second interleave to the second code word sequence data 3104, and records, alternately at a specific period, the synchronization code 3105, the first code word sequence data segment applied with the first interleave and the second code word sequence data segment applied with the second interleaved, thus generating the recording data segment 3107 (step S3207).

The loop counter manager 4307 then increments a loop counter (step S3208), and control loops back to step S3205.

These steps then repeat to generate the recording data 3108.

This embodiment of the invention thus provides a recording method of fewer steps while having a step of encoding at one time the synchronization code, the first code word sequence data, and the second code word sequence data into the recording format.

Furthermore, by applying the first interleave to segments of the first code word sequence data, encoding of recording format can be executed in data units smaller than the entire recording data, and the encoding can be completed using less memory than that required for encoding all recording data to the recording format at once.

Embodiment 13

Figure 56:
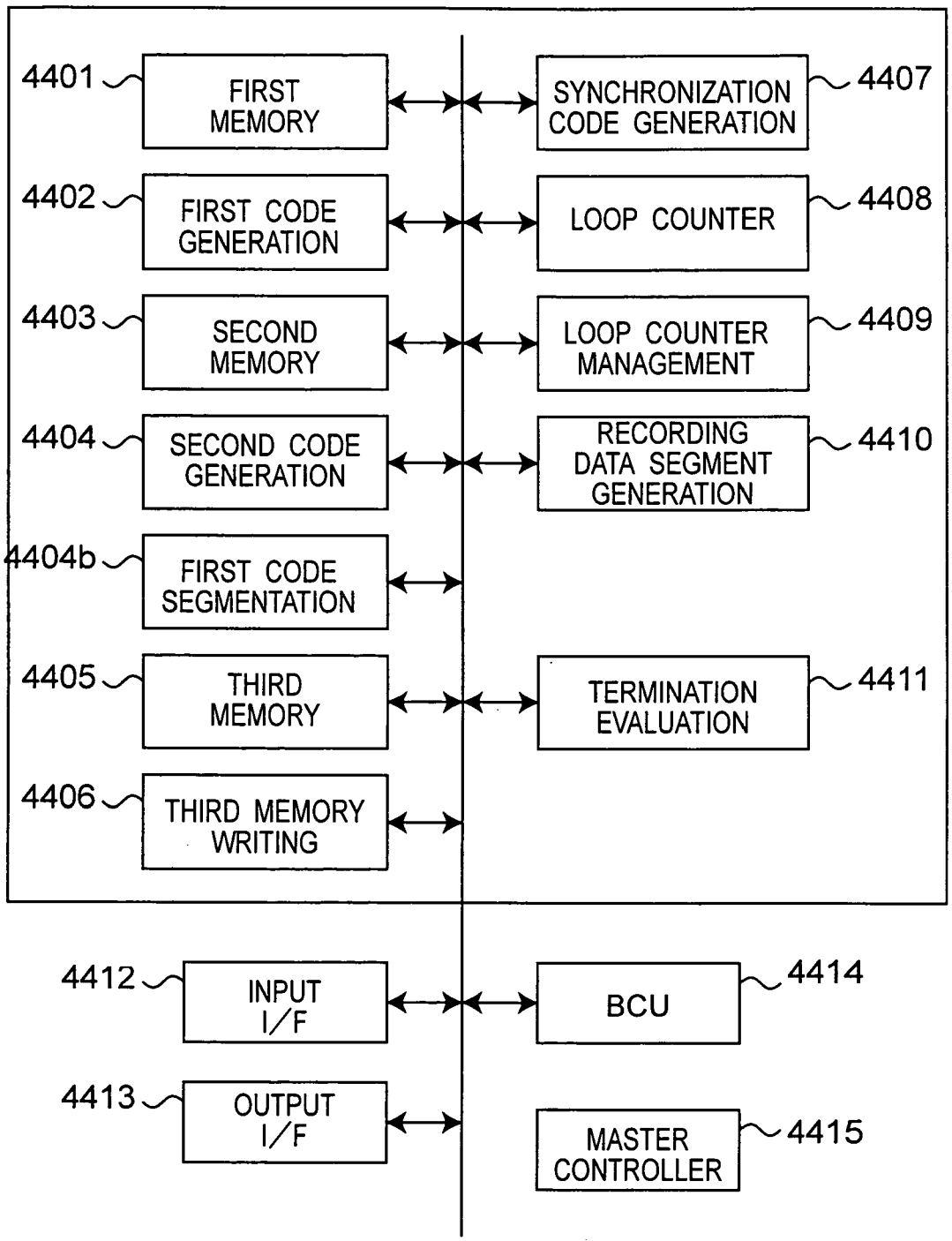
FIG. 56 is a block diagram of a data reproducing circuit according to a thirteenth embodiment of the invention.

FIG. 56 is a block diagram of a data recording circuit according to this embodiment. This data recording circuit further includes third memories 4401, 4403 and 4405, and a third memory writer 4406, in the data recording circuit of the twelfth embodiment described above. The basic operation of this embodiment is the same as the twelfth embodiment. This embodiment describes memory usage more specifically. The data generated in the recording process of this embodiment is as shown in FIG. 54.

Figure 57:
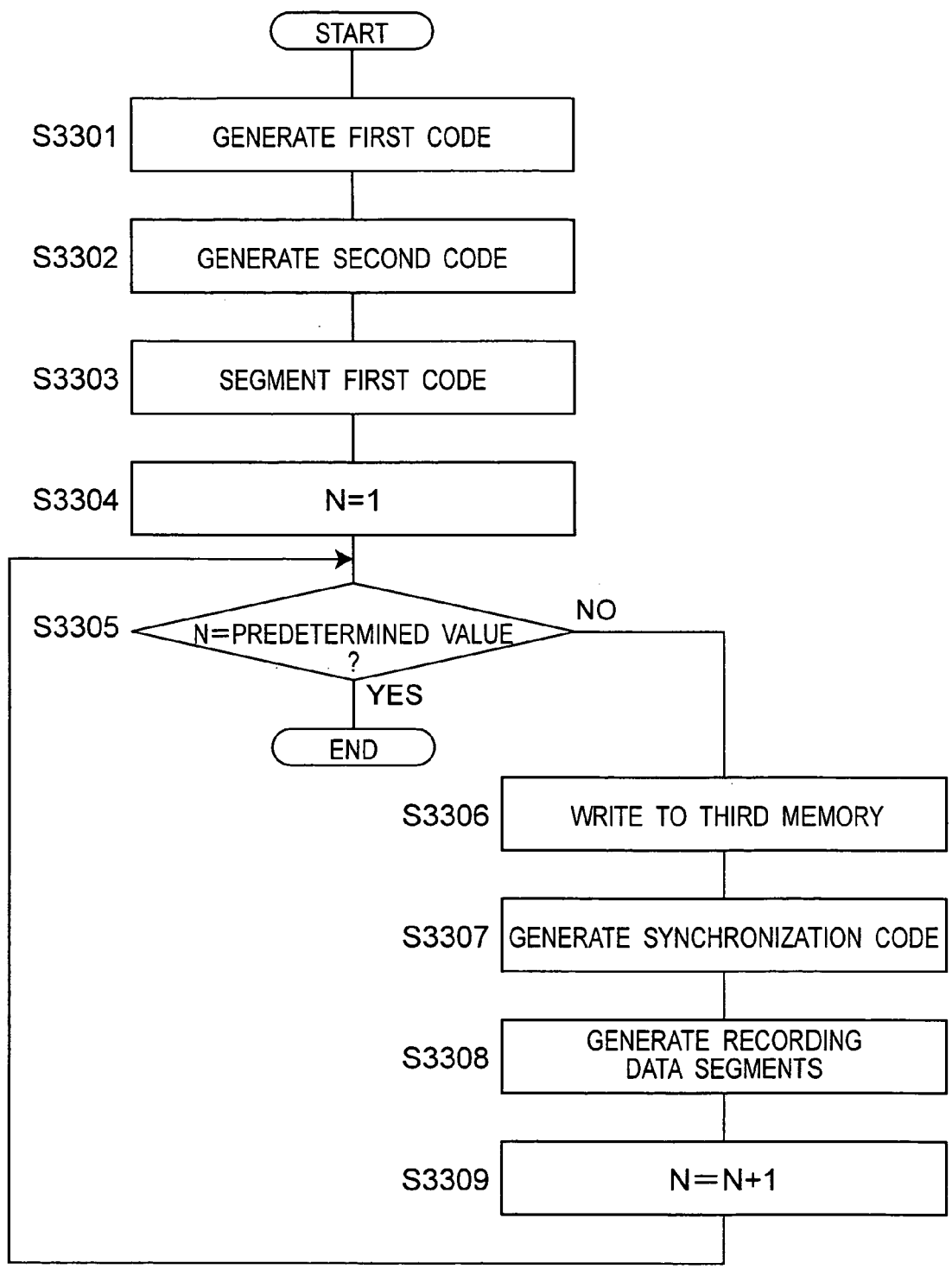
FIG. 57 is a flow chart of the reproduction operation of the data reproducing circuit according to the thirteenth embodiment.

FIG. 57 is a flow chart of the operation of a data recording circuit according to this embodiment of the invention.

A first code generator 4402 applies error-correcting coding to the first data 3101 and writes the first code word sequence data 3103 to a first memory 4401 (step S3301). This first memory 4401 corresponds to the first memory 31 in the second embodiment.

A second code generator 4404 applies error-correcting coding to the second data 3102, and writes the second code word sequence data 3104 to a second memory 4403 (step S3302).

A first code splitter 4404b divides the first code word sequence data 3103 into a specified number of segments, specifically 62 segments in the example shown in FIG. 54 (step S3303).

A loop counter 4408 then sets variable N to 1 (step S3304).

A termination evaluator 4411 determines if N equals a predetermined value (step S3305). If it does, the process ends.

If N does not equal the predetermined value, the third memory writer 4406 writes a first code word sequence data segment 3106 to a third memory 4405 (step S3306). The third memory 4405 corresponds to the second memory 35 in the second embodiment above. Synchronization code generator 4407 then generates synchronization code 3105 (step S3307).

A recording data segment generator 4410 reads the first code word sequence data segment 3106 from the third memory 4405 while applying a first interleave, reads the second code word sequence data 3104 from the second memory 4403 while applying a second interleave, and alternately records the synchronization code 3105, the first code word sequence data segment 3106 applied with the first interleave, and the second code word sequence data 3104 applied with the second-interleave at a specific cycle as a recording data segment 3107 to the optical disk (step S3308).

A loop counter manager 4409 then increments the loop counter (step S3309) and returns control to step S3305.

The recording data 3108 is thus recorded to the optical disk by repeating these steps.

The first memory 4401 and the second memory 4403 can be areas provided in the same buffer memory with the code word sequence data for the first data and the code word sequence data for the second data recorded to the separate areas (See FIG. 30, embodiment 6).

Flags corresponding to the synchronization code, the first code word sequence data, and the second code word sequence data can be set in the recording data segment generator 4410. These flags are set in the order of the recording data, and a device from which data is read is changed based on the flags to the synchronization code generator 4407, the first memory 4401, or the second memory 4403.

Figure 58:
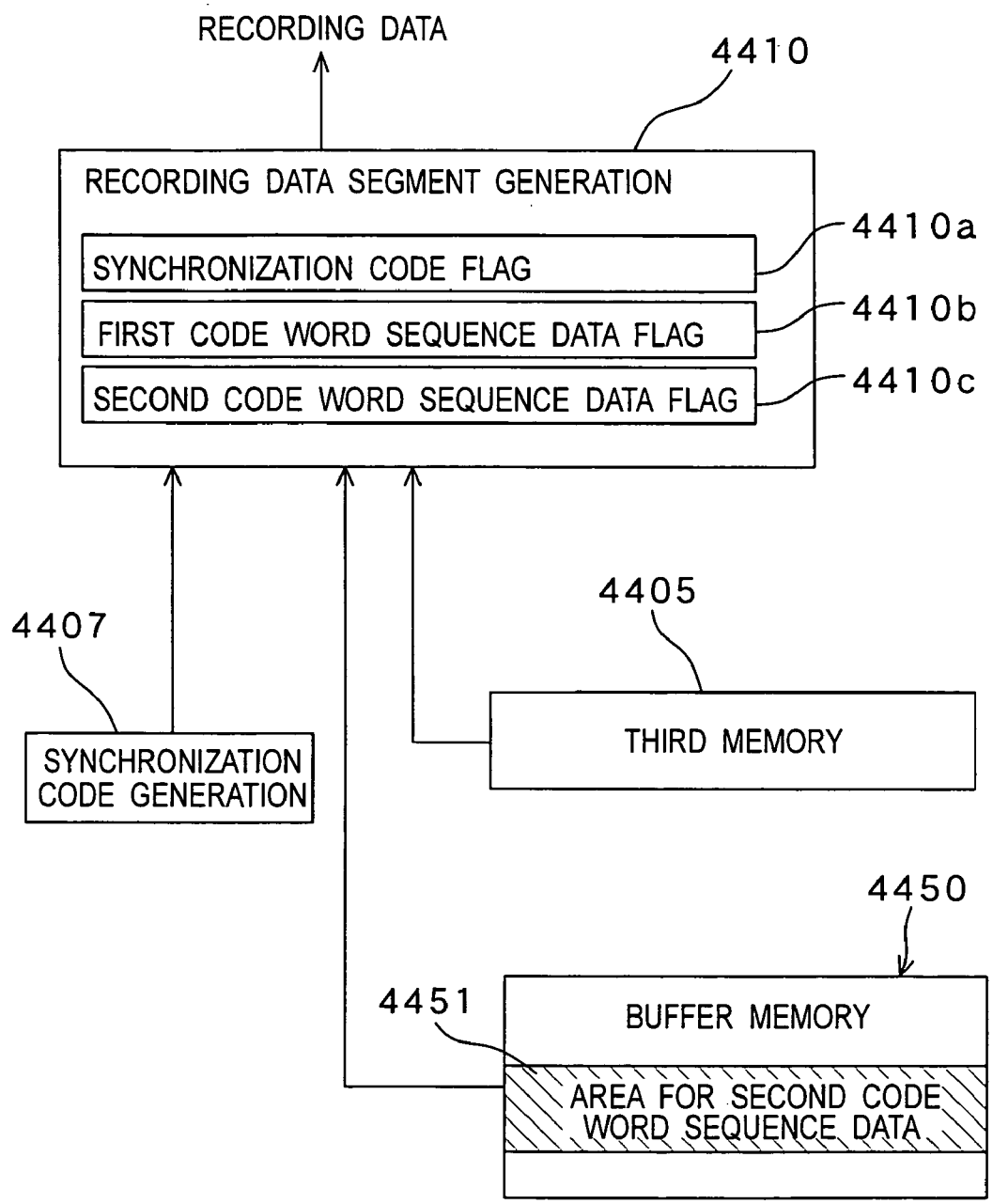
FIG. 58 describes flags corresponding to the synchronization detection information, first code word sequence data, and second code word sequence data in the data separating and deinterleaving unit of the thirteenth embodiment of the invention.

FIG. 58 shows a configuration of the recording data segment generator 4410 having flags for the synchronization code, first code word sequence data, and second code word sequence data. The recording data segment generator 4410 has a synchronization code flag 4410a, first code word sequence data flag 4410b, and second code word sequence data flag 4410c. The first and second memories 4401 and 4403 are composed of the same buffer memory. A second code word sequence data area 4451 is also provided in the buffer memory 4450.

When the synchronization code flag 4410a is on, the recording data segment generator 4410 receives the synchronization code from the synchronization code generator 4407 to generate the recording data segment 3107. When the first code word sequence data flag 4410b is on, the recording data segment generator 4410 reads the first code word sequence data segment 3106 from the third memory 4405 while applying a first interleave to generate a recording data segment. When the second code word sequence data flag 4410c is on, the recording data segment generator 4410 reads the second code word sequence data 3104 from the second code word sequence data area 4451 while applying a second interleave to generate a recording data segment.

Embodiment 14

An optical disk reproducing apparatus according to the present invention for reproducing video information from an optical disk is described here. The optical disk stores data recorded in the data format shown in FIG. 15 to FIG. 18B.

Figure 59:
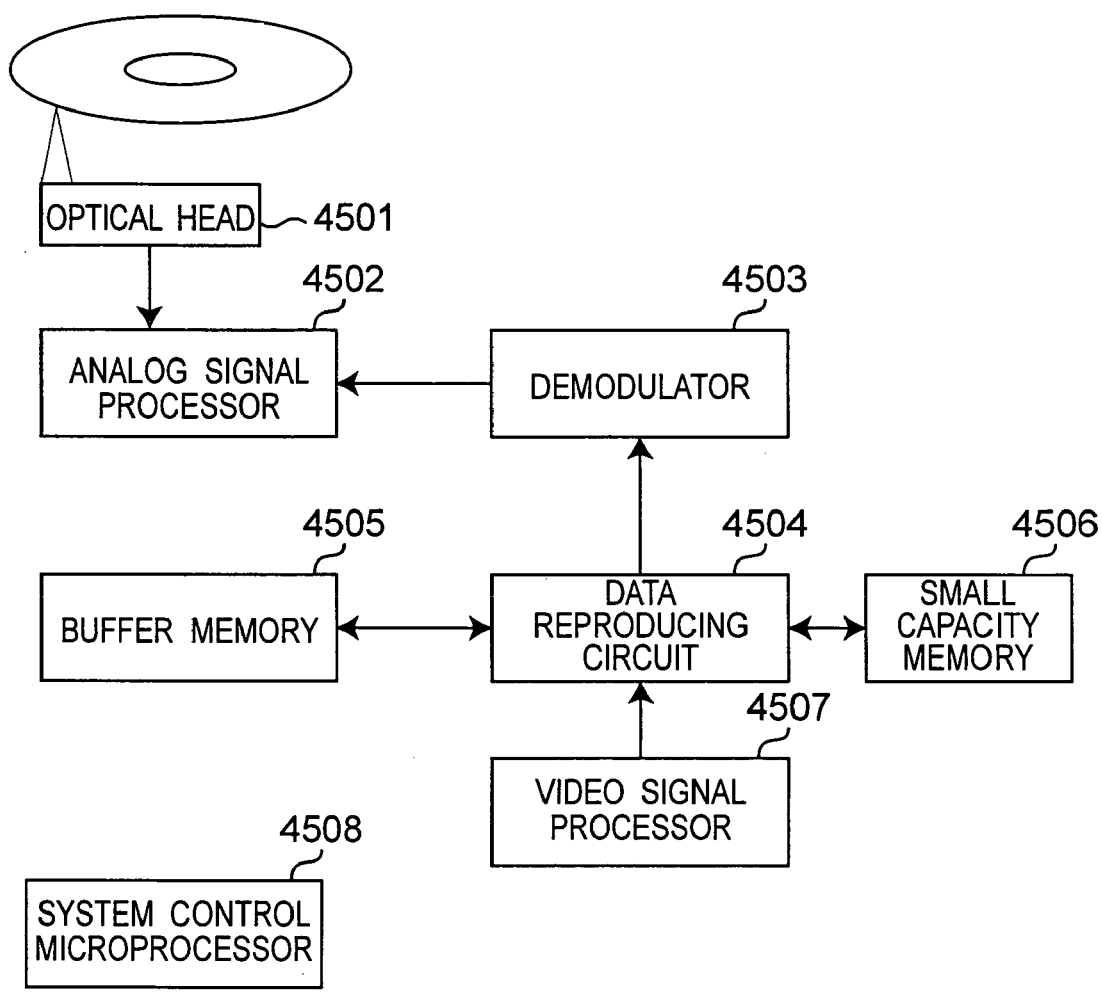
FIG. 59 is a block diagram of a data reproducing apparatus provided with a data reproducing circuit according to the present invention.

FIG. 59 is a block diagram of the reproducing apparatus. The optical disk reproducing apparatus has an optical head 4501, an analog signal processor 4502, a demodulator 4503, a data reproducing circuit 4504, a buffer memory 4505, a small capacity memory 4506, a video signal processor 4507, and a microprocessor for system control 4508. The data reproducing circuit 4504 is configured the same as a reproducing circuit described in one of the above embodiments.

In the reproducing apparatus, an optical disk is scanned with the laser beam from the optical head 4501, and the analog signal processor 4502 then digitizes the output from the optical head. The signal is then demodulated by the demodulator 4503, decoded and error-corrected by the data reproducing circuit 4504, and then decompressed by the video signal processor 4507 to acquire the desired video information.

By using a data reproducing circuit according to the present invention as described above, the optical disk reproducing apparatus according to this embodiment of the invention can decode the recording format using little memory.

Embodiment 15

An optical disk recording apparatus according to the present invention for recording video information to an optical disk is described here.

Figure 60:
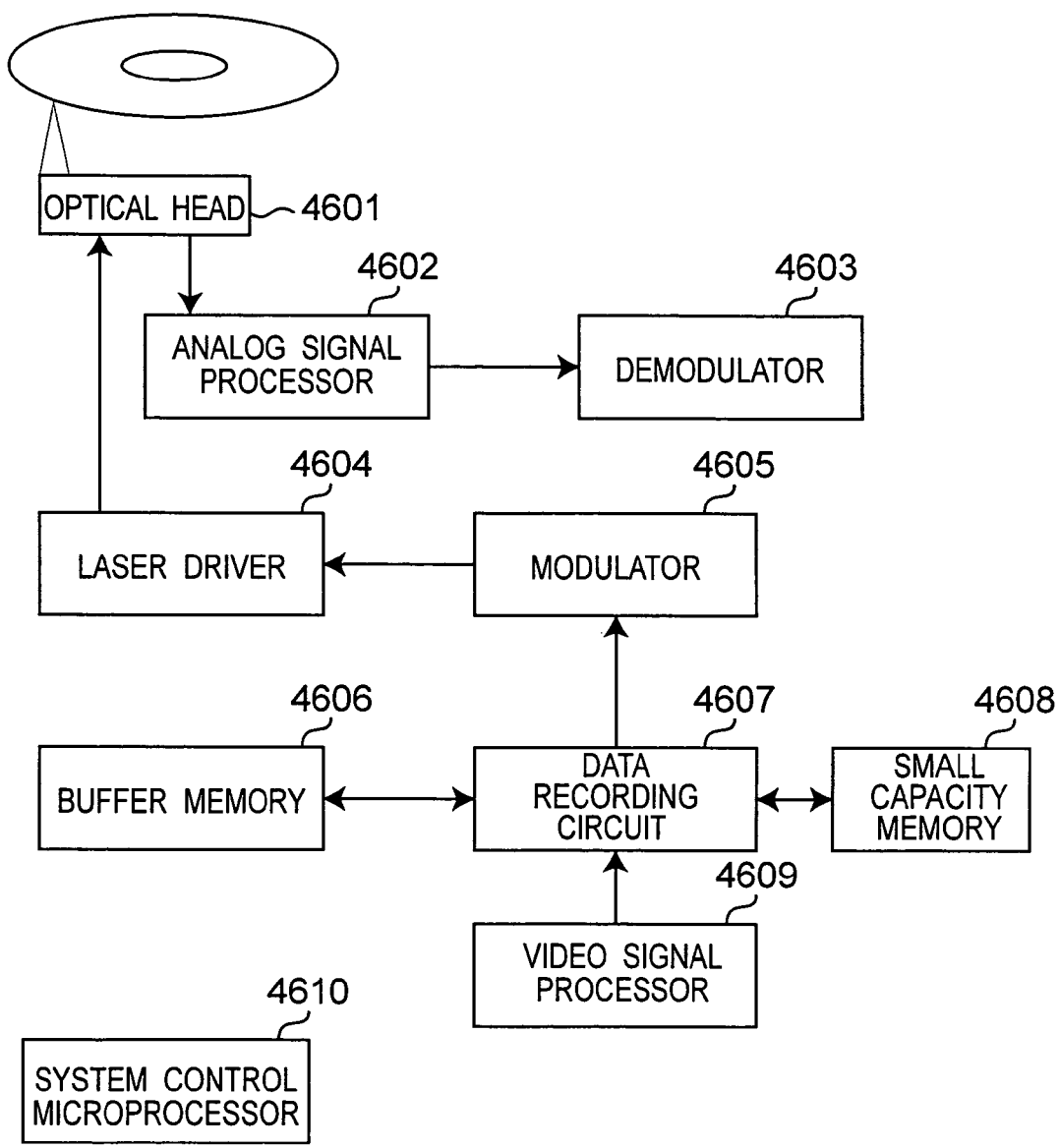
FIG. 60 is a block diagram of a data recording apparatus provided with a data recording circuit according to the present invention.

FIG. 60 is a block diagram of this optical disk recording apparatus. The apparatus includes an optical head 4601, an analog signal processor 4602, a demodulator 4603, a laser driver 4604, a modulator 4605, a buffer memory 4606, a data recording circuit 4607, a small capacity memory 4608, a video signal processor 4609, and a system control microprocessor 4610. The data recording circuit 4607 is the same configuration as a data recording circuit according to an embodiment of the invention as described above.

In the optical disk recording apparatus, the video signal processor 4609 compresses the video information. The data recording circuit 4607 then applies error-correcting coding to the compressed video information, converts it to the recording format, and applies other encoding. The encoded data is then modulated by the modulator 4605, converted to an analog signal for recording by the laser driver 4604, and recorded to the optical disk by the optical head 4601.

Hence, by using a data recording circuit according to the present invention as described above, the optical disk recording apparatus according to this embodiment of the invention can encode data to the recording format using little memory.

As described above, the fourth to fifteenth embodiments of the present invention provide a data reproduction method, data reproducing circuit, data reproducing apparatus, data recording method, data recording circuit, and data recording apparatus that achieve high reliability data reproduction by generating erasure pointers for the first error-correcting code from synchronization error information and error location information for the second error-correcting code (these information having different data sequence), and correcting erasure of the first error-correcting code having a low error-correcting capability.

The present invention can be applied to a process for reading/recording data from/to a recording medium to which interleaved data is recorded. The invention can also be used in an error-correcting process when reproducing data from the optical disk, and for error-correcting coding during data recording operation.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present invention relates to Japanese patent applications 2002-333391 filed Nov. 18, 2002, and 2003-169065 filed Jun. 13, 2003, contents of which are incorporated herein by reference.

The invention claimed is:

1. A method for error-correcting data reproduced from a recording medium to which data is recorded according to a data format in which data that is applied with error-correcting coding in a direction different from a recording direction on the recording medium is interleaved and recorded with synchronization signals, the method comprising:
reproducing data from the recording medium, deinterleaving the reproduced data, and storing it to a first memory while arbitrating data input/output to/from the first memory;
determining whether a predetermined amount of data has been stored to the first memory;
permitting transfer of data stored in the first memory to a second memory, based on the result of the determination;
transferring the reproduced data from the first memory to the second memory when the data transfer is permitted while arbitrating input/output to the second memory;
error-correcting the reproduced data stored in the second memory; and
externally outputting from the second memory user data contained in the error-corrected reproduced data.

2. The error-correcting method according to claim 1, wherein the predetermined amount of data is greater than an interleave length.

3. The error-correcting method according to claim 2, wherein the predetermined amount of data is an integer multiple of the interleave length.

4. The error-correcting method according to claim 3, wherein the second memory has a predetermined bus width, and the predetermined amount of data is equal to the interleave length multiplied by the predetermined bus width.

5. The error-correcting method according to claim 3, wherein a capacity of the first memory is at least twice the predetermined amount of data.

6. The error-correcting method according to claim 1, wherein the arbitrating input/output to the first memory assigns higher priority to data input to the first memory with data deinterleaved than data output to the second memory for data transfer.

7. The error-correcting method according to claim 1, wherein a capacity of the first memory is at least three times the predetermined amount of data, and the first memory is implemented with three pages memory management.

8. The error-correcting method according to claim 7, wherein the determining determines that the predetermined amount of data has been stored when, due to loss of synchronization, the predetermined amount of data is not stored to the first memory.

9. An error-correcting circuit for correcting errors in data reproduced from a recording medium to which data is recorded according to a data format in which data that is applied with error-correcting coding in a direction different from a recording direction on the recording medium is interleaved and recorded with synchronization signals, the circuit comprising:
a first memory for temporarily storing data reproduced from the recording medium according to the data format;
a first arbitration unit that arbitrates data input/output to/from the first memory;

an input controller that stores, while deinterleaving, the reproduced data to the first memory;

an evaluating unit that determines whether a predetermined amount of data has been stored to the first memory;

a second memory;

a second arbitration unit that arbitrates input/output to/from the second memory;

a data transfer permitting unit that permits transfer of the data stored in the first memory to the second memory, based on the result from the evaluating unit;

a data transfer unit that transfers the reproduced data from the first memory to the second memory when data transfer is permitted by the data transfer permitting unit;

an error-correcting unit that error-corrects the reproduced data stored in the second memory; and an output controller that outputs, from the second memory, user data contained in the reproduced data from which errors have been removed by the error-correcting unit.

10. The error-correcting circuit according to claim 9, wherein the predetermined amount of data is greater than an interleave length.

11. The error-correcting circuit according to claim 10, wherein the predetermined amount of data is an integer multiple of the interleave length.

12. The error-correcting circuit according to claim 11, wherein the second memory has a predetermined bus width, and the predetermined amount of data is equal to the interleave length multiplied by the predetermined bus width.

13. The error-correcting circuit according to claim 11, wherein a capacity of the first memory is at least twice the predetermined amount of data.

14. The error-correcting circuit according to claim 9, wherein, during arbitrating the first memory input/output, the first arbitration unit assigns higher priority to data input to the first memory by the input controller than data output from the first memory by the data transfer unit.

15. The error-correcting circuit according to claim 9, wherein a capacity of the first memory is at least three times the predetermined amount of data, and the first memory is implemented with three pages memory management.

16. The error-correcting circuit according to claim 15, wherein the evaluating unit determines that the predetermined amount of data has been stored when due to loss of synchronization the predetermined amount of data is not stored to the first memory.

17. A data reproducing apparatus comprising:

an optical head that optically reads information from a recording medium;

a reproducing circuit that digitizes information read from the recording medium to generate a reproduction signal;

a demodulator that demodulates signals from the reproducing circuit;

the error-correcting circuit according to claim 9 that error-corrects the demodulated reproduction signal; and a signal processing circuit that decompresses the error corrected signal.

18. A data recording and reproducing apparatus comprising:

an optical head that optically records and reproduces information on a recording medium;

a recording and reproducing circuit that generates a reproduction signal by digitizing information read from the recording medium, and generates a control signal from a recording signal for recording to the recording medium;

a modulator/demodulator that demodulates the reproduction signal or modulates the recording signal;

the error-correcting circuit according to claim 9 that error-corrects the reproduction signal demodulated by the modulator/demodulator;

an error-correcting coding circuit that applies error-correcting coding to the recording signal; and a signal processing circuit that applies predetermined signal processing operations to the reproduction signal and the recording signal, the error-correcting coding circuit comprising:

a third memory;

a third arbitration unit that arbitrates data input/output to/from the third memory;

a second input controller that stores user data to the third memory;

an error-correcting coding unit that applies error-correcting coding to user data stored in the third memory;

a fourth memory that temporarily stores the data applied with error-correcting coding by the error-correcting coding unit;

a second data transfer unit that transfers the data applied with error-correcting coding from the third memory to the fourth memory;

a fourth arbitration unit that arbitrates data input/output to/from the fourth memory;

a second determination unit that determines whether a predetermined amount of data is stored to the fourth memory;

a second transfer permitting unit that permits transfer of data stored in the fourth memory based on the result from the second determination unit;

a third data transfer unit that transfers reproduced data from the third memory to the fourth memory when data transfer is permitted by the second transfer permitting unit; and a second output controller that outputs, while interleaving, the encoded data from the fourth memory.

19. An error-correcting coding method for recording data according to a data format in which data that is applied with error-correcting coding in a direction different from a recording direction on the recording medium is interleaved and recorded with synchronization signals, the method comprising:

storing user data to a first memory while arbitrating input/output to/from the first memory;

applying error-correcting coding to user data stored in the first memory;

transferring the data applied with error-correcting coding from the first memory to a second memory while arbitrating input/output to the second memory;

determining whether a predetermined amount of data has been stored to the second memory;

permitting an output of the data stored in the second memory, based on the result of the determination; and externally outputting, while interleaving, the data from the second memory.

20. The error-correcting coding method according to claim 19, wherein the predetermined amount of data is greater than an interleave length.

21. The error-correcting coding method according to claim 20, wherein the predetermined amount of data is an integer multiple of the interleave length.

22. The error-correcting coding method according to claim 21, wherein the first memory has a predetermined bus width, and the predetermined amount of data is equal to the interleave length multiplied by the predetermined bus width.

23. The error-correcting coding method according to claim 20, wherein a capacity of the second memory is at least twice the predetermined amount of data.

24. The error-correcting coding method according to claim 19, wherein the arbitrating input/output to the second memory assigns higher priority to data deinterleaving and data output from the second memory than input of the data applied with error-correcting coding to the second memory for data transfer.

25. An error-correcting coding circuit for recording data according to a data format in which data that is applied with error-correcting coding in a direction different from a recording direction on the recording medium is interleaved and recorded with synchronization signals, the circuit comprising:
  a first memory;
  a first arbitration unit that arbitrates data input/output to/from the first memory;
  an input controller that stores user data to the first memory;
  an error-correcting coding unit that applies error-correcting coding to user data stored in the first memory;
  a second memory that temporarily stores the data applied with error-correcting coding by the error-correcting coding unit;
  a data transfer unit that transfers the data applied with error-correcting coding from the first memory to the second memory;
  a second arbitration unit that arbitrates data input/output to/from the second memory;
  a determination unit that determines whether a predetermined amount of data is stored to the second memory;
  a transfer permitting unit that permits transfer of data stored in the second memory based on the result from the determination unit;
  a data transfer unit that transfers reproduced data from the first memory to the second memory when data transfer is permitted by the transfer permitting unit; and
  an output controller that outputs, while interleaving, the encoded data from the second memory.

26. The error-correcting coding circuit according to claim 25, wherein the predetermined amount of data is greater than an interleave length.

27. The error-correcting coding circuit according to claim 26, wherein the predetermined amount of data is an integer multiple of the interleave length.

28. The error-correcting coding circuit according to claim 27, wherein the first memory has a predetermined bus width, and the predetermined amount of data is equal to the interleave length multiplied by the predetermined bus width.

29. The error-correcting coding circuit according to claim 26, wherein a capacity of the second memory is at least twice the predetermined amount of data.

30. The error-correcting coding circuit according to claim 25, wherein the second arbitration unit assigns higher priority to an output from the output controller than an output from the data transfer unit.

31. A method for reproducing data from a recording medium to which data is recorded in a format having a synchronization code, first recording-order arranged data, and second recording-order arranged data alternating in a predetermined cycle,
  the first recording-order arranged data acquired by applying a first interleave to first encoded data, the first encoded data provided by applying with error-correcting coding to first data, and
  the second recording-order arranged data acquired by applying a second interleave to second encoded data, the second encoded data provided by applying with error-correcting coding to second data,
  the reproducing method comprising:
    separating the recorded data read from the recording medium to generate the synchronization code, the first recording-order arranged data, and the second recording-order arranged data;
    generating first code word sequence data by applying a first deinterleave to the first recording-order arranged data;
    generating second code word sequence data by applying a second deinterleave to the second recording-order arranged data;
    error-correcting the second code word sequence data to generate data error location information corresponding to the order of the second code word sequence data;
    applying a second interleave to the data error location information to generate data error location information corresponding to the order of the second recording-order arranged data;
    extracting synchronization error information from the synchronization code;
    combining, in the recording sequence of the recorded data, the data error location information in the order of the second recording-order arranged data and the synchronization error information to generate first data error location information;
    generating erasure pointers from the first data error location information, the erasure pointers indicating positions at which the first data erase and corresponding to the order of the first recording-order arranged data;
    applying a first deinterleave to the erasure pointers to generate erasure pointers corresponding to the order of the first code word sequence data; and
    applying error-correcting for erasure to the first code word sequence data, using the erasure pointers corresponding to the order of the first code word sequence data.

32. The data reproducing method according to claim 31, wherein the generating erasure pointers corresponding to the order of the first recording-order arranged data generates erasure pointers by determining from the first data error location information whether errors occur in the second recording-order arranged data or synchronization code continuously in the recording direction of the recorded data.

33. A method for reproducing data from a recording medium to which data is recorded in a format having a synchronization code, first recording-order arranged data, and second recording-order arranged data alternating in a predetermined cycle,
  the first recording-order arranged data acquired by applying a first interleave to first encoded data, the first encoded data provided by applying with error-correcting coding to first data, and
  the second recording-order arranged data acquired by applying a second interleave to second encoded data, the second encoded data provided by applying with error-correcting coding to second data, the method comprising:
separating recorded data read from the recording medium to generate the synchronization code, first recording-order arranged data, and second recording-order arranged data,
extracting synchronization error information from the synchronization code,
applying a first deinterleave to the first recording-order arranged data and generating first code word sequence data corresponding to the first recording-order arranged data, and
applying a second deinterleave to the second recording-order arranged data and generating second code word sequence data;
error-correcting the second code word sequence data and generating data error location information corresponding to the order of the second code word sequence data;
generating erasure pointers corresponding to the order of the first recording-order arranged data from the data error location information and synchronization error information, the erasure pointers denoting data erasure locations in the first data; and
applying error-correcting for erasure to the first code word sequence data, using the erasure pointers while applying a first deinterleave to the erasure pointers.

34. A method for reproducing data from a recording medium to which data is recorded in a format having a synchronization code, first recording-order arranged data, and second recording-order arranged data alternating in a predetermined cycle,
the first recording-order arranged data acquired by applying a first interleave to first encoded data, the first encoded data provided by applying with error-correcting coding to first data, and
the second recording-order arranged data acquired by applying a second interleave to second encoded data, the second encoded data provided by applying with error-correcting coding to second data,
the method comprising:
separating the data read from the recording medium, to generate the synchronization code, the first recording-order arranged data, and the second recording-order arranged data, extracting synchronization error information from the synchronization code and writing to a first memory, applying a first deinterleave to the first recording-order arranged data, generating first code word sequence data, and writing to a second memory, and applying a second deinterleave to the second recording-order arranged data, generating second code word sequence data, and writing to a third memory;
error-correcting the second code word sequence data and writing data error location information corresponding to the order of the second code word sequence data to a fourth memory;
generating erasure pointers denoting erasure locations in the first data and corresponding to the order of the first recording-order arranged data from the data error location information and synchronization error information, and writing to a fifth memory; and
applying error-correcting for erasure to the first code word sequence data, using the erasure pointers, while applying a first deinterleave to the erasure pointers.

35. The data reproducing method according to claim 34, wherein the second memory and the third memory are areas in a same buffer memory, and the first code word sequence data and the second code word sequence data are written to respectively allocated areas in the buffer memory.

36. The data reproducing method according to claim 35, wherein flags corresponding to the synchronization error information, the first recording-order arranged data, and the second recording-order arranged data are set in the order of the recorded data, and a destination of writing is switched based on these flags between the first memory, an area in the buffer memory for the first code word sequence data, and an area in the buffer memory for the second code word sequence data.

37. The data reproducing method according to claim 34, wherein the second code word sequence data error location information allocates one bit to one byte of the second code word sequence data, and manages error location information for one column of the second code word sequence data using m-bytes of data, where m is an integer.

38. The data reproducing method according to claim 34, wherein according to a format of the synchronization error information, one byte is allocated to one synchronization error information, and plural bytes of synchronization error information are arranged in the order of the recorded data.

39. The data reproducing method according to claim 34, wherein the first recording-order arranged erasure pointer contains plural bytes, each byte denotes erasure location information, and the bytes are arranged in the order of the first recording-order arranged data.

40. The data reproducing method according to claim 34, wherein the first memory, the fourth memory, and the fifth memory are areas allocated in one small capacity memory.

41. The data reproducing method according to claim 40, wherein the small capacity memory has two areas for storing the synchronization error information, one area for storing the data error location information, and one area for storing the erasure pointers.

42. A method for reproducing data from a recording medium to which data is recorded in a format having a synchronization code, first recording-order arranged data, and second recording-order arranged data alternating in a regular cycle,
the first recording-order arranged data acquired by applying a first interleave to first encoded data, the first encoded data provided by applying with error-correcting coding to first data, and
the second recording-order arranged data acquired by applying a second interleave to second encoded data, the second encoded data provided by applying with error-correcting coding to second data,
the reproducing method comprising:
separating data from the recorded data read from the recording medium to generate the synchronization code, the first recording-order arranged data, and the second recording-order arranged data;
dividing the first recording-order arranged data into plural data segments, applying a first deinterleave to each data segment, and generating plural first code word sequence data segments;
assembling the plural first code word sequence data segments to generate the first code word sequence data;
applying a second deinterleave to the second recording-order arranged data to generate the second code word sequence data;
error-correcting the second code word sequence data and generating data error location information corresponding to the order of the second code word sequence data;

applying the second deinterleave to the data error location information and generating data error location information corresponding to the order of the second recording-order arranged data;
extracting synchronization error information from the synchronization code;
generating first data error location information denoting locations in which errors occur in the first data, by combining, in the recording sequence, the synchronization error information and the data error location information in the order of the second recording-order arranged data;
generating first recording-order arranged erasure pointers which indicate erasure locations in the first data and correspond to the order of the first recording-order arranged data, from the first data error location information;
applying a first deinterleave to the erasure pointers to generate erasure pointers corresponding to the order of the first code word sequence data; and
applying error-correcting for erasure to the first code word sequence data, using the erasure pointers in the order of the first code word sequence data.

43. The data reproducing method according to claim 42, wherein the generating erasure pointers in the order of the first recording-order arranged data determines from the first data error location information whether the second recording-order arranged data errors or synchronization code errors occur continuously in the recording direction of the recorded data to generate erasure pointers.

44. A method for reproducing data from a recording medium to which data is recorded in a format having a synchronization code, first recording-order arranged data, and second recording-order arranged data alternating in a regular cycle,
the first recording-order arranged data acquired by applying a first interleave to first encoded data, the first encoded data provided by applying error-correcting coding to first data, and
the second recording-order arranged data acquired by applying a second interleave to second encoded data, the second encoded data provided by applying error-correcting to second data,
the reproducing method comprising:
separating data read from the recording medium, to generate the synchronization code, the first recording-order arranged data, and the second recording-order arranged data, extracting synchronization error information from the synchronization code, dividing the first recording-order arranged data into plural data segments, applying a first deinterleave to each data segment to generate plural first code word sequence data segments, and applying a second deinterleave to the second recording-order arranged data to generate second code word sequence data;
assembling the plural first code word sequence data segments to generate first code word sequence data;
error-correcting the second code word sequence data to generate data error location information corresponding to the order of the second code word sequence data;
generating erasure pointers denoting erasure locations in the first data in the order of the first recording-order arranged data from the data error location information and synchronization error information; and applying error-correcting for erasure to the first code word sequence data using the erasure pointers while deinterleaving the erasure pointers with a first deinterleaving.

45. A method for reproducing data from a recording medium to which data is recorded in a format having a synchronization code, first recording-order arranged data, and second recording-order arranged data alternating in a predetermined cycle,
the first recording-order arranged data acquired by applying a first interleave to first encoded data, the first encoded data provided by applying error-correcting coding to first data, and
the second recording-order arranged data acquired by applying a second interleave to second encoded data, the second encoded data provided by applying error-correcting coding to second data,
the reproducing method comprising:
separating recorded data read from the recording medium to generate the synchronization code, the first recording-order arranged data, and the second recording-order arranged data, extracting synchronization error information from the synchronization code to write to a first memory, dividing the first recording-order arranged data into plural data segments, applying a first deinterleave to each data segment to generate plural first code word sequence data segments and writing them to a second memory, and applying a second deinterleave to the second recording-order arranged data to generate second code word sequence data and writing them to a third memory;
sequentially writing the first code word sequence data segments from the second memory to a fourth memory to generate first code word sequence data;
error-correcting the second code word sequence data and writing data error location information corresponding to the order of the second code word sequence data to a fifth memory;
generating erasure pointers denoting errors in the first data from the data error location information and synchronization error information, and writing the erasure pointers to a sixth memory, the erasure pointers arranged in the order corresponding to the order of the first recording-order arranged data; and
applying error-correcting for erasure to the first code word sequence data using the erasure pointers while applying a first deinterleave to the erasure pointers.

46. The data reproducing method according to claim 45, wherein the capacity of the second memory is smaller than the size of the first recording-order arranged data.

47. The data reproducing method according to claim 45, wherein the third memory and the fourth memory are areas in the same buffer memory, and the first code word sequence data and the second code word sequence data are written to respectively allocated areas in the buffer memory.

48. The data reproducing method according to claim 45, wherein flags corresponding to the synchronization error information, the first recording-order arranged data, and the second recording-order arranged data are set in the order of the recorded data, and a destination of writing is switched based on these flags between the first memory, the second memory, and an area in the buffer memory for the second code word sequence data.

49. The data reproducing method according to claim 45, wherein the data error location information in the order of the second code word sequence data allocates one bit to one byte of the second code word sequence data, and manages error location information for one column of second code word sequence data using m-bytes of data, where m is an integer.

50. The data reproducing method according to claim 45, wherein according to a format of the synchronization error information, one byte is allocated to one synchronization error information, and plural bytes of synchronization error information are arranged in the order of the recorded data.

51. The data reproducing method according to claim 45, wherein the first recording-order arranged erasure pointer contains plural bytes, each byte denotes erasure location information, and the bytes are arranged in the order of the first recording-order arranged data.

52. The data reproducing method according to claim 45, wherein the first memory, the fifth memory, and the sixth memory are areas allocated in one small capacity memory.

53. The data reproducing method according to claim 52, wherein the small capacity memory has two areas for storing the synchronization error information, one area for storing the second data error location information, and one area for storing the first recording-order arranged erasure pointers.

54. A method for recording data to a recording medium according to a format having alternating first data and second data, comprising:
   error-correcting the first data to generate first code word sequence data;
   error-correcting the second data to generate second code word sequence data;
   generating synchronization codes;
   applying a first interleave to the first code word sequence data to generate first recording-order arranged data;
   applying a second interleave to the second code word sequence data to generate second recording-order arranged data; and
   arranging alternately the synchronization codes, the first recording-order arranged data, and the second recording-order arranged data in a predetermined cycle to record them to the recording medium.

55. A method for recording data to a recording medium according to a format having alternating first data and second data, comprising:
   error-correcting the first data and writing first code word sequence data to a first memory;
   error-correcting the second data and writing second code word sequence data to a second memory;
   generating synchronization codes; and
   reading the first code word sequence data written in the first memory while applying a first interleave to the first code word sequence data, reading the second code word sequence data written in the second memory while applying a second interleave to the second code word sequence data, and recording alternately at a predetermined cycle the synchronization codes, the code word sequence data applied with the first interleave, and the second code word sequence data applied with the second interleave.

56. The data recording method according to claim 55, wherein flags corresponding to the synchronization code, the first code word sequence data, and the second code word sequence data are set in the recording sequence of the recorded data, and a source of reading is switched based on these flags between a unit that generates the synchronization codes, the first memory, and the second memory.

57. The data recording method according to claim 55, wherein the first memory and the second memory are areas disposed in the same buffer memory, and the first code word sequence data and the second code word sequence data are written to respectively allocated areas in the buffer memory.

58. A method for recording data to a recording medium according to a format having alternating first data and second data, comprising:
   error-correcting the first data to generate first code word sequence data;
   error-correcting the second data to generate second code word sequence data;
   generating synchronization codes;
   dividing the first code word sequence data into a predetermined number of segments;
   applying a first interleave to the first code word sequence data segments to generate first recording-order arranged data segments;
   applying a second interleave to the second code word sequence data to generate second recording-order arranged data; and
   recording alternately the synchronization codes, the first recording-order arranged data, and the second recording-order arranged data in a predetermined cycle.

59. A method for recording data to a recording medium according to a format having alternating first data and second data, comprising:
   applying error-correcting coding to the first data and writing first code word sequence data to a first memory;
   applying error-correcting coding to the second data and writing second code word sequence data to a second memory;
   dividing the first code word sequence data into a predetermined number of code word sequence segments;
   writing one segment of the first code word sequence data to a third memory;
   generating synchronization codes; and
   reading the first code word sequence data segments from the third memory while applying a first interleave to the first code word sequence data segments to generate first recording-order arranged data segments, reading the second code word sequence data from the second memory while applying a second interleave to the second code word sequence data to generate second recording-order arranged data, and recording alternately the synchronization codes, the first recording-order arranged data segments, and the second recording-order arranged data in a predetermined cycle.

60. The data recording method according to claim 59, wherein flags corresponding to the synchronization codes, the first code word sequence data, and the second code word sequence data are set in the recording sequence of the recorded data, and a source of reading is switched based on these flags between a unit that generates the synchronization codes, the second memory, and the third memory.

61. The data recording method according to claim 59, wherein the first memory and second memory are areas disposed in the same buffer memory, and the first code word sequence data and the second code word sequence data are written to respectively allocated areas in the buffer memory.

62. A circuit for reproducing data from a recording medium to which data is recorded in a format having a synchronization code, first recording-order arranged data, and second recording-order arranged data alternating in a predetermined cycle,
   the first recording-order arranged data acquired by applying a first interleave to first encoded data, the first encoded data provided by applying error-correcting coding to the first data, and the second recording-order arranged data acquired by applying a second interleave to second encoded data, the second encoded data provided by applying error-correcting coding to the second data, the reproducing circuit comprising:
- a separating unit that separates recorded data read from the recording medium to generate the synchronization code, the first recording-order arranged data, and the second recording-order arranged data;
- a first code generator that generates first code word sequence data by applying a first interleave to the first recording-order arranged data;
- a second code generator that generates second code word sequence data by applying a second interleave to the second recording-order arranged data;
- a code word sequence error location generator for error-correcting the second code word sequence data to generate data error location information corresponding to the order of the second code word sequence data;
- a recording-order arranged error location generator for applying a second interleave to the data error location information corresponding to the order of the second code word sequence data to generate data error location information in the order of the second recording-order arranged data;
- a synchronization error extracting unit that extracts synchronization error information from the synchronization code;
- a data error location generator that generates first data error location information by combining in the recording sequence of the recorded data the synchronization error information and the data error location information in the order of the second recording-order arranged data;
- a recording-order arranged erasure pointer generator that generates erasure pointers indicating erasure positions of first data, from the first data error location information, the pointers corresponding to the order of the first recording-order arranged data;
- a code word sequence erasure pointer generator that applies a first deinterleave to the erasure pointers corresponding to the order of the first recording-order arranged data to generate erasure pointers in the order of the first code word sequence data; and
- a correcting unit that applies error-correcting for erasure to the first code word sequence data using the erasure pointers corresponding to the order of the first code word sequence data.

63. The data reproducing circuit according to claim 62, wherein the recording-order arranged erasure pointer generator generates erasure pointers by determining from the first data error location information whether errors occur in the second recording-order arranged data or synchronization code continuously in the recording direction of the recorded data.

64. A data reproducing apparatus comprising:
a unit that reads data from a recording medium to which data is recorded in a predetermined data format; and
the data reproducing circuit according to claim 62 that error-corrects the read data to generate desired data.

65. A circuit for reproducing data from a recording medium to which data is recorded in a format having a synchronization code, first recording-order arranged data, and second recording-order arranged data alternating in a predetermined cycle, the first recording-order arranged data acquired by applying a first interleave to first encoded data, the first encoded data provided by applying error-correcting coding to first data, and the second recording-order arranged data acquired by applying a second interleave to second encoded data, the second encoded data provided by applying error-correcting coding to second data, the reproducing circuit comprising:
- a separating and deinterleaving unit that separates recorded data read from the recording medium, generates the synchronization code, the first recording-order arranged data, and the second recording-order arranged data, extracts synchronization error information from the synchronization code, applies a first deinterleave to the first recording-order arranged data to generate first code word sequence data, and applies a second deinterleave to the second recording-order arranged data to generate second code word sequence data;
- an error location generator that error-corrects the second code word sequence data to generate data error location information corresponding to the order of the second code word sequence data;
- an erasure pointer generator that generates erasure pointers corresponding to the order of the first recording-order arranged data, from the data error location information and synchronization error information, the erasure pointers denoting data erasure locations in the first data; and
- a correcting unit that applies error-correcting for erasure to the first code word sequence data using the erasure pointers while applying a first deinterleave to the erasure pointers.

66. A data reproducing apparatus comprising:
a unit that reads data from a recording medium to which data is recorded in a predetermined data format; and
the data reproducing circuit according to claim 65 that error-corrects the read data to generate desired data.

67. A circuit for reproducing data from a recording medium to which data is recorded in a format having a synchronization code, first recording-order arranged data, and second recording-order arranged data alternating in a predetermined cycle, the first recording-order arranged data acquired by applying a first interleave to first encoded data, the first encoded data provided by applying error-correcting coding to first data, and the second recording-order arranged data acquired by applying a second interleave to second encoded data, the second encoded data provided by applying error-correcting coding to second data, the reproducing circuit comprising:
first to fifth memories;
a separating and deinterleaving unit that separates recorded data read from the recording medium to generate the synchronization code, the first recording-order arranged data, and the second recording-order arranged data, extracts synchronization error information from the synchronization code and writes it in the first memory, applies a first deinterleave to the first recording-order arranged data to generate first code word sequence data and write it to the second memory, and applies a second deinterleave to the second recording-order arranged data to generate second code word sequence data and write it to the third memory;

an error location generator that error-corrects the second code word sequence data and writes data error location information corresponding to the order of the second code word sequence data to the fourth memory;

an erasure pointer generator that generates erasure pointers denoting erasure locations in the first data and corresponding to the order of the first recording-order arranged data, from the data error location information and synchronization error information, and writes it to the fifth memory; and a correcting unit that applies error-correcting for erasure to the first code word sequence data using the erasure pointers while applying a first deinterleave to the erasure pointers.

68. The data reproducing circuit according to claim 67, wherein the second memory and the third memory are areas in the same buffer memory, and the first code word sequence data and the second code word sequence data are written to respectively allocated areas in the buffer memory.

69. The data reproducing circuit according to claim 67, wherein flags corresponding to the synchronization error information, the first recording-order arranged data, and the second recording-order arranged data are set in the order of the recorded data, and a destination of writing is switched based on these flags between the first memory, an area in the buffer memory for the first code word sequence data, and an area in the buffer memory for the second code word sequence data.

70. The data reproducing circuit according to claim 67, wherein the data error location information in the order of the second code word sequence data allocates one bit to one byte of the second code word sequence data, and manages error location information for one column of the second code word sequence data using m-bytes of data, where m is an integer.

71. The data reproducing circuit according to claim 67, wherein according to a format of the synchronization error information, one byte is allocated to one synchronization error information, and plural bytes of synchronization error information are arranged in the order of the recorded data.

72. The data reproducing circuit according to claim 67, wherein the first recording-order arranged erasure pointer contains plural bytes, each byte denotes erasure location information, and the bytes are arranged in the order of the first recording-order arranged data.

73. The data reproducing circuit according to claim 67, wherein the first memory, the fourth memory, and the fifth memory are allocated in areas of one small capacity memory.

74. The data reproducing circuit according to claim 73, wherein the small capacity memory has two areas for storing the synchronization error information, one area for storing the data error location information, and one area for storing the erasure pointers.

75. A data reproducing apparatus comprising:
a unit that reads data from a recording medium to which data is recorded in a predetermined data format; and
the data reproducing circuit according to claim 67 that error-corrects the read data to generate desired data.

76. A circuit for reproducing data from a recording medium to which data is recorded in a format having a synchronization code, first recording-order arranged data, and second recording-order arranged data alternating in a regular cycle, the first recording-order arranged data acquired by applying a first interleave to first encoded data, the first encoded data provided by applying error-correcting coding to first data, and the second recording-order arranged data acquired by applying a second interleave to second encoded data, the second encoded data provided by applying error-correcting coding second data, the reproducing circuit comprising:

a second recording-order arranged data generator that separates recorded data read from the recording medium to generate the synchronization code, the first recording-order arranged data, and the second recording-order arranged data;

a data segment generator that divides the first recording-order arranged data into plural data segments, applies a first deinterleave to each data segment, and generates plural first code word sequence data segments;

a data segment assembling unit that assembles the plural first code word sequence data segments and generates first code word sequence data;

a second code word sequence data generator that applies a second deinterleave to the second recording-order arranged data to generate second code word sequence data;

a code word sequence error location generator that error-corrects the second code word sequence data to generate data error location information corresponding to the order of the second code word sequence data;

a recording-order arranged error location generator that applies a second interleave to the data error location information corresponding to the order of the second code word sequence data to generate data error location information corresponding to the order of the second recording-order arranged data;

a synchronization error information extracting unit for extracting synchronization error information from the synchronization code;

a combining unit that generates first data error location information by combining, in the recording sequence of the recorded data, the synchronization error information and the data error location information in the order of the second recording-order arranged data;

a first recording-order arranged erasure pointer generator that generates erasure pointers indicating erasure locations in the first data corresponding to the order of the first recording-order arranged data, from the first data error location information;

a first code word sequence erasure pointer generator that applies a first deinterleave to the erasure pointers to generate erasure pointers corresponding to the order of the first code word sequence data; and a correcting unit that applies error-correcting for erasure to the first code word sequence data using the erasure pointers corresponding to the order of the first code word sequence data.

77. The data reproducing circuit according to claim 76, wherein the first recording-order arranged erasure pointer generator determines, from the first data error location information, whether an error for the second recording-order arranged data or synchronization code occurs in the first data error location information, continuously in the recording direction of the recorded data, thus to generate the erasure pointer.

78. A data reproducing apparatus comprising:
a unit that reads data from a recording medium to which data is recorded in a predetermined data format; and
the data reproducing circuit according to claim 76 that error-corrects the read data to generate desired data.

79. A circuit for reproducing data from a recording medium to which data is recorded in a format having a synchronization code, first recording-order arranged data, and second recording-order arranged data alternating in a regular cycle,
the first recording-order arranged data acquired by applying a first interleave to first encoded data, the first encoded data provided by applying error-correcting coding to first data, and
the second recording-order arranged data acquired by applying a second interleave to second encoded data, the second encoded data provided by applying error-correcting coding to second data,
the reproducing circuit comprising:
a separating and deinterleaving unit that separates recorded data read from the recording medium to generate the synchronization code, the first recording-order arranged data, and the second recording-order arranged data, extracts synchronization error information from the synchronization code, divides the first recording-order arranged data into plural data segments, applies a first deinterleave to each data segment to generate plural first code word sequence data segments, and applies a second deinterleave to the second recording-order arranged data to generate second code word sequence data;
an assembling unit that assembles the plural first code word sequence data segments to generate first code word sequence data;
an error location generator that error-corrects the second code word sequence data to generate data error location information corresponding to the order of the second code word sequence data;
an erasure pointer generator that generates erasure pointers denoting erasure locations of the first recording-order arranged data from the data error location information and synchronization error information, the erasure pointers arranged in the order of the first recording-order arranged data; and
a correcting unit that applies error-correcting for erasure to the first code word sequence data using the erasure pointers while deinterleaving the erasure pointers.

80. A data reproducing apparatus comprising:
a unit that reads data from a recording medium to which data is recorded in a predetermined data format; and
the data reproducing circuit according to claim 79 that error-corrects the read data to generate desired data.

81. A circuit for reproducing data from a recording medium to which data is recorded in a format having a synchronization code, first recording-order arranged data, and second recording-order arranged data alternating in a regular cycle,
the first recording-order arranged data acquired by applying a first interleave to first encoded data, the first encoded data provided by applying error-correcting coding to first data, and
the second recording-order arranged data acquired by applying a second interleave to second encoded data, the second encoded data provided by applying error-correcting coding to second data,
the reproducing circuit comprising:
first to fifth memories;
an extracting and deinterleaving unit that separates recorded data read from the recording medium to generate the synchronization code, the first recording-order arranged data, and the second recording-order arranged data, extracts synchronization error information from the synchronization code to write it to the first memory, divides the first recording-order arranged data into plural data segments, applies a first deinterleave to each data segment to generate plural first code word sequence data segments and write them to the second memory, and applies a second deinterleave to the second recording-order arranged data to generate second code word sequence data to write it to the third memory;
a data assembling unit that sequentially writes the first code word sequence data segments from the second memory to the fourth memory to generate first code word sequence data;
an error location generator that error-corrects the second code word sequence data to write data error location information corresponding to the order of the second code word sequence data to the fifth memory;
an erasure pointer generator that generates erasure pointers denoting erasure position of the first data from the data error location information in the order of the second code word sequence data and synchronization error information and writes the erasure pointers to the sixth memory, the erasure pointers arranged in the order of the first recording-order arranged data; and
a correcting unit that applies error-correcting for erasure to the first code word sequence data using the erasure pointers while applying a first deinterleave to the erasure pointers.

82. The data reproducing circuit according to claim 81, wherein the capacity of the second memory is smaller than the size of the first recording-order arranged data.

83. The data reproducing circuit according to claim 81, wherein the third memory and the fourth memory are areas in the same buffer memory, and the first code word sequence data and the second code word sequence data are written to respectively allocated areas in the buffer memory.

84. The data reproducing circuit according to claim 81, wherein flags corresponding to the synchronization error information, the first recording-order arranged data, and the second recording-order arranged data are set in the order of the recorded data, and a destination of writing is switched based on these flags between the first memory, the second memory, and an area in the buffer memory for the second code word sequence data.

85. The data reproducing circuit according to claim 81, wherein the data error location information in the order of the second code word sequence data allocates one bit to one byte of the second code word sequence data, and manages error location information for one column of second code word sequence data using m-bytes of data, where m is an integer.

86. The data reproducing circuit according to claim 81, wherein according to a format of the synchronization error information, one byte is allocated to one synchronization error information, and plural bytes of synchronization error information are arranged in the order of the recorded data.

87. The data reproducing circuit according to claim 81, wherein the first recording-order arranged erasure pointer contains plural bytes, each byte denotes erasure location information, and the bytes are arranged in the order of the first recording-order arranged data.

88. The data reproducing circuit according to claim 81, wherein the first memory, the fifth memory, and the sixth memory are allocated in areas of one small capacity memory.

89. The data reproducing circuit according to claim 81, wherein the small capacity memory has two areas for storing the synchronization error information, one area for storing the second data error location information, and one area for storing the first recording-order arranged erasure pointers.

90. A data reproducing apparatus comprising:
a unit that reads data from a recording medium to which data is recorded in a predetermined data format; and
the data reproducing circuit according to claim 81 that error-corrects the read data to generate desired data.

91. A circuit for recording data to a recording medium according to a format having alternating first data and second data, comprising:
a first code generator that error-corrects the first data to generate first code word sequence data;
a second code generator that error-corrects the second data to generate second code word sequence data;
a synchronization code generator that generates synchronization codes; and
a recording data generator that applies a first interleave to the first code word sequence data to generate first recording-order arranged data, applies a second interleave to the second code word sequence data to generate second recording-order arranged data, and records alternately the synchronization codes, the first recording-order arranged data, and the second recording-order arranged data in a predetermined cycle.

92. A data recording apparatus comprising:
a signal processing circuit that generates data to be recorded;
a data recording circuit according to claim 91 that receives the data to be recorded and generates recording data in a predetermined data format; and
a unit that records the recording data of the predetermined data format to a recording medium.

93. A circuit for recording data to a recording medium according to a format having alternating first data and second data, comprising:
a first memory and a second memory;
a first code generator that error-corrects the first data to generate and write first code word sequence data to the first memory;
a second code generator that error-corrects the second data to generate and write second code word sequence data to the second memory;
a synchronization code generator that generates synchronization codes; and
a recording data generator that reads, while applying a first interleave, the first code word sequence data, reads, while applying a second interleave, the second code word sequence data, and records alternately to the recording medium at a predetermined cycle the synchronization codes, the interleaved first code word sequence data, and the interleaved second code word sequence data.

94. The data recording circuit according to claim 93, wherein flags corresponding to the synchronization codes, the code word sequence data for the first data, and the code word sequence data for the second data are set in the recording-order arranged of the recorded data, and a source of reading is switched based on these flags between the synchronization code generator, the first memory, and the second memory.

95. The data recording circuit according to claim 93, wherein the first memory and the second memory are disposed in an area of the same buffer memory, and the first code word sequence data and the second code word sequence data are written to respectively allocated areas in the buffer memory.

96. A data recording apparatus comprising:
a signal processing circuit that generates data to be recorded;
a data recording circuit according to claim 93 that receives the data to be recorded and generates recording data in a predetermined data format; and
a unit that records the recording data of the predetermined data format to a recording medium.

97. A circuit for recording data to a recording medium according to a format having alternating first data and second data, comprising:
a first code generator that error-corrects the first data to generate first code word sequence data;
a second code generator that error-corrects the second data to generate second code word sequence data;
a dividing unit that divides the first code word sequence data into a predetermined number of code word sequence data segments;
a synchronization code generator that generates synchronization codes;
a recording data segment generator that applies a first interleave to the code word sequence data segments to generate first recording data segments, applies a second interleave to the second code word sequence data to generate second recording-order arranged data, and arranges alternately the synchronization codes, the first recording data segments, and the second recording-order arranged data in a predetermined cycle to generate a recording data segment; and
an evaluating unit that determines whether the recording data segment has been generated using all first recording data segments.

98. A data recording apparatus comprising:
a signal processing circuit that generates data to be recorded;
a data recording circuit according to claim 97 that receives the data to be recorded and generates recording data in a predetermined data format; and
a unit that records the recording data of the predetermined data format to a recording medium.

99. A circuit for recording data to a recording medium according to a format having alternating first data and second data, comprising:
a first memory, a second memory, and a third memory;
a first code generator that applies error-correcting coding to the first data to generate and write first code word sequence data to the first memory;
a second code generator that applies error-correcting coding to the second data to generate and write second code word sequence data to the second memory;
a dividing unit that divides the first code word sequence data into a predetermined number of code word sequence data segments;
a memory writing unit that writes the code word sequence data segments to the third memory;
a synchronization code generator that generates synchronization code;

a recording segment generator that reads the code word sequence data segments from the third memory, applies a first interleave to the code word sequence data segments to generate first recording data segments, reads the second code word sequence data from the second memory and applies a second interleave to the read data to generate second recording-order arranged data, and arranges alternately the synchronization code, the first recording data segments, and the second recording-order arranged data in a predetermined cycle to generate a recording data segment; and an evaluating unit that determines whether the recording data segment has been generated using all divided first recording data segments.

100. The data recording circuit according to claim 99, wherein flags corresponding to the synchronization code, the first code word sequence data, and the second code word sequence data are set in the recording-order arranged of the recorded data, and a source of reading is switched based on these flags between the synchronization code generator, the third memory, and the second memory.

101. The data recording circuit according to claim 99, wherein the first memory and the second memory are disposed in the same buffer memory, and the first code word sequence data and the second code word sequence data are written to respectively allocated areas in the buffer memory.

102. A data recording apparatus comprising:

a signal processing circuit that generates data to be recorded;

a data recording circuit according to claim 99 that receives the data to be recorded and generates recording data in a predetermined data format; and a unit that records the recording data of the predetermined data format to a recording medium.

* * * * *